United States Patent
Takimoto et al.

(10) Patent No.: US 11,508,749 B2
(45) Date of Patent: Nov. 22, 2022

(54) CUTOFF GATE ELECTRODES FOR SWITCHES FOR A THREE-DIMENSIONAL MEMORY DEVICE AND METHOD OF MAKING THE SAME

(71) Applicant: SANDISK TECHNOLOGIES LLC, Addison, TX (US)

(72) Inventors: Takuma Takimoto, Kamakura (JP); Masayuki Hiroi, Yokohama (JP); Akira Inoue, Kawasaki (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 115 days.

(21) Appl. No.: 16/901,091

(22) Filed: Jun. 15, 2020

(65) Prior Publication Data

US 2021/0391351 A1 Dec. 16, 2021

(51) Int. Cl.
  *H01L 27/11582* (2017.01)
  *G11C 16/16* (2006.01)
  *H01L 27/11565* (2017.01)
  *H01L 27/11568* (2017.01)

(52) U.S. Cl.
  CPC ........ *H01L 27/11582* (2013.01); *G11C 16/16* (2013.01); *H01L 27/11565* (2013.01); *H01L 27/11568* (2013.01)

(58) Field of Classification Search
  CPC ....... H01L 27/115–11597; G11C 16/16; G11C 16/08; G11C 16/26; G11C 16/24
  See application file for complete search history.

(56) References Cited

U.S. PATENT DOCUMENTS

| | | |
|---|---|---|
| 5,915,167 A | 6/1999 | Leedy |
| 9,859,422 B2 | 1/2018 | Nishikawa et al. |
| 10,115,735 B2 | 10/2018 | Amano et al. |
| 10,224,407 B2 | 3/2019 | Chowdhury et al. |
| 10,256,099 B1 | 4/2019 | Akaiwa et al. |
| 10,355,017 B1 | 7/2019 | Nakatsuji et al. |
| 10,355,100 B1 | 7/2019 | Ueda et al. |
| 2007/0228432 A1 | 10/2007 | Ishihara et al. |

(Continued)

OTHER PUBLICATIONS

Notification of Transmittal of the International Search Report and the Written Opinion of the International Searching Authority for International Patent Application No. PCTUS2020/067208, dated Jul. 4, 2021, 12 pages.

(Continued)

*Primary Examiner* — Allen L Parker
*Assistant Examiner* — Gustavo G Ramallo
(74) *Attorney, Agent, or Firm* — The Marbury Law Group PLLC

(57) ABSTRACT

A semiconductor structure includes a first-conductivity-type well located in a semiconductor substrate, a semiconductor active area region located adjacent to the a first-conductivity-type well, a first transistor including a source region, a drain region, a channel region located between the source region and the drain region, a gate dielectric layer located over the channel region and a gate electrode located over the gate dielectric layer, such that the transistor is located on the semiconductor active area region, and a cutoff gate electrode located over the semiconductor active area region, and between the first transistor and the first-conductivity-type well.

6 Claims, 51 Drawing Sheets

(56) References Cited

U.S. PATENT DOCUMENTS

| | | |
|---|---|---|
| 2009/0052245 A1* | 2/2009 | Li .................. G11C 16/0433 |
| | | 365/185.05 |
| 2009/0057727 A1 | 3/2009 | Kapoor |
| 2009/0179691 A1 | 7/2009 | Tanzawa |
| 2010/0123505 A1 | 5/2010 | Chou et al. |
| 2013/0020587 A1 | 1/2013 | Hino et al. |
| 2015/0200590 A1 | 7/2015 | Tanzawa |
| 2016/0351709 A1 | 12/2016 | Nishikawa et al. |
| 2018/0247954 A1 | 8/2018 | Amano et al. |
| 2018/0248013 A1 | 8/2018 | Chowdhury et al. |
| 2018/0331118 A1* | 11/2018 | Amano ............ H01L 27/11556 |
| 2019/0036500 A1* | 1/2019 | Nomura ............. H01L 21/8249 |
| 2020/0185397 A1 | 6/2020 | Chibvongodze et al. |

OTHER PUBLICATIONS

U.S. Appl. No. 16/130,104, filed Sep. 13, 2018, SanDisk Technologies LLC.

U.S. Appl. No. 16/579,974, filed Sep. 24, 2019, SanDisk Technologies LLC.

* cited by examiner

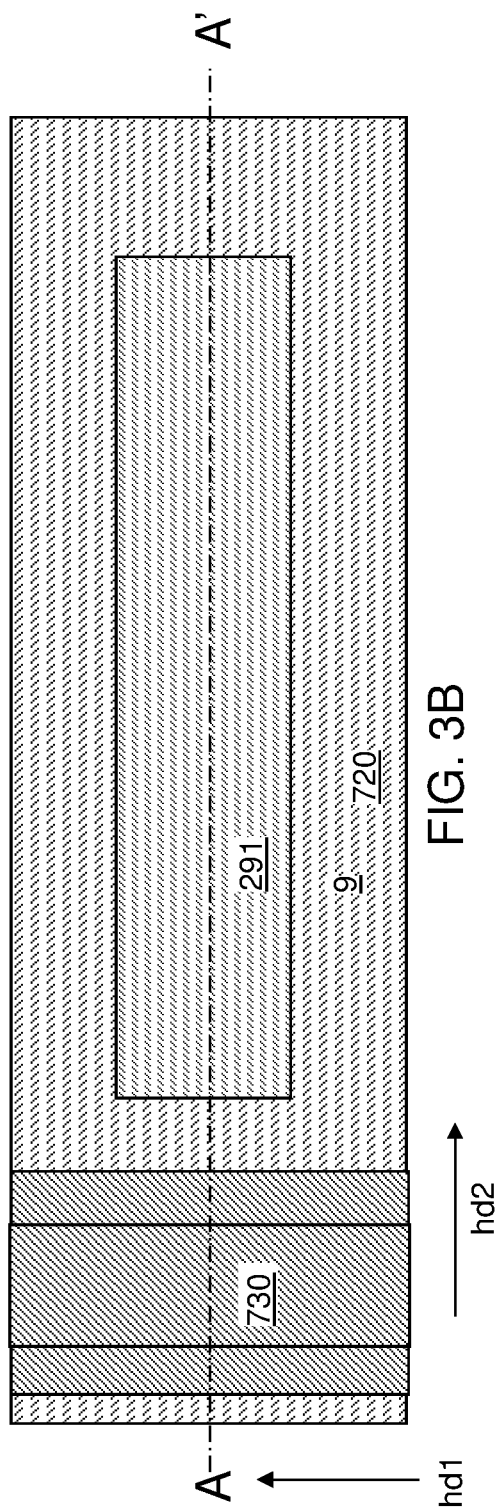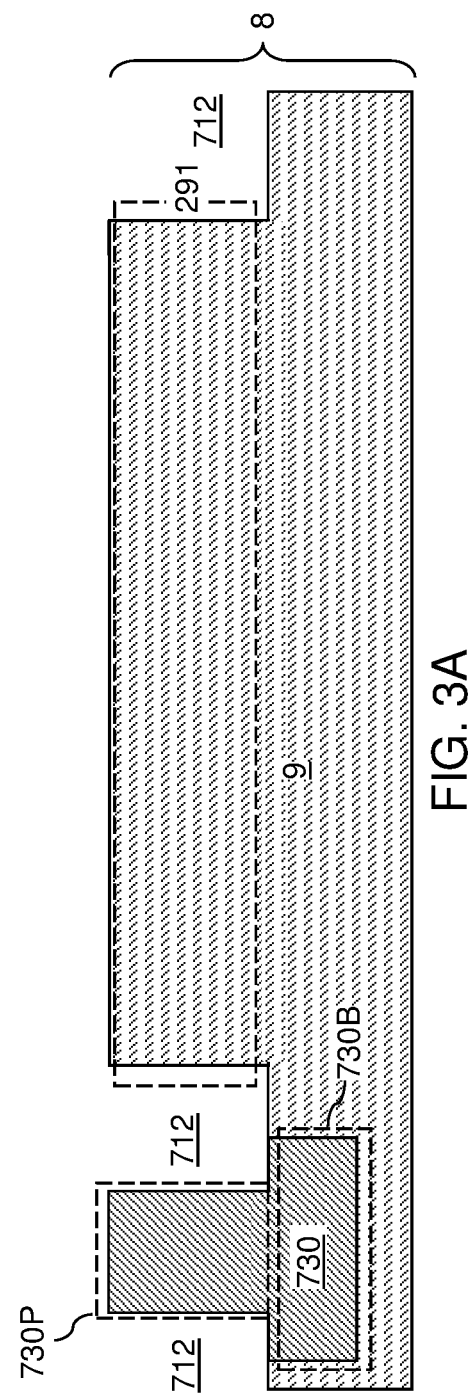
FIG. 3B
FIG. 3A

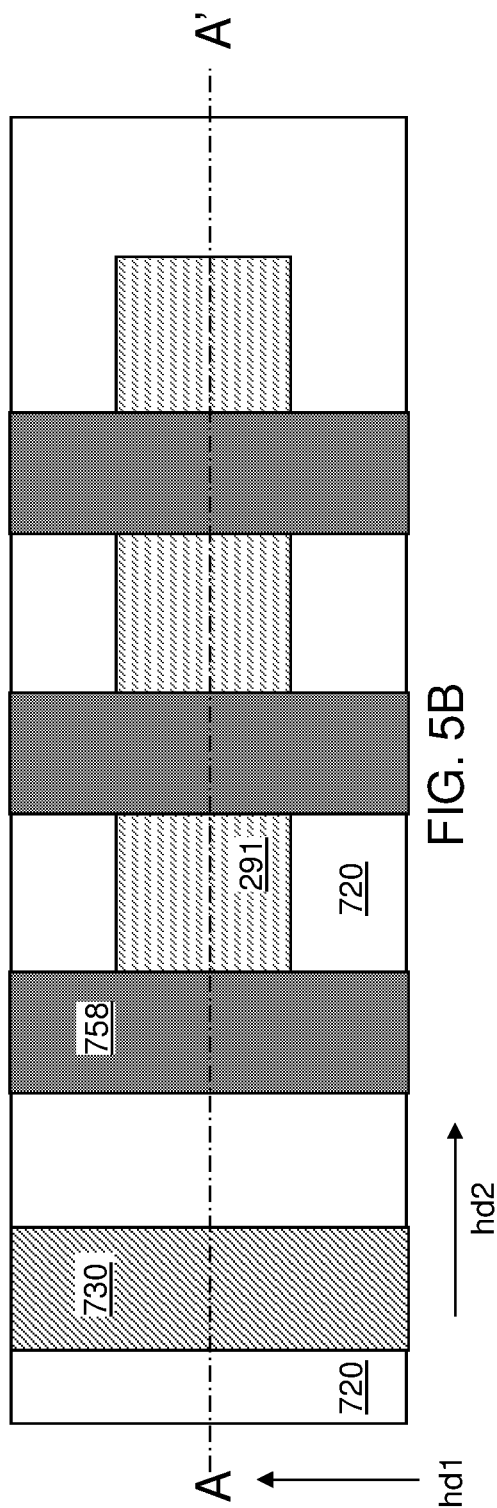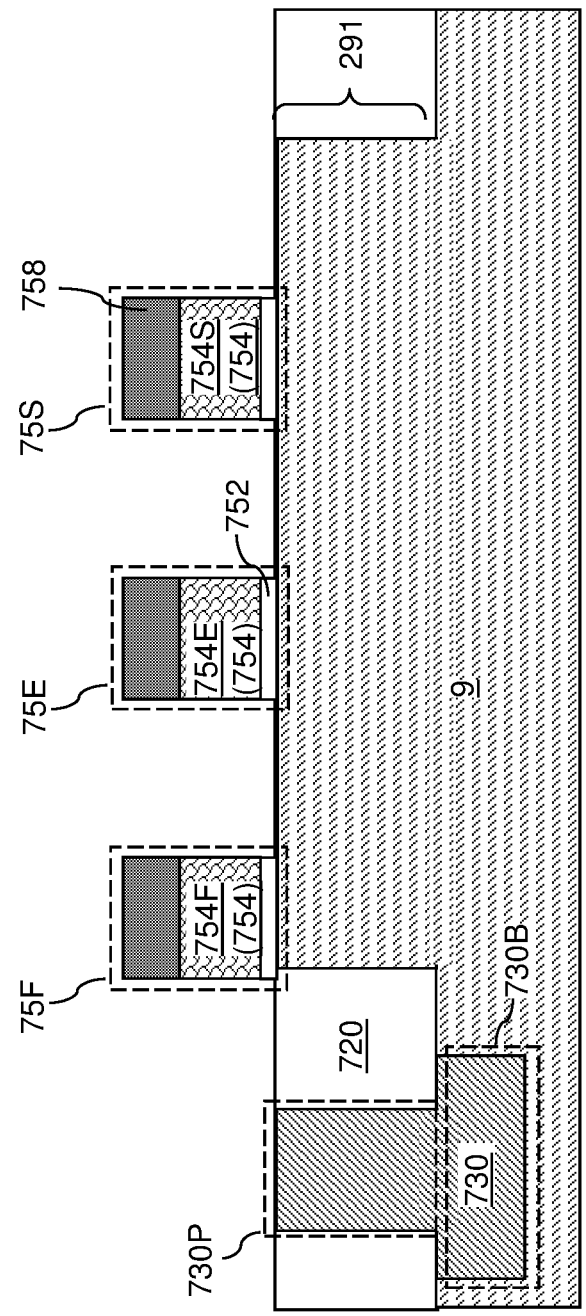

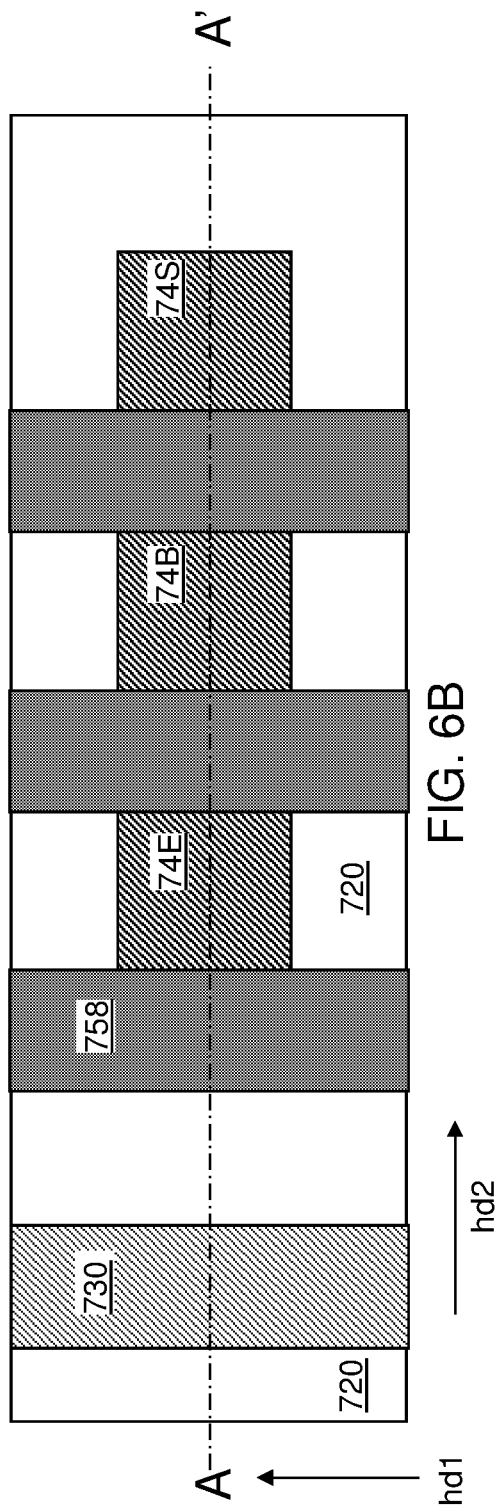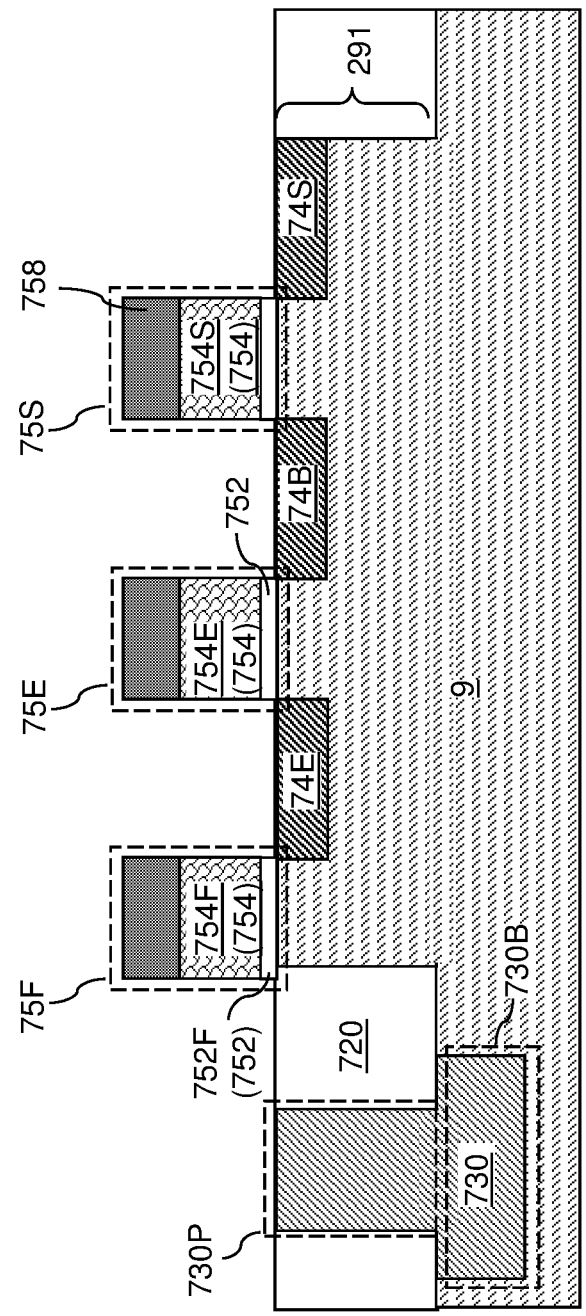

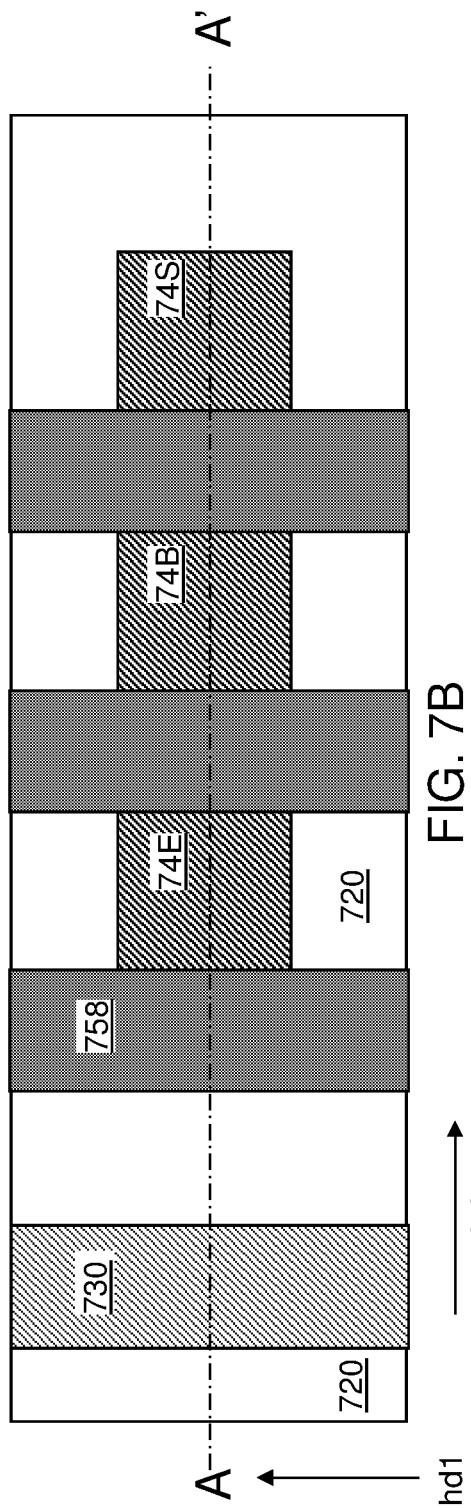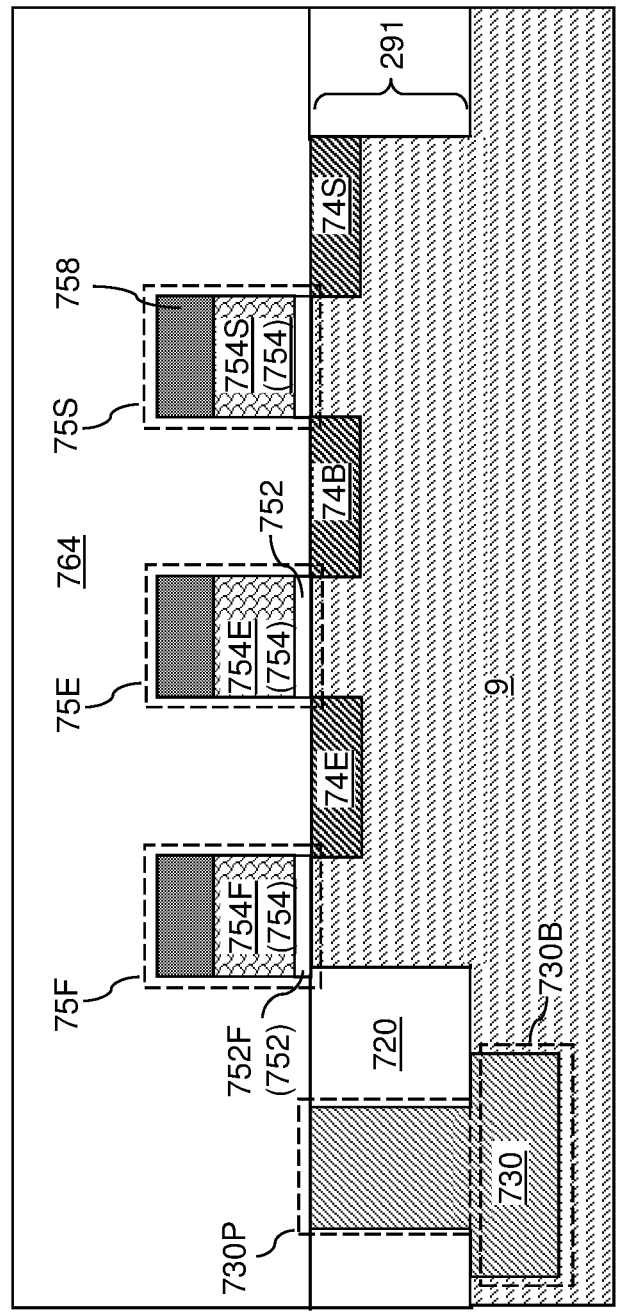

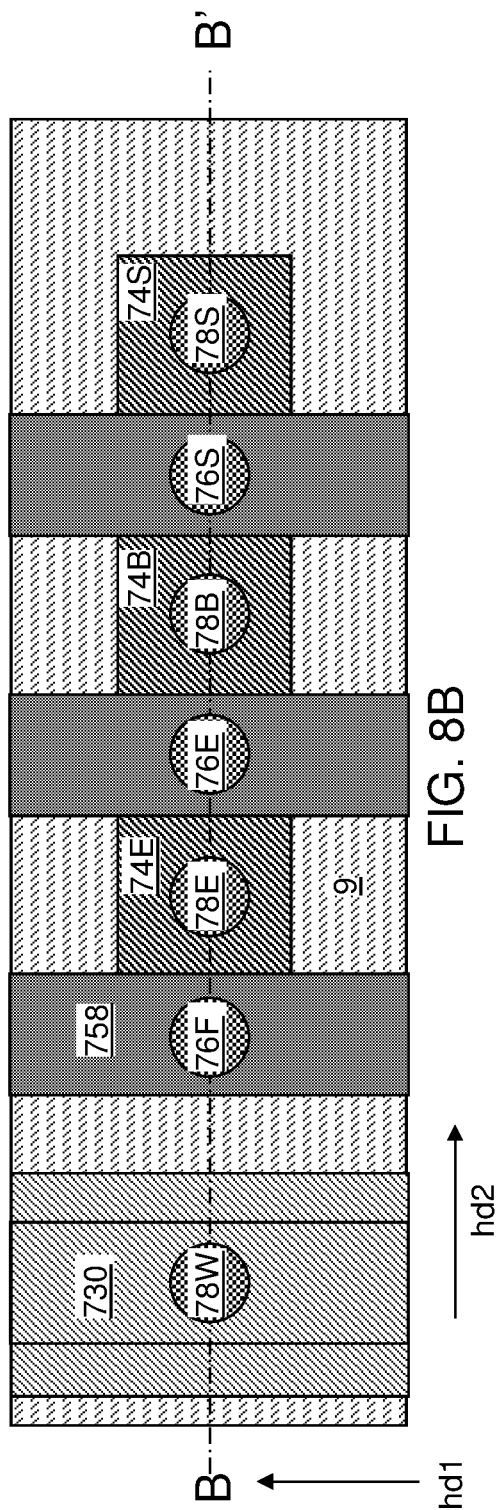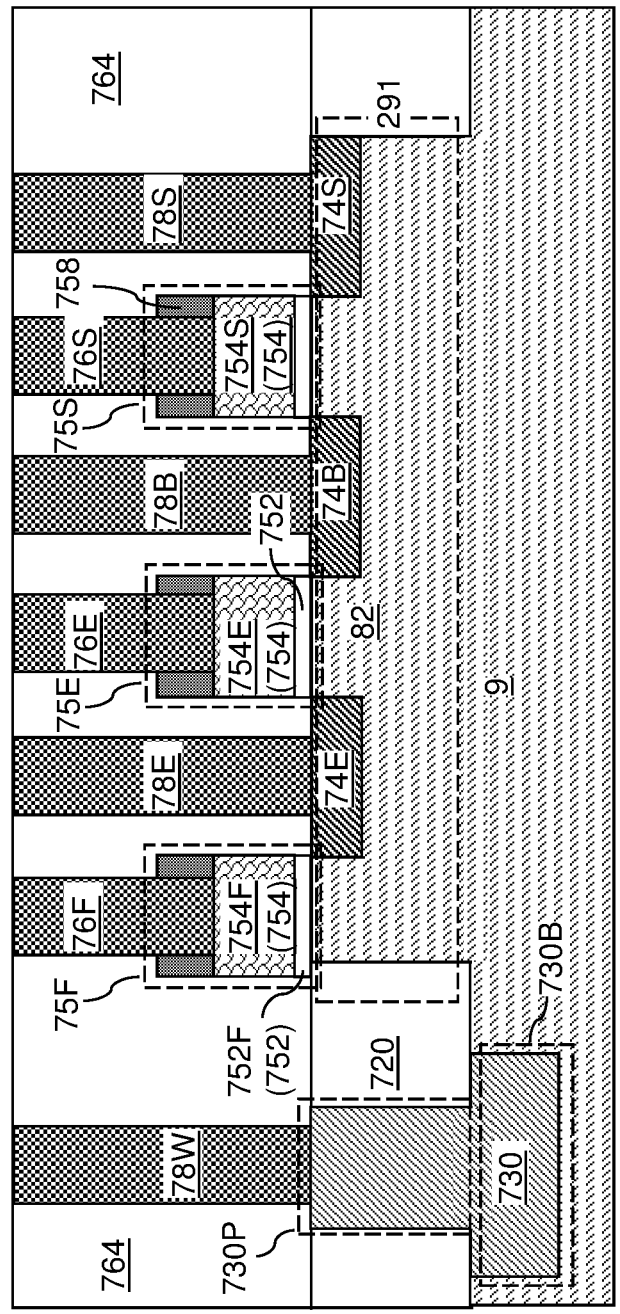

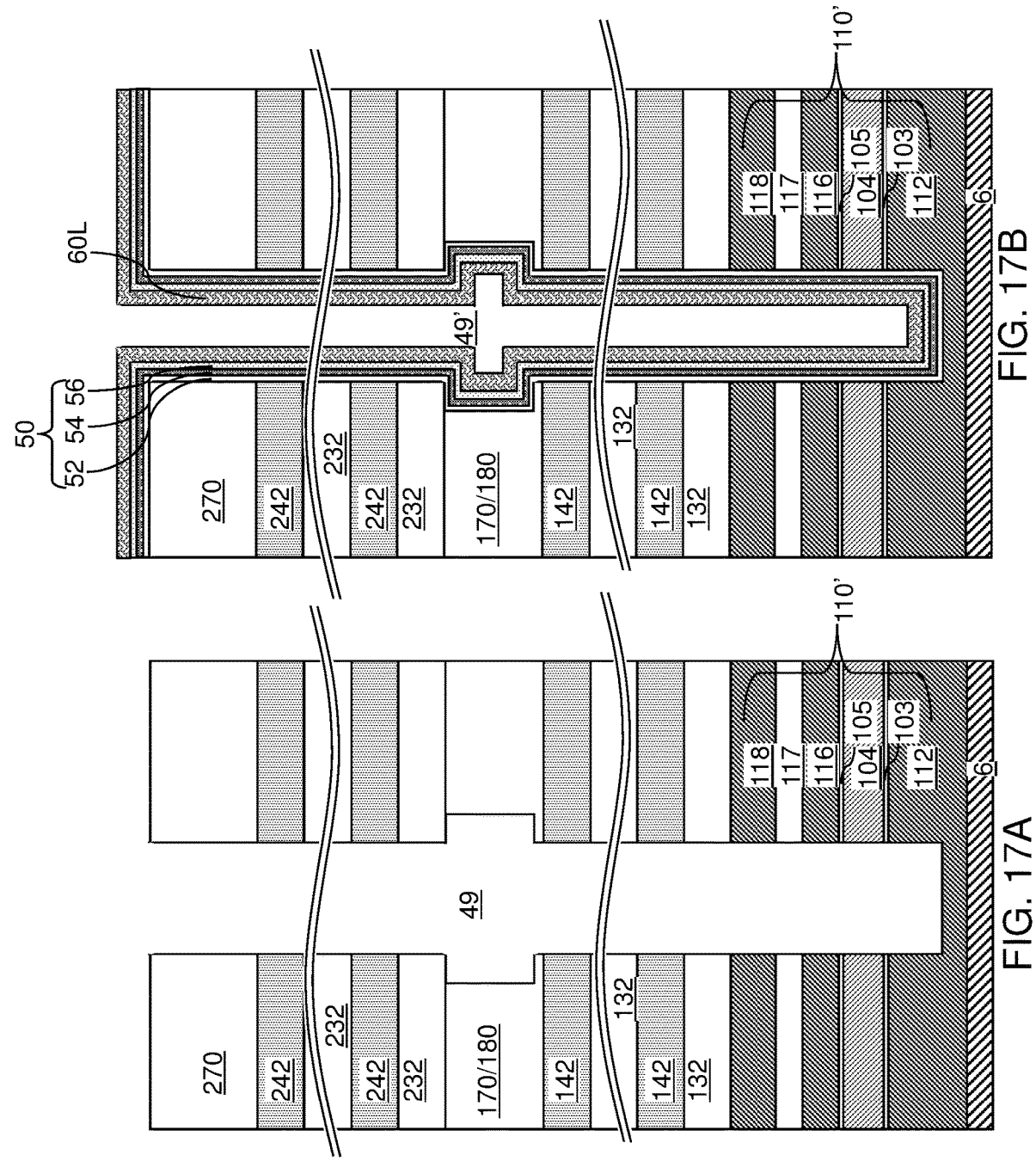

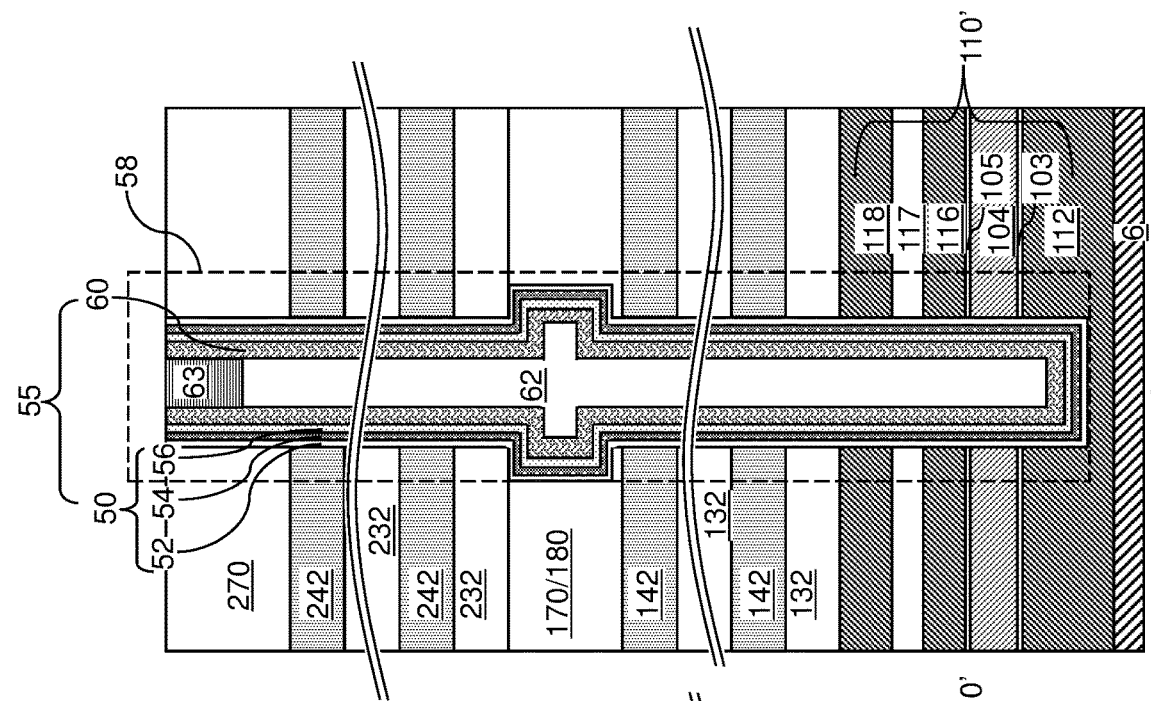
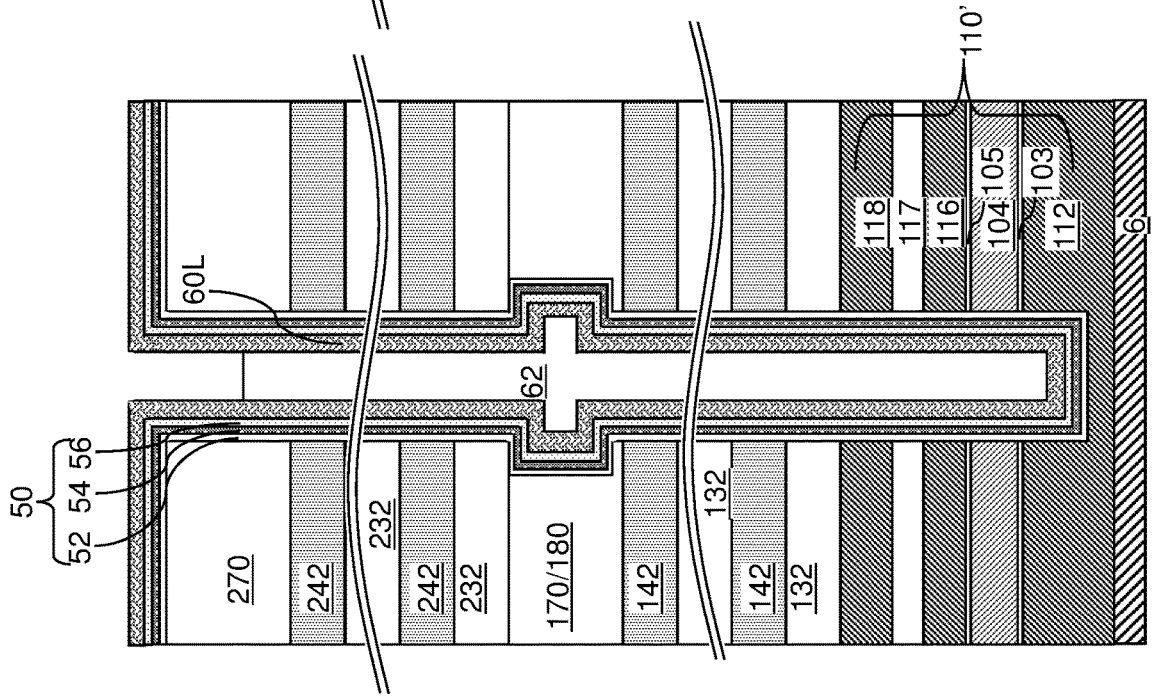
FIG. 17D
FIG. 17C

CUTOFF GATE ELECTRODES FOR SWITCHES FOR A THREE-DIMENSIONAL MEMORY DEVICE AND METHOD OF MAKING THE SAME

FIELD

The present disclosure relates generally to the field of semiconductor devices, and particularly to a three-dimensional memory device including cutoff gate electrodes for switches, and methods of making the same.

BACKGROUND

Recently, ultra-high-density storage devices employing three-dimensional (3D) memory stack structures have been proposed. Such memory stack structures can employ an architecture known as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a memory film and a vertical semiconductor channel.

SUMMARY

According to an aspect of the present disclosure, a semiconductor structure includes a first-conductivity-type well located in a semiconductor substrate, a semiconductor active area region located adjacent to the a first-conductivity-type well, a first transistor including a source region, a drain region, a channel region located between the source region and the drain region, a gate dielectric layer located over the channel region and a gate electrode located over the gate dielectric layer, such that the transistor is located on the semiconductor active area region, and a cutoff gate electrode located over the semiconductor active area region, and between the first transistor and the first-conductivity-type well.

According to another aspect of the present disclosure, a method of forming a semiconductor structure comprises forming a row of semiconductor active area regions and a first-conductivity-type well on a top surface of a semiconductor substrate, wherein the first-conductivity-type well is located adjacent to the row of semiconductor active area regions, forming a switch array comprising a row of switches on the row of semiconductor active area regions by forming field effect transistors thereupon, wherein each of the switches comprises a first transistor, and a cutoff gate electrode formed between the first transistor and the first-conductivity-type well, forming lower-level dielectric material layers embedding line-connection contact via structures that contact the drain regions of the switches over the switch array, and forming an array of memory devices located over the lower-level dielectric material layers, wherein the array of memory devices comprises an array of memory elements, word lines, and bit lines, and a subset of at least one of bit lines or word lines is electrically connected to a respective one of the switches through a respective line-connection contact via structure.

BRIEF DESCRIPTION OF THE DRAWINGS

FIG. 3A is a vertical cross-sectional view of a region of the exemplary structure for forming a first switch after formation of a semiconductor active area and a first-conductivity-type well according to an embodiment of the present disclosure.

FIG. 3B is a top-down view of the region of the exemplary structure of FIG. 3A.

FIG. 5A is a vertical cross-sectional view of the region of the exemplary structure after formation of gate stacks according to an embodiment of the present disclosure.

FIG. 5B is a top-down view of the region of the exemplary structure of FIG. 5A.

FIG. 6A is a vertical cross-sectional view of the region of the exemplary structure after formation of source regions and drain regions according to an embodiment of the present disclosure.

FIG. 6B is a top-down view of the region of the exemplary structure of FIG. 6A.

FIG. 7A is a vertical cross-sectional view of the region of the exemplary structure after formation of a contact-level dielectric layer according to an embodiment of the present disclosure.

FIG. 7B is a top-down view of the region of the exemplary structure of FIG. 7A.

FIG. 8A is a vertical cross-sectional view of the region of the exemplary structure after formation of contact via structures according to an embodiment of the present disclosure.

FIG. 8B is a top-down view of the region of the exemplary structure of FIG. 8A.

FIGS. 17A-17D illustrate sequential vertical cross-sectional views of a memory opening during formation of a memory opening fill structure according to an embodiment of the present disclosure.

DETAILED DESCRIPTION

Figure 1A:
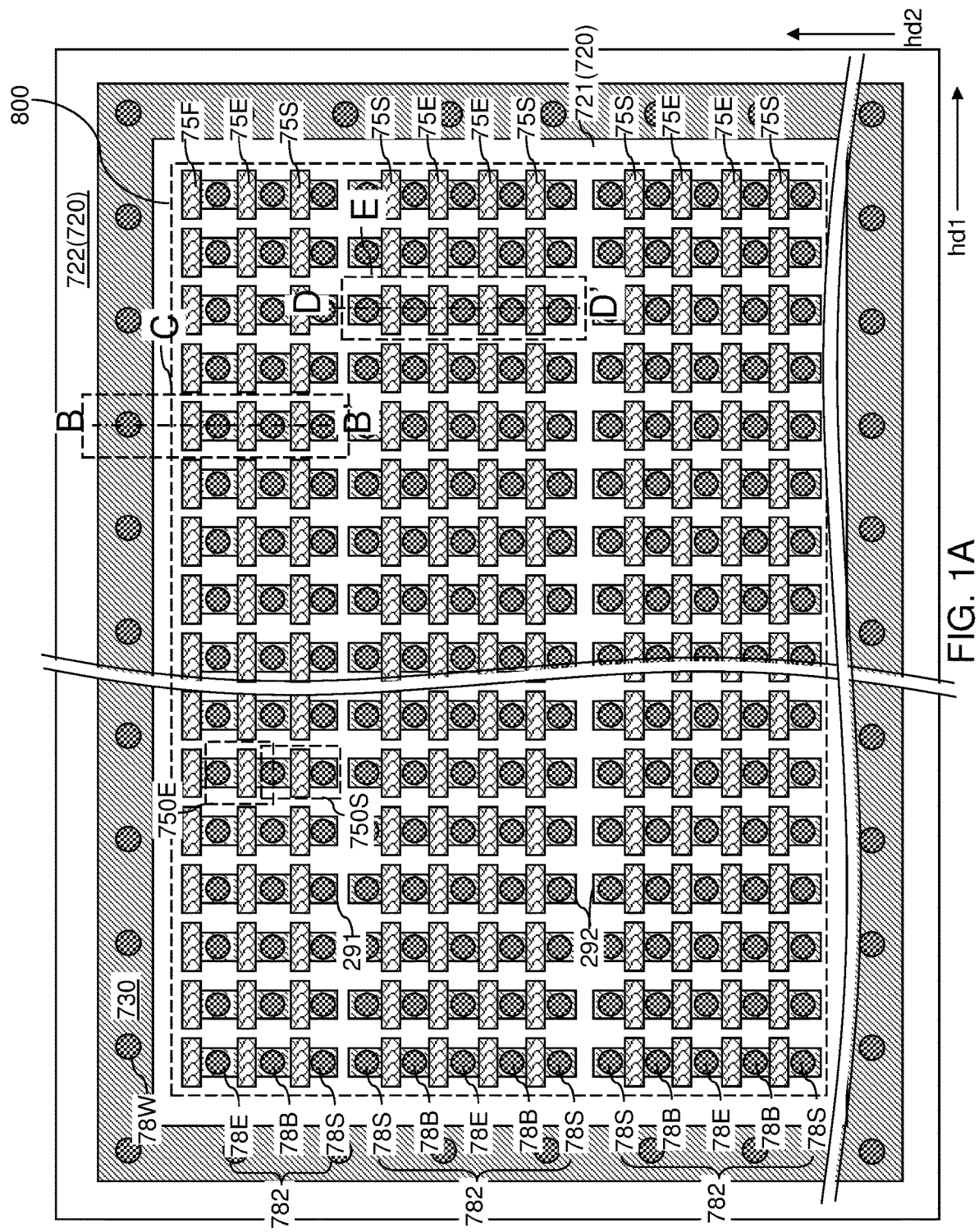
FIG. 1A is a top-down view of a region of an exemplary semiconductor structure after formation of a bit line switch array surrounded by a first-conductivity-type well according to a first embodiment of the present disclosure.
Figure 1C:
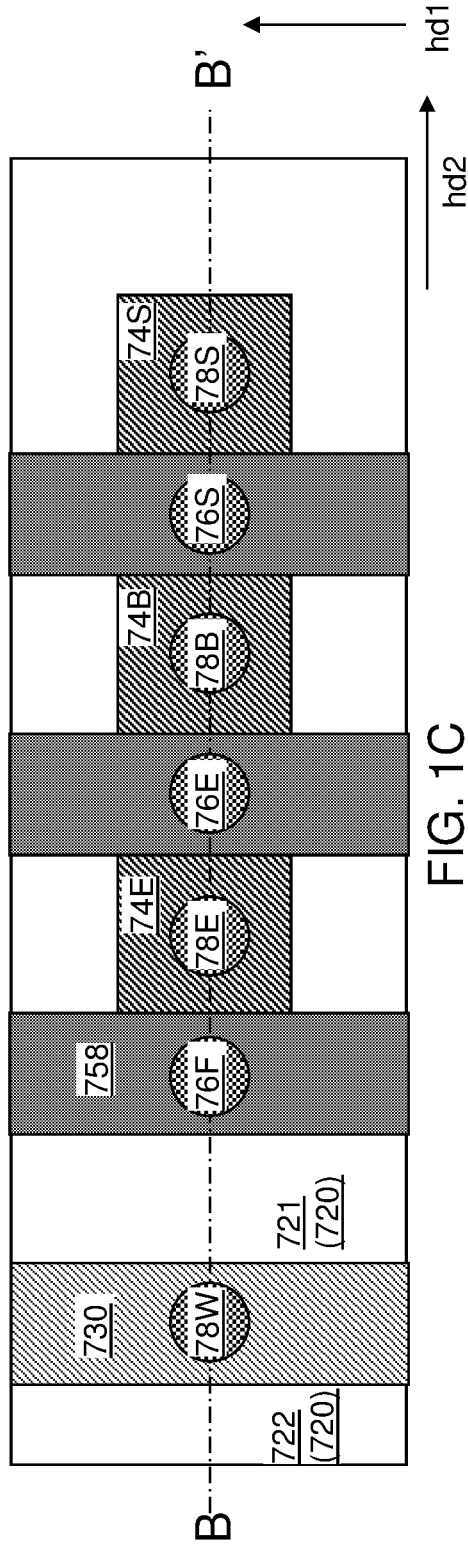
FIG. 1C is a magnified top-down view of a region C of FIG. 1A.

As discussed above, the present disclosure is directed to a three-dimensional memory device including cutoff gate electrodes for field effect transistors which function as switches, such as bit line or word line switches for a memory device, and methods of making the same, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one"

element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming A page is also the smallest unit that can be selected to a read operation.

Referring to FIGS. 1A-1E, a region of an exemplary semiconductor structure is illustrated, which includes a bit line switch array 800. The bit line switch array 800 is part of the peripheral circuit and includes plural field effect transistors which function as bit line switches. The switch array 800 is surrounded by a first-conductivity-type well 730. The first-conductivity-type well 730 can have an annular configuration, i.e., a configuration in which the first-conductivity-type well 730 includes a closed inner periphery that laterally encloses a device region, which is the region of the switch array 800. As used herein, an "annular configuration" refers to any configuration in which an element has an inner closed periphery and an outer closed periphery. In one embodiment, the closed inner periphery may have a pair of first straight edges that laterally extend along a first horizontal direction hd1, and a pair of second straight edges that laterally extend along a second horizontal direction hd2 that is perpendicular to the first horizontal direction hd1. In one embodiment, the inner periphery of the first-conductivity-type well 730 may have a rectangular shape. The first-conductivity-type well 730 can have a closed outer periphery that is laterally offset outward from the closed inner periphery.

The exemplary structure includes a semiconductor substrate 8 and semiconductor devices formed thereupon. The semiconductor substrate 8 includes an optional substrate semiconductor layer 9 at least at an upper portion thereof. The substrate semiconductor layer 9 can have a doping of a first conductivity type, which may be p-type or n-type. In one embodiment, the substrate semiconductor layer 9 can include a single crystalline semiconductor material such as single crystalline silicon. For example, the semiconductor substrate 8 may be a single crystal silicon wafer, and the substrate semiconductor layer 9 may be a doped well in the silicon wafer, an upper portion of a doped silicon wafer, or a doped epitaxial silicon layer formed on the upper surface of the silicon wafer. In one embodiment, atomic concentration of electrical dopants of the first conductivity type in the substrate semiconductor layer 9 may be in a range from $1.0 \times 10^{14}/cm^3$ to $1.0 \times 10^{17}/cm^3$, although lesser and greater atomic concentrations can also be employed.

The first-conductivity-type well 730 can be formed by implantation of electrical dopants of the first conductivity type within an annular area that laterally surrounds the area for forming the switch array 800. If the first conductivity type is p-type, electrical dopants of the first conductivity type can include boron atoms. If the first conductivity type is n-type, electrical dopants of the first conductivity type can include phosphorus atoms, arsenic atoms, and/or antimony atoms. The atomic concentration of the electrical dopants of the first conductivity type in the first-conductivity-type well 730 may be in a range from $1.0 \times 10^{17}/cm^3$ to $1.0 \times 10^{20}/cm^3$, although lesser and greater atomic concentrations can also be employed.

The exemplary structure includes a two-dimensional array of semiconductor active regions (291, 292) within the inner periphery of the first-conductivity-type well 730. The two-dimensional array of semiconductor active regions may be a rectangular array of semiconductor active regions. Each semiconductor active region includes a portion of the substrate semiconductor layer 9 that is not vertically recessed and filled with a dielectric material that forms a shallow trench isolation structure 720. For example, a photoresist layer (not shown) can be applied over the top surface of the substrate semiconductor layer 9 that contains the first-conductivity-type well 730, and can be lithographically patterned to form two nested, rectangular continuous openings within the area that is laterally enclosed by the outer rectangular periphery of the first-conductivity-type well 730. The outer opening can be laterally offset outward from the outer periphery of the first-conductivity-type well 730.

An anisotropic etch process can be performed to transfer the pattern of the openings into an upper portion of the substrate semiconductor layer 9. Shallow trenches are formed in the volumes from which the material of the substrate semiconductor layer 9 is removed by the anisotropic etch process. Optionally, dopants of the first conductivity type (e.g., p-type) may be implanted into the shallow trenches using the patterned photoresist layer as a mask. The photoresist layer is then removed using any suitable process, such as ashing. A dielectric material is then deposited in the shallow trenches to form shallow trench isolation structures 720. The shallow trench isolation structures 720 can include a first (i.e., inner) rectangular shallow trench isolation structure 721 located within the remaining portion of the first-conductivity-type well 730, and a second (i.e., outer) rectangular shallow trench isolation structure 722 that laterally surrounds the first-conductivity-type well 730.

Each patterned upper portion of the substrate semiconductor layer 9 that is laterally surrounded by the first shallow trench isolation structure 721 constitutes the active region of the switch array 800. A two-dimensional array of semiconductor active area regions (291, 292) can be formed within the active region of the switch array 800. The two-dimensional array of semiconductor active area regions include a row of first semiconductor active area regions 291 and optionally at least one row of second semiconductor active area regions 292. In some embodiment, the at least one row of second semiconductor active area regions 292 can include multiple rows of second semiconductor active area regions 292. In one embodiment, the row of first semiconductor active area regions 291 can include multiple first semiconductor active area regions 291 that are arranged along the first horizontal direction hd1. Each row of second semiconductor active area regions 292 can include multiple second semiconductor active area regions 292 that are arranged along the first horizontal direction hd1. The row of first semiconductor active area regions 291 can be laterally spaced from the at least one row of second semiconductor active area regions 292 along the second horizontal direction hd2. The row of first semiconductor active area regions 291 is adjacent to a lengthwise strip of the first-conductivity-type well 730 that laterally extends along the first horizontal direction hd1. In case at least one row of second semiconductor active area regions 292 is present, the row of the first semiconductor active area regions 291 can be an outermost row. In other words, no semiconductor active area region is present between the first semiconductor active area regions 291 and the lengthwise strip of the first-conductivity-type well 730 that laterally extends along the first horizontal direction hd1 and is proximal to the row of first semiconductor active area regions 291.

Generally, a pair of switches can be formed on each second semiconductor active area region 292, and one switch can be formed on each first semiconductor active area region 291. Each of the first semiconductor active area regions 291 and the second semiconductor active area regions 292 can have the same width along the first horizontal direction hd1. Each second semiconductor active area region 292 can have a greater length along the second horizontal direction hd2 than the first semiconductor active area regions 291 in order to accommodate two switches in each second semiconductor active area region 292. In an illustrative example, the width of each of the first semiconductor active area regions 291 and the second semiconductor active area regions 292 may be in a range from 50 nm to 5,000 nm, such as from 100 nm to 1,000 nm, although lesser and greater widths can also be employed. The length of each second semiconductor active area region 292 may be in a range from 300 nm to 15,000 nm, such as from 600 nm to 3,000 nm, although lesser and greater lengths may also be employed. The length of each first semiconductor active area region 291 may be in a range from 52% to 70%, such as from 55% to 65%, of the length of a second semiconductor active area region 292, although lesser and greater lengths can also be employed. The lengthwise edges of each first semiconductor active area region 291 may be aligned to lengthwise edges of at least one second semiconductor active area regions 292 along the second horizontal direction hd2.

The bit line switches are employed to interchangeably electrically connect the bit lines to a sense circuit (e.g., sense amplifier) or to an erase bias voltage supply circuit. The sense circuit has a low bias voltage, which may be in a range from 1 V to 6 V. The erase bias voltage is relatively high, and may be in a range from 15 V to 30 V. The total number of the bit line switches in the bit line switch array 800 may be the same as the total number of bit lines in a memory array to be subsequently formed next to or above the level of the bit line switches. Generally, an M×N rectangular array of bit line switches (i.e., transistors) can be formed in the bit line switch array 800. The number M refers to the total number of second semiconductor active area regions 292 within each row of second semiconductor active area regions 292, which is the same as the total number of first semiconductor active area regions 291 within each row of first semiconductor active area regions 291. The number N is the total number of rows of bit line switches.

The M×N rectangular array of bit line switches can be electrically connected to M×N bit lines. If N is an odd number that is equal to 2n+1, then M of the M×N bit lines can be electrically connected to the bit line switches located over the first semiconductor active area regions 291, and M×2n bit lines can be electrically connected to the bit line switches located over the second semiconductor active area regions 292.

According to an aspect of the present disclosure, each switch formed on the first semiconductor active area regions 291 is configured to suppress breakdown of electrical isolation between each source or drain region to which an erase voltage is applied and the first-conductivity-type well 730. The configuration provided by the first embodiment of the present disclosure reduces of the lateral distance between each source or drain region to which an erase voltage is applied and the first-conductivity-type well 730. Specifically, a cutoff gate electrode 754F is formed over a portion of a channel region 82 within each first semiconductor active area regions 291 that is located between an erase-voltage-side source (or drain) region 74E and the first-conductivity-type well 730. Electrical breakdown between the erase-voltage-side source (or drain) regions 74E and the first-conductivity-type well 730 can be suppressed despite reduction in the lateral distance between the erase-voltage-side source regions 74E and the first-conductivity-type well 730, by applying a zero volts or non-zero cut off voltage to the cutoff gate electrodes 754F. In other words, even though the length of the first active area regions 291 is slightly increased by adding the cutoff gate electrode 754F, the first active area regions 291 may be moved closer to the first-conductivity-type well 730 than in the prior art switches which lack the cutoff gate electrode 754F. Thus, the array 800 density is increased and the space occupied by the array 800 is decreased.

Field effect transistors are formed on the first semiconductor active area regions 291 and the second semiconductor active area regions 292. Gate stacks (75S, 75E, 75F) are formed over the first semiconductor active area regions 291 and gate stacks (75S, 75E) are formed the second semiconductor active area regions 292 by applying and patterning a gate dielectric layer, at least one gate electrode material layer, and an optional gate cap dielectric layer. The gate stacks (75S, 75E, 75F) or (75S, 75E) can include sense circuit switch gate stacks 75S, erase-voltage-connection switch transistor gate stacks 75E, and cutoff gate stacks 75F. Each of the gate stacks (75S, 75E, 75F) includes a vertical stack including, from bottom to top, a gate dielectric 752, a gate electrode (754S, 754E, 754F), and a gate cap dielectric 758. Each sense circuit switch gate stack 75S includes a sense circuit switch gate electrode 754S, each erase-voltage-connection switch transistor gate stack 75E includes an erase-voltage-connection switch transistor gate electrode 754E, and each cutoff gate stack 75F includes a cutoff gate electrode 754F.

According to an aspect of the present disclosure, the layout of the gate stacks (75S, 75E, 75F) over each first semiconductor active area region 291 can be selected such that an erase-voltage-connection switch transistor gate stack 75E is positioned between a sense circuit switch gate stack 75S and a cutoff gate stack 75F. A portion of a first semiconductor active area region 291 that is not covered by a sense circuit switch gate stack 75S is located between a first widthwise edge of the first semiconductor active area region 291 and the sense circuit switch gate stack 75S. A second widthwise edge of the first semiconductor active area region 291 is covered by a cutoff gate electrode 754F. The first widthwise edge of each first semiconductor active area region 291 and the second widthwise edge of each first semiconductor active area region 291 can be parallel to the first horizontal direction hd1. The second widthwise edge of each first semiconductor active area region 291 can be more proximal to a strip portion of the first-conductivity-type well 730 that extends along the first horizontal direction hd1 than the first widthwise edge of the same first semiconductor active area region 291 is to the first-conductivity-type well 730.

The layout of the gate stacks (75S, 75E) over each second semiconductor active area region 292 can be selected such that a first sense circuit switch gate stack 75S, a first erase-voltage-connection switch transistor gate stack 75E, a second erase-voltage-connection switch transistor gate stack 75E, and a second sense circuit switch gate stack 75S are sequentially positioned along a lengthwise direction of the second semiconductor active area region 292, i.e., along the second horizontal direction hd2. In other words, the two sense circuit switch gate stacks 75S are located next to each other between the respective first and second erase-voltage-connection switch transistor gate stack 75E. A portion of the second semiconductor active area region 292 that is not covered by the first sense circuit switch gate stack 75S is located between a first widthwise edge of the second semiconductor active area region 292 and the first sense circuit switch gate stack 75S. A portion of the second semiconductor active area region 291 that is not covered by the second sense circuit switch gate stack 75S is located between a second widthwise edge of the second semiconductor active area region 292 and the second sense circuit switch gate stack 75S. The first widthwise edge of each second semiconductor active area region 292 and the second widthwise edge of each second semiconductor active area region 292 can be parallel to the first horizontal direction hd1. In one embodiment, the gate stacks (75S, 75E) over each second semiconductor active area region 292 can have a symmetrical layout with respect to a vertical plane passing through the geometrical center of the second semiconductor active area region 292 and laterally extending along the first horizontal direction hd1.

Source/drain regions (74B, 74S, 74E) are formed by implanting electrical dopants of a second conductivity type into surface portions of the semiconductor active area regions 290 by an ion implantation process. Gate spacers (not shown) including a dielectric material such as silicon oxide and/or silicon nitride may be formed around each gate stack (75S, 75E, 75F). The electrical dopants of the second conductivity type (e.g., n-type) can have a lateral straggle such that the source/drain regions (74B, 74S, 74E) have an areal overlap with a respective overlying gate stack (75S, 75E, 75F).

The source/drain regions (74B, 74S, 74E) include drain regions 74B that are subsequently electrically connected to a respective bit line. Each drain region 74B can be formed between a neighboring pair of a sense circuit switch gate stack 75S and a erase-voltage-connection switch transistor gate stack 75E. One drain region 74B is formed in each first semiconductor active area region 291, and two drain regions 74B are formed in each second semiconductor active area regions 292.

A sense-circuit-side source region 74S is formed in each first semiconductor active area region 291 between a sense circuit switch gate stack 75S and an adjacent widthwise edge of the first semiconductor active area region 291. Two sense-circuit-side source regions 74S are formed in each second semiconductor active area regions 292. Each sense-circuit-side source region 74S in each second semiconductor active area regions 292 can be formed between a sense circuit switch gate stack 75S and an adjacent widthwise edge of a respective second semiconductor active area region 292. Since the widthwise edges of the second semiconductor active area region 292 are subjected only up to the voltage applied to the sense-circuit-side source regions 74S, the lateral separation distance between the second semiconductor active area regions 292 and the first-conductivity-type well 730 can be relatively short, and thus, the area between the second semiconductor active area regions 292 and the first-conductivity-type well 730 can be relatively small.

An erase-voltage-side source region 74E is formed in each first semiconductor active area region 291 between an erase-voltage-connection switch transistor gate stack 75E and a cutoff gate stack 75F. An erase-voltage-side source region 74E is formed in each second semiconductor active area region 292 between a pair of erase-voltage-connection switch transistor gate stack 75E.

Each unimplanted portion of a first semiconductor active area region 291 includes a channel region 82, which is herein referred to as a first channel region. Each unimplanted portion of a second semiconductor active area region 292 includes a channel region 82, which is herein referred to as a second channel region. Each contiguous combination of a sense-circuit-side source regions 74S, a drain region 74B, a sense circuit switch gate stack 75S, and an underlying portion of a channel region 82 constitutes a sense circuit switch transistor 750S. Each contiguous combination of an erase-voltage-side source region 74E, a drain region 74B, an erase-voltage-connection switch transistor gate stacks 75E, and an underlying portion of a channel region 82 constitutes an erase-voltage-connection switch transistor 750E.

A contact-level dielectric layer 764 can be formed over the field effect transistors, and contact via structures 782 can be formed through the contact-level dielectric layer 764. The contact-level dielectric layer 764 is one of lower-level dielectric material layers that are formed over the field effect transistors. The contact via structures 782 can include line-connection contact via structures 78B (e.g., bit line connection via structures that are electrically connected to a bit line) contacting a respective drain region 74B, sense-circuit-connection contact via structures 78S contacting a respective sense-circuit-side source region 74S, and erase-voltage-side contact via structures 78E contacting a respective erase-voltage-side source region 74E. Well contact via structures 78W can extend through the contact-level dielectric layer 764, and can contact a top surface of the annular pedestal portion 730P of the first-conductivity-type well 730. Gate contact via structures (76S, 76E, 76F) can be formed on each of the sense circuit switch gate electrode 754S, the erase-voltage-connection switch transistor gate electrodes 754E, and the cutoff gate electrodes 754F.

In above described embodiment, each of the switches in each of the first semiconductor active area regions 291 contains only one cutoff gate electrode 754F on the end of the first semiconductor active area regions 291 facing the first-conductivity-type well 730. However, in an alternative embodiment, each of the switches in each of the first semiconductor active area regions 291 contains two cutoff gate electrodes 754F located on the respective ends of the first semiconductor active area regions 291.

According to an aspect of the present disclosure, the exemplary structure can include a switch array 800 located on a top surface of a semiconductor substrate 8 and comprising a first row of switches formed on the row of first semiconductor active area regions 291. Each of the switches comprises a sense circuit switch transistor 750S located on a first side of a line-connection contact via structure 78B, an erase-voltage-connection switch transistor 750E located on a second side of the line-connection contact via structure 78B, and a cutoff gate electrode 754F located between the erase-voltage-connection switch transistor 750E and a first-conductivity-type well 730 located adjacent to the switch array 800.

In one embodiment, each of the switches is located on a respective semiconductor active area region (such as a first semiconductor active area region 291) that is a portion of the semiconductor substrate 8 and laterally surrounded by a respective portion of a shallow trench isolation structure 720 (such as a first shallow trench isolation structure 721).

In one embodiment, each of the switches formed on the row of first semiconductor active area regions 291 comprises a drain region 74B contacting the line-connection contact via structure 78B; a sense-circuit-side source region 74S that is a source region of the sense circuit switch transistor 750S; and an erase-voltage-side source region 74E that is a source region of the erase-voltage-connection switch transistor 750E. In one embodiment, the cutoff gate electrode 754F of each of the switches has an areal overlap with a peripheral portion of the erase-voltage-side source region 74E of transistor 750E.

In one embodiment, the cutoff gate electrode 754F of each of the switches laterally extends over an interface between the respective semiconductor active area region (such as a first semiconductor active area region 291) and the respective portion of a shallow trench isolation structure 720, and an entirety of sidewalls of the cutoff gate electrode 754F overlies the shallow trench isolation structure 720 or the erase-voltage-side source region 74E.

Figure 1B:
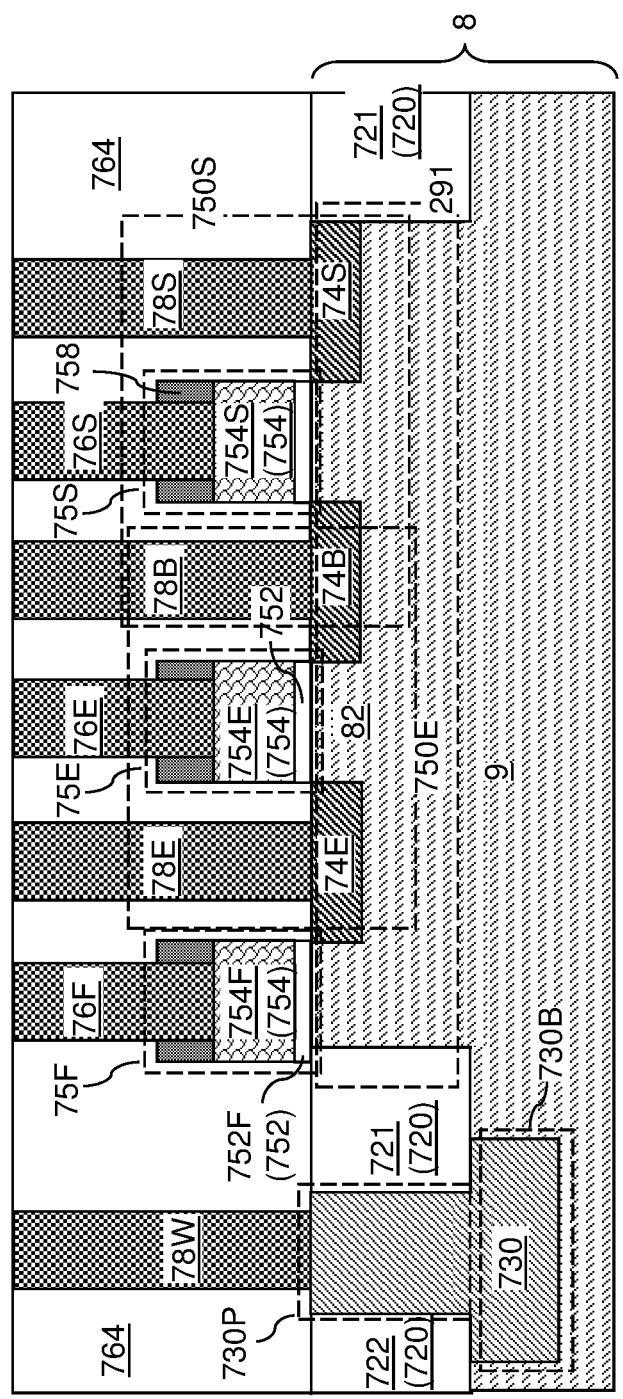
FIG. 1B is a vertical cross-sectional view of the exemplary semiconductor structure along the vertical plane B-B' of FIG. 1A.
Figure 1E:
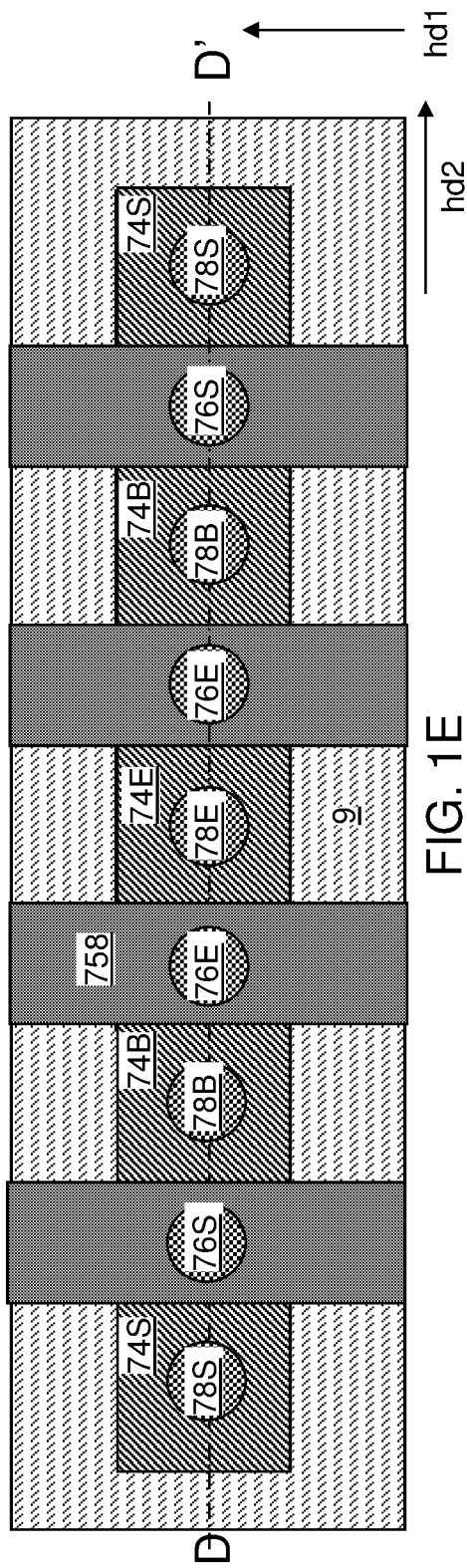
FIG. 1E is a magnified top-down view of a region E of FIG. 1A.
Figure 1D:
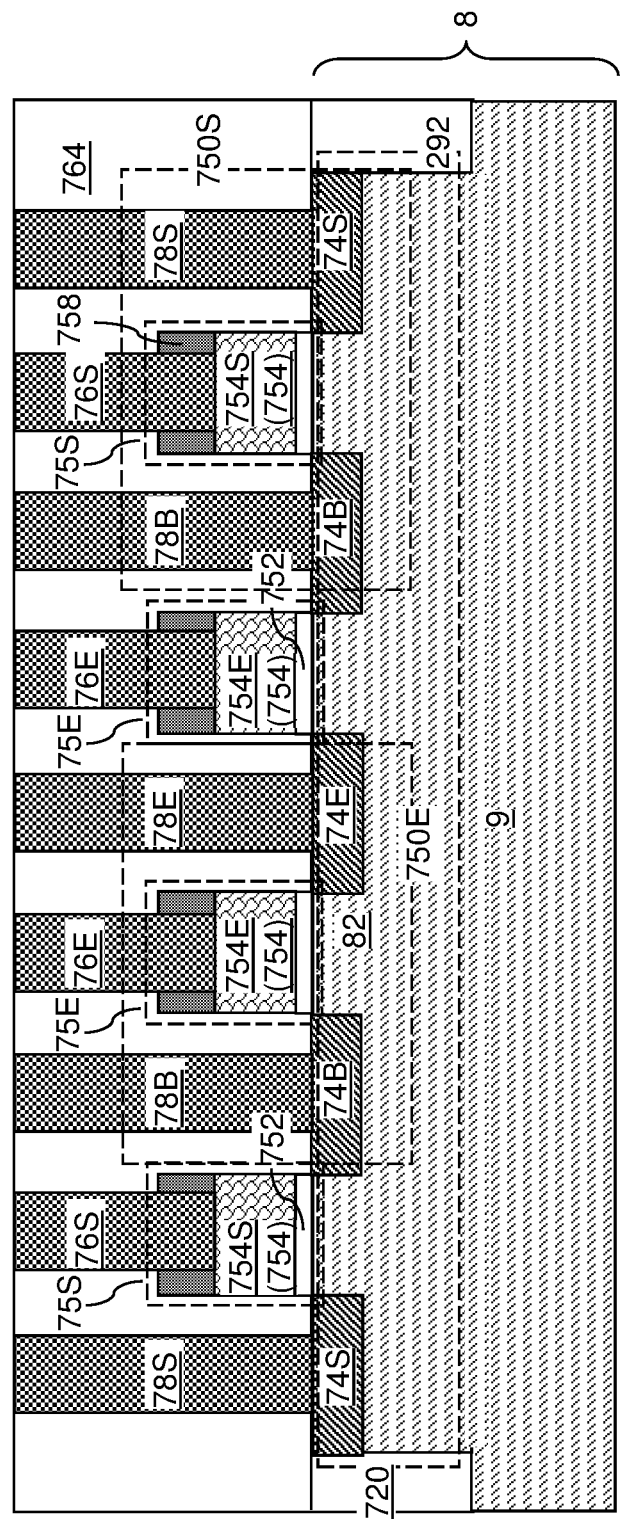
FIG. 1D is a vertical cross-sectional view of the exemplary semiconductor structure along the vertical plane D-D' of FIG. 1A.

In one embodiment shown in FIG. 1B, the edge of the cutoff gate electrode 754F extends past the edge of the first semiconductor active area region 291, and overlies the shallow trench isolation structure 720. This can shrink the size of the array 800. In another embodiment, the edge of the cutoff gate electrode 754F does not extend past the edge of the first semiconductor active area region 291, and overlies the first semiconductor active area region 291.

In one embodiment shown in FIG. 1B, the length of the cutoff gate electrode 754F along the second horizontal direction (i.e., along the source to drain direction) is the same as the length of the switch gate electrode 754S and the erase-voltage-connection switch transistor gate electrode 754E. In an alternative embodiment, the length of the cutoff gate electrode 754F along the second horizontal direction (i.e., along the source to drain direction) is the smaller (e.g., 10 to 50% smaller) than the length of the switch gate electrode 754S and the erase-voltage-connection switch transistor gate electrode 754E. The decrease in the cutoff gate electrode 754F length decreases the size of the transistor 750 and of the array 800.

In one embodiment, a cutoff voltage other than zero volts may be applied to the cutoff gate electrode 754F, such that the breakdown voltage of the adjacent source region 74E is increased due to the relaxing voltage between the cutoff gate electrode 754F and the adjacent source region 74E. In this embodiment, the size of the shallow trench isolation structure 721 may be decreased or the shallow trench isolation structure 721 may be eliminated, which decreases the size of the array 800.

In one embodiment, the first-conductivity-type well 730 is laterally spaced from an interface between the respective semiconductor active area region (such as a first semiconductor active area region 291) and the shallow trench isolation structure 720. In one embodiment, the first-conductivity-type well 730 has an annular configuration and laterally surrounds the switch array 800. In one embodiment, the respective semiconductor active area region (such as a first semiconductor active area region 291) comprise a channel region 82 having a doping of the first conductivity type and including electrical dopants of the first conductivity type at an atomic concentration that is lower than an atomic concentration of dopants of the first conductivity type in the first-conductivity-type well 730; and p-n junctions are located at interfaces between the channel region 82 and each of the drain region 74B, the sense-circuit-side source region 74S, and the erase-voltage-side source region 74E.

In one embodiment, the first-conductivity-type well 730 comprises: a base portion 730B located under a horizontal plane including a bottom surface of the shallow trench isolation structure 720, and an annular pedestal portion 730P that laterally surrounds the shallow trench isolation structure 720 and contacting an outer sidewall of the shallow trench isolation structure 720. Another shallow trench isolation structure 720 (such as a second shallow trench isolation structure 722) laterally surrounds the annular pedestal portion 730P of the first-conductivity-type well 730 and overlies, and contacts, an outer region of the base portion 730B of the first-conductivity-type well 730. Well contact via structures 78W can contact a top surface of the annular pedestal portion 730P of the first-conductivity-type well 730. A cutoff gate dielectric 752F (which is a gate dielectric 752 of a cutoff gate stack 75F) can be disposed between the cutoff gate electrode 754F and the channel region 82.

Additional semiconductor devices (not shown) can be formed on the semiconductor substrate 8. The additional semiconductor device include sense circuits that are electrically connected to a sense-circuit-side source region 74S of a respective sense circuit switch transistor 750S, and an erase voltage power supply circuit that is electrically connected to the erase-voltage-side source region 74E of each erase-voltage-connection switch transistor 750E. A cutoff bias voltage supply circuit may be optionally electrically connected to the cutoff gate electrode 754F if a cutoff voltage other than zero volts is to be applied to the cutoff gate electrode 754F. Otherwise, zero volts is applied to the cutoff gate electrode 754F and a specific cutoff bias voltage supply circuit is not required.

Additional lower-level metal interconnect structures (not shown) embedded in additional lower-level dielectric material layers (not shown) can be formed to provide electrical connection between the switch array 800 and the sense circuits and the erase voltage power supply circuit. Generally, the lower-level metal interconnect structures can be embedded in the lower-level dielectric material layers. A first subset of the lower-level metal interconnect structures provides electrical connection between a sense-circuit-side source region 74S of a respective sense circuit switch transistor 750S and a respective sense circuit located on the semiconductor substrate 8. A second subset of the lower-level metal interconnect structures provides electrical connection between an erase-voltage-side source region 74E of a respective erase-voltage-connection switch transistor 750E and an erase voltage power supply circuit.

Figure 1F:
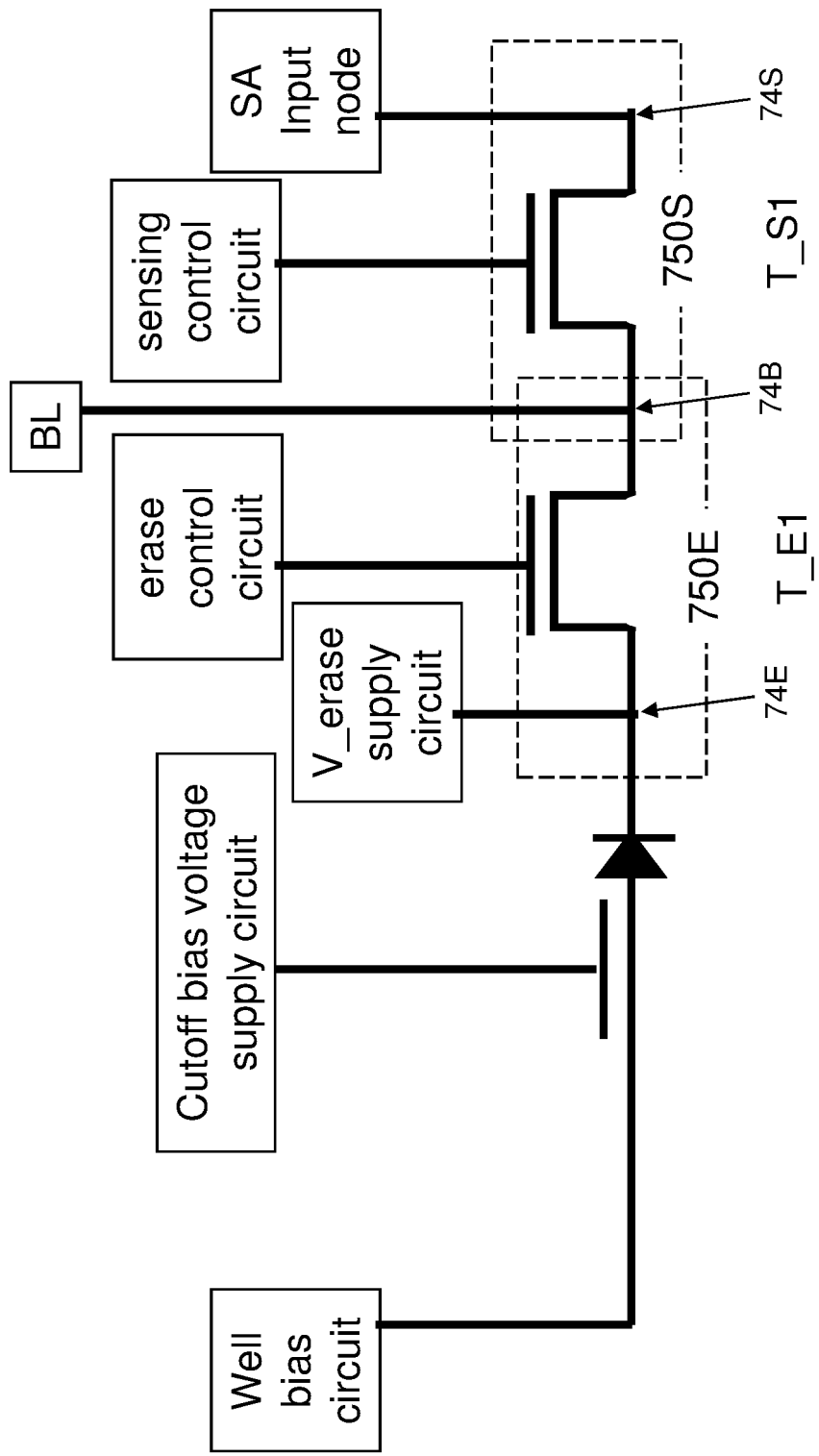
FIG. 1F is a circuit schematic of a first bit line switch within the region C of FIG. 1A.

FIG. 1F illustrates a circuit schematic of a first bit line switch located on a first semiconductor active area region 291. The sense circuit switch transistor 750S is represented as a sense circuit switch transistor T_S for the first bit line switch that is formed on the first semiconductor active area region 291. The erase-voltage-connection switch transistor 750E is represented as an erase-voltage-connection switch transistor T_E for the first bit line switch that is formed on the first semiconductor active area region 291. A drain region 74B is shared between the sense circuit switch transistor T_S and the erase-voltage-connection switch transistor T_E of the first bit line switch. A bit line BL is connected to the drain region 74B. An input node of a sense amplifier in a sense circuit can be connected to the sense-circuit-side source region 74S of the sense circuit switch transistor T_S. The erase voltage power supply circuit can be connected to the erase-voltage-side source region 74E of the erase-voltage-connection switch transistor T_E. The sense circuit switch gate electrode 754S is connected to a sensing control circuit. The erase-voltage-connection switch transistor gate electrode 754E is connected to an erase control circuit. The cutoff gate electrode 754F is connected to a cutoff bias voltage supply circuit, which can supply a voltage that is sufficient to suppress leakage of electrical current through a portion of the channel region 82 that underlies the cutoff gate electrode 754F. For example, if the first conductivity type is p-type, the cutoff bias voltage supply circuit can apply a negative voltage, and if the first conductivity type is n-type, the cutoff bias voltage supply circuit can apply a positive voltage. The well contact via structures 78W can be connected to a well bias circuit, which can be configured to electrically ground the first-conductivity-type well 730, i.e., apply the voltage of 0 V to the first-conductivity-type well 730. A p-n junction is located between the erase-voltage-side source region 74E and portion of the channel region 82 that underlies the cutoff gate electrode 754F.

Figure 1G:
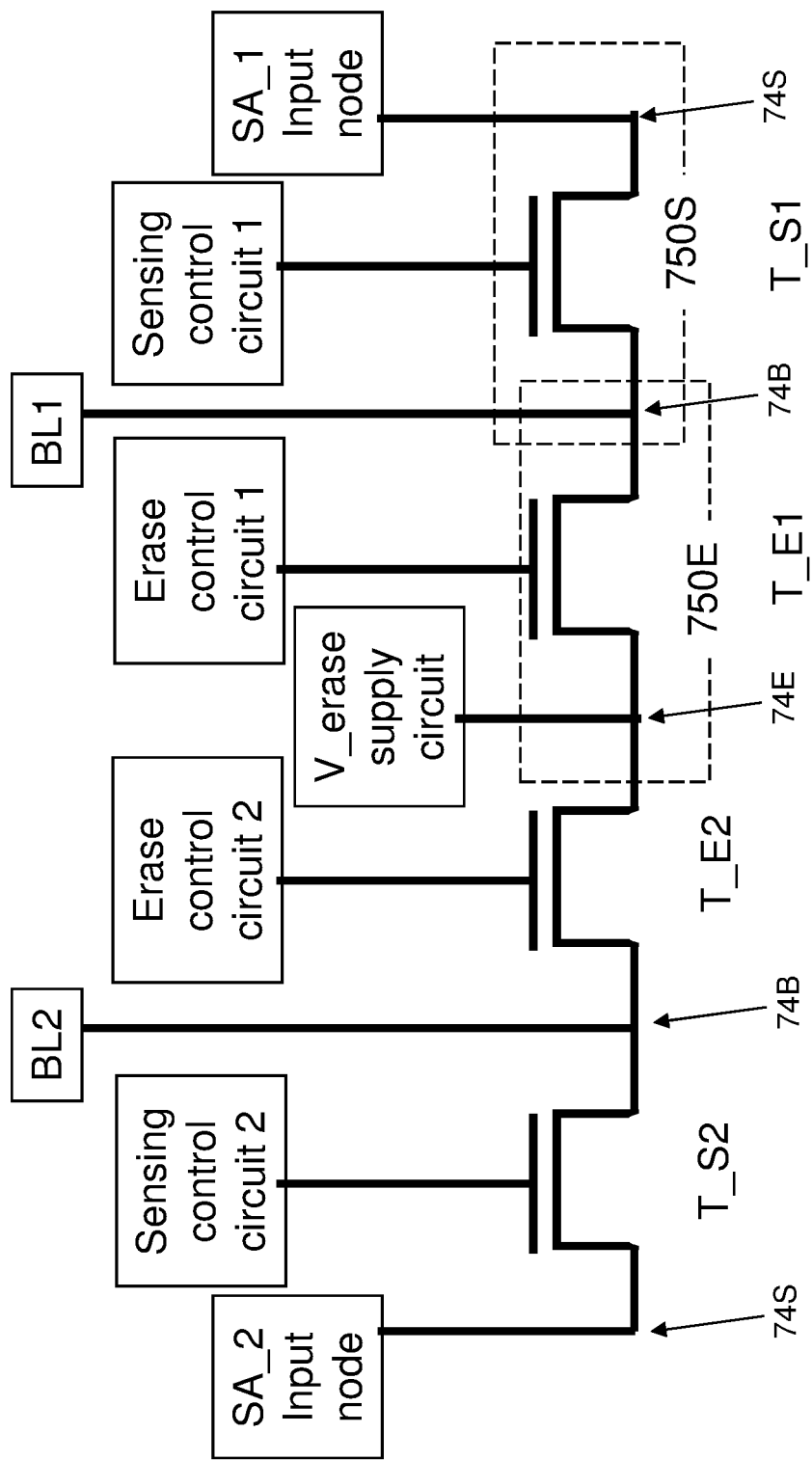
FIG. 1G is a circuit schematic of a second bit line switch within the region E of FIG. 1A.

FIG. 1G illustrates a circuit schematic of a pair of second bit line switches located on a second semiconductor active area region 292. A sense circuit switch transistor (74S, 74B, 75S, 82) is represented as a sense circuit switch transistor (T_S1, T_S2) for each second bit line switch that is formed on the second semiconductor active area region 292. An erase-voltage-connection switch transistor (74E, 74B, 75E, 82) is represented as an erase-voltage-connection switch transistor (T_E1, T_E2) for each second bit line switch that is formed on the second semiconductor active area region 292. A drain region 74B is shared between a neighboring pair of a sense circuit switch transistor (T_S1 or T_S2) and an erase-voltage-connection switch transistor (T_E1 or T_E2) of each second bit line switch. A bit line (BL1 or BL2) is connected to each drain region 74B. An input node of a sense amplifier in the sense circuit can be connected to the sense-circuit-side source region 74S of each sense circuit switch transistor (T_S1, T_S2). The erase voltage power supply circuit can be connected to the erase-voltage-side source region 74E of each erase-voltage-connection switch transistor (T_E1, T_E2). Each sense circuit switch gate electrode 754S is connected to a respective sensing control circuit. Each erase-voltage-connection switch transistor gate electrode 754E is connected to an erase control circuit.

Figure 2A:
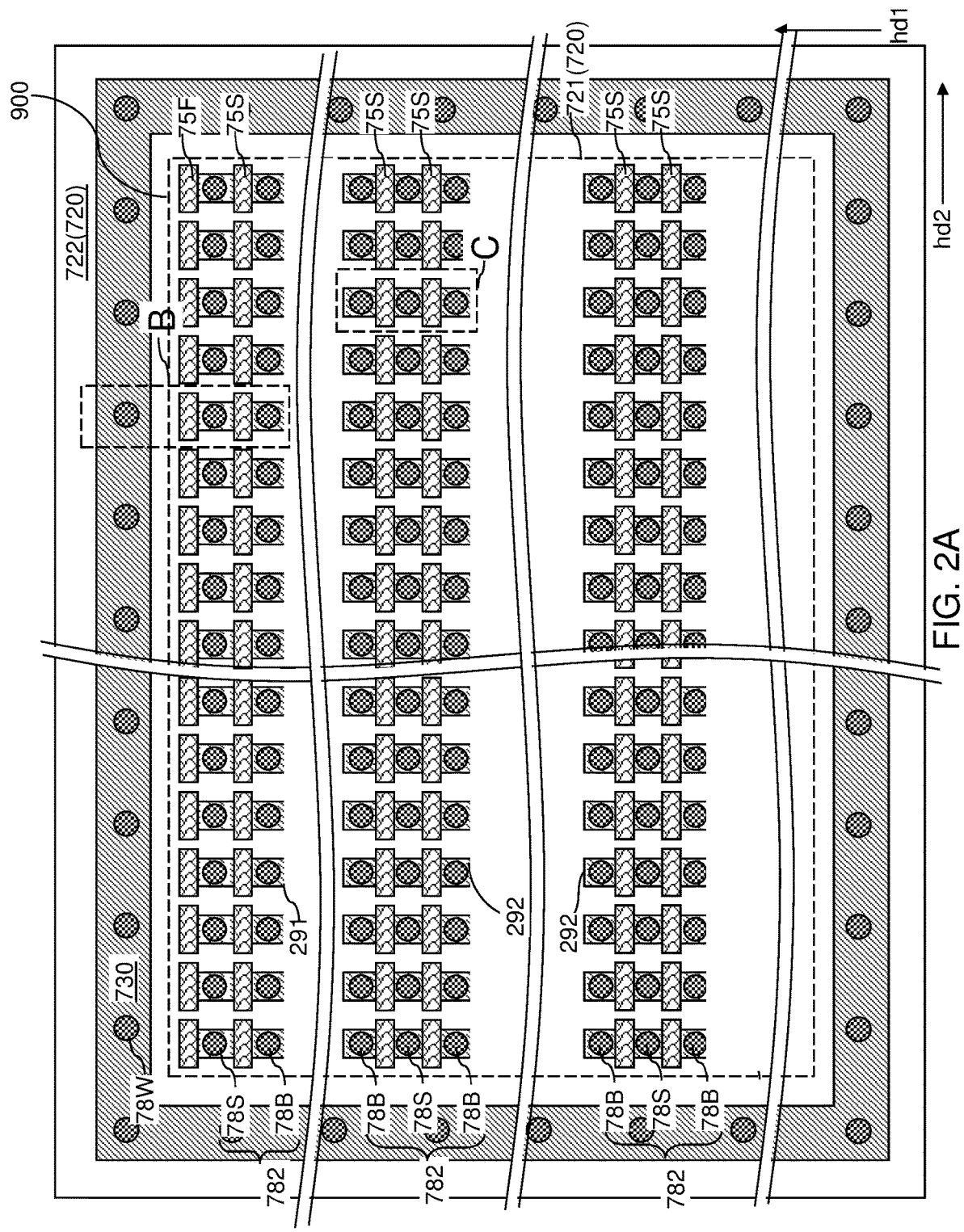
FIG. 2A is a top-down view of a region of an exemplary semiconductor structure after formation of a word line switch array surrounded by a first-conductivity-type well according to a second embodiment of the present disclosure.

Referring to FIG. 2A, a region of an exemplary semiconductor structure according to the second embodiment is illustrated, which includes a word line switch array 900. Only the differences between the array 900 and the array 800 will be described below for brevity. The bit line switch array 900 is part of the peripheral circuit and includes plural field effect transistors which function as word line switches. The switch array 900 is also surrounded by a respective first-conductivity-type well 730. The first and second semiconductor active areas (291, 292) may be rotated 90 degrees with respect to their orientation in the bit line switch array 800 of FIG. 1A.

In this embodiment, the first semiconductor active area 791 includes a single switch transistor 750S which contains a source region 74S, a drain region 74B, a gate electric layer 752, a channel region 82, a gate stack 75S located between the source and drain regions, and a cutoff gate stack 75F located between the source region and the first-conductivitytype well 730. Word line-connection contact via structures 78B electrically connect the drain region 74B to a respective word line. Signal contact via structures 78S electrically connect a respective source region 74S to a signal voltage supply circuit. Well contact via structures 78W can extend through the contact-level dielectric layer 764, and can contact a top surface of the annular pedestal portion 730P of the first-conductivity-type well 730. Gate contact via structures (76S, 76F) can be formed on each of the gate electrode 754S of the gate stack 75S, and the cutoff gate electrodes 754F of the gate stack 75F.

Figure 2B:
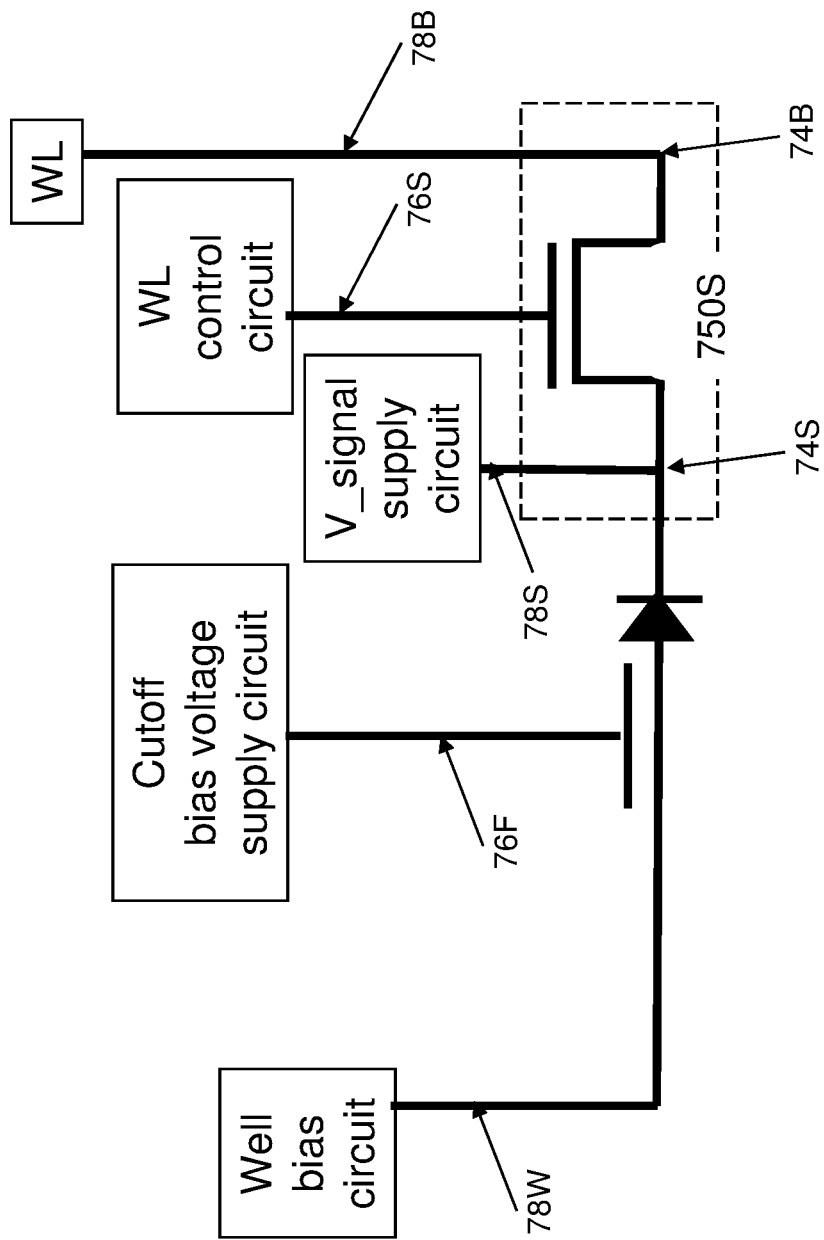
FIG. 2B is a circuit schematic of a first word line switch within the region B of FIG. 2A.

FIG. 2B illustrates a circuit schematic of a first bit line switch containing the switch transistor 750S located on a first semiconductor active area region 291. A word line control circuit is electrically connected to the gate electrode 754S. A word line WL is electrically connected to the drain region 74B. An input node of the signal voltage supply circuit is electrically connected to the source region 74S. The cutoff gate electrode 754F is connected to a cutoff bias voltage supply circuit, which can supply zero volts or a non-zero voltage that is sufficient to suppress leakage of electrical current through a portion of the channel region 82 that underlies the cutoff gate electrode 754F. The well contact via structures 78W can be connected to a well bias circuit, which can be configured to electrically ground the first-conductivity-type well 730, i.e., apply the voltage of 0 V to the first-conductivity-type well 730. A p-n junction is located between the erase-voltage-side source region 74E and portion of the channel region 82 that underlies the cutoff gate electrode 754F.

Figure 2C:
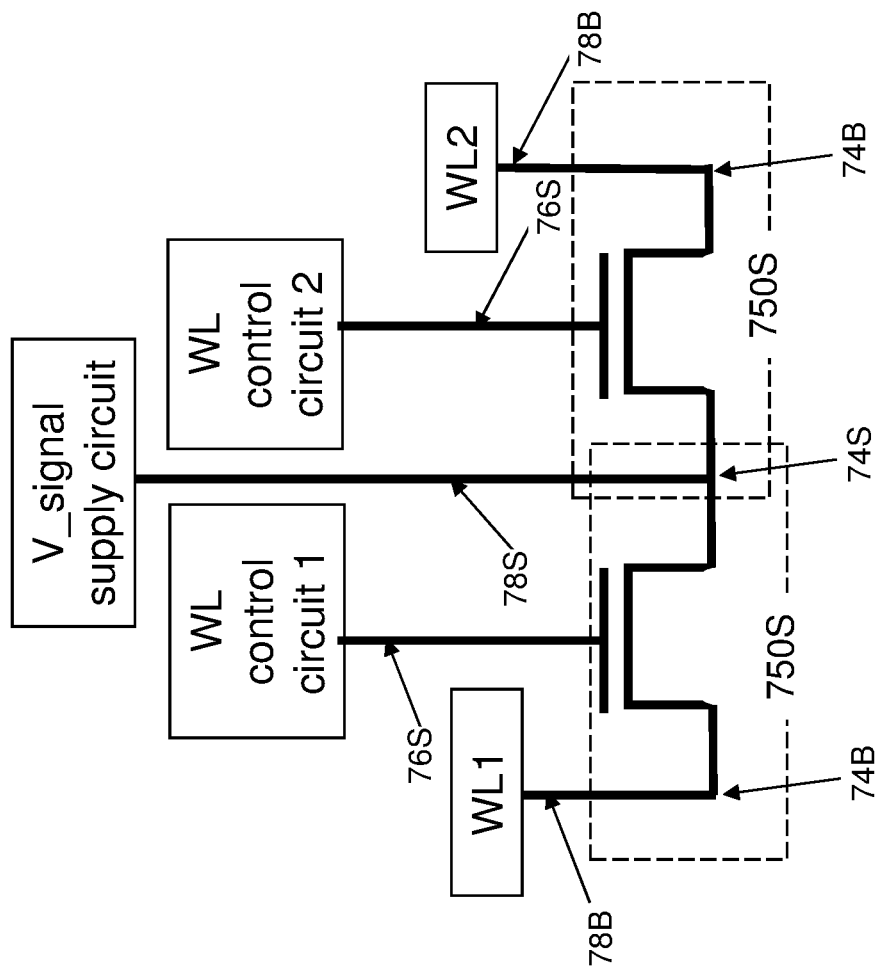
FIG. 2C is a circuit schematic of a second word line switch within the region C of FIG. 2A.

FIG. 2C illustrates a circuit schematic of a second bit line switch containing two switch transistors 750S located on the second semiconductor active area region 292. The switch transistors 750S share a common source region 74S, but contain separate gate electrode stacks 75S, separate gate contact via structures 76S, separate contact via structures 78B and separate drain regions 74B.

Thus, in one embodiment, the word line switch array 900 is located on the semiconductor substrate 8 and comprises a row of switches, wherein each of the switches comprises the switch transistor 750S, wherein the cutoff gate electrode 754F is located between the switch transistor 750 and the first-conductivity-type well located adjacent to the word line switch array 900. A subset of the word lines 46 is electrically connected to a respective one of the switches through a respective word-line-connection contact via structure 78B.

Referring to FIGS. 3A and 3B, a region of the exemplary structure for forming a first switch is illustrated after formation of a first and second semiconductor active areas (291, 292) and a first-conductivity-type well 730 during a manufacturing processing step. The first-conductivity-type well 730 can be formed in an annular configuration in an upper portion of the substrate semiconductor layer 9. A photoresist layer (not shown) can be applied and patterned over the substrate semiconductor layer 9, and an anisotropic etch process can be performed to transfer the pattern in the photoresist layer into the upper portion of the substrate semiconductor layer 9 to form the first and second semiconductor active areas (291, 292) (only the first semiconductor active area 291 is shown in these figures for clarity). Shallow trenches 712 are formed in volumes from which the material of the semiconductor substrate 8 is removed. The photoresist layer can be subsequently removed, for example, by ashing. In one embodiment, each of the semiconductor active area regions (291, 292) can have a rectangular horizontal cross-sectional shape having a pair of lengthwise edges and a pair of widthwise edges that are shorter than the pair of lengthwise edges.

Generally, a row of first semiconductor active area regions 291 and a first-conductivity-type well 730 can be formed on a top surface of a semiconductor substrate 8. The first-conductivity-type well 730 can be located adjacent to the row of first semiconductor active area regions 291. The row of the first semiconductor active area regions 291 and the first-conductivity-type well 730 can have a doping of a first conductivity type, and each of the first semiconductor active area regions 291 can have a rectangular horizontal cross-sectional shape having a pair of lengthwise edges (which may be parallel to the second horizontal direction hd2) and a pair of widthwise edges (which may be parallel to the first horizontal direction hd1) that are shorter than the pair of lengthwise edges. At least one row of second semiconductor active area regions 292 can be formed as illustrated in FIG. 1A or 2A. The first-conductivity-type well 730 can be formed in an annular configuration and laterally surround the row of first semiconductor active area regions 291 and the at least one second semiconductor active area regions 292. In one embodiment, the first-conductivity-type well 730 comprises a base portion 730B and an annular pedestal portion 730A having a lesser lateral extent than the base portion 730B and vertically protruding above the base portion 730B. In one embodiment, the annular top surface of the annular pedestal portion 730A can be within a same horizontal plane as the top surface of the first semiconductor active area region 291. In one embodiment, the annular top surface of the annular pedestal portion 730A can have an inner rectangular periphery and an outer rectangular periphery.

Figure 4B:
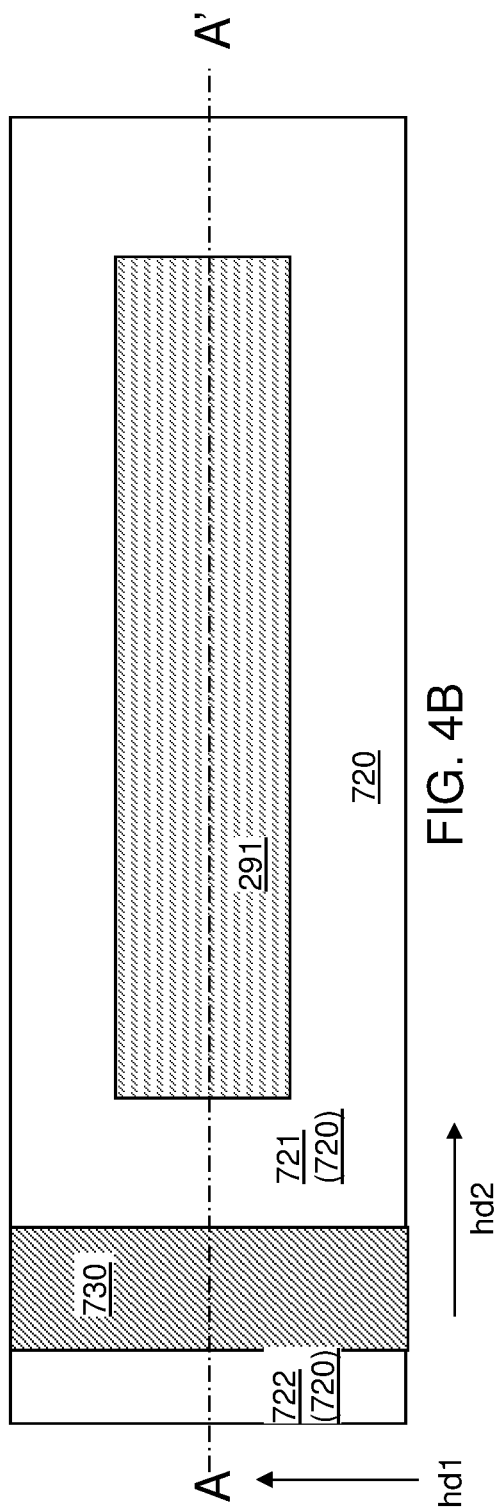
FIG. 4B is a top-down view of the region of the exemplary structure of FIG. 4A.
Figure 4A:
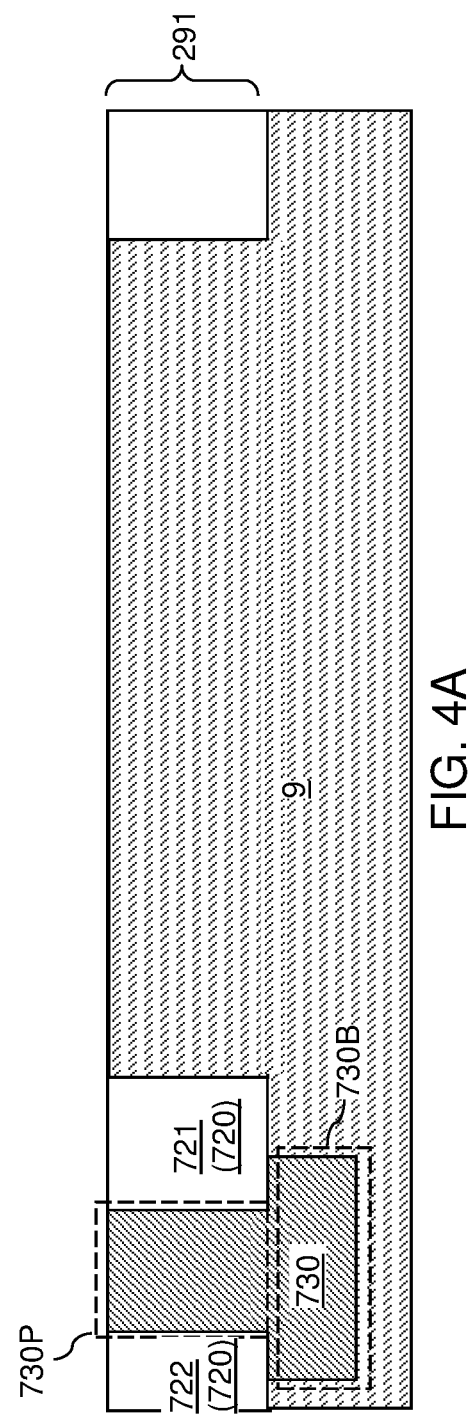
FIG. 4A is a vertical cross-sectional view of the region of the exemplary structure after formation of shallow trench isolation structures according to an embodiment of the present disclosure.

Referring to FIGS. 4A and 4B, a dielectric material such as silicon oxide can be deposited in the shallow trenches 712, and excess portions of the dielectric material located above the horizontal plane including the top surfaces of the first semiconductor active area regions 291 (and the top surfaces of the second semiconductor active area regions 292) can be removed by a planarization process (such as a chemical mechanical planarization process). Remaining portions of the dielectric material include shallow trench isolation structures 720. A first shallow trench isolation structure 721 can be formed inside the first-conductivity-type well 730 around the row of first semiconductor active area regions 291 and at least one row of second semiconductor active area regions 291 in the shape of a rectangular mesh. A second shallow trench isolation structure 722 can laterally surround the first-conductivity-type well 730.

Referring to FIGS. 5A and 5B, gate stacks (75S, 75E, 75F) are formed over the first semiconductor active area regions 291 and the second semiconductor active area regions 292 by applying and patterning a gate dielectric layer, at least one gate electrode material layer, and an optional gate cap dielectric layer. The gate stacks (75S, 75E, 75F) can include sense circuit switch gate stacks 75S, erase-voltage-connection switch transistor gate stacks 75E, and cutoff gate stacks 75F for the bit line switch array 800 of FIGS. 1A-1G. Alternatively, the gate stacks (75S, 75F) can include switch gate stacks 75S and cutoff gate stacks 75F for the word line switch array 900 of FIGS. 2A-2C. Each of the gate stacks (75S, 75E, 75F) includes a vertical stack including, from bottom to top, a gate dielectric 752, a gate electrode (754S, 754E, 754F), and a gate cap dielectric 758. Each gate stack 75S includes a gate electrode 754S, each erase-voltage-connection switch transistor gate stack 75E includes an erase-voltage-connection switch transistor gate electrode 754E, and each cutoff gate stack 75F includes a cutoff gate electrode 754F. The gate electrode 754S (i.e., the gate electrodes for the switch transistors), the erase-voltage-connection switch transistor gate electrodes 754E (i.e., the gate electrodes for the erase-voltage-connection switch transistor), and the cutoff gate electrodes 754F can be simultaneously formed. The layout of the gate stacks (75S, 75E, 75F) can be as described above.

Referring to FIGS. 6A and 6B, source/drain regions (74B, 74S, 74E) are formed by implanting electrical dopants of a second conductivity type into surface portions of the semiconductor active area regions 290 by an ion implantation process. The second conductivity type is the opposite of the first conductivity type. Gate spacers (not shown) including a dielectric material such as silicon oxide and/or silicon nitride may be formed around each gate stack (75S, 75E, 75F). The electrical dopants of the second conductivity type can have a lateral straggle such that the source/drain regions (74B, 74S, 74E) have an areal overlap with a respective overlying gate stack (75S, 75E, 75F).

Each source region 74S is a source region of a switch transistor 750S, and each erase-voltage-side source region 74E is a source region of the erase-voltage-connection switch transistor 750E. Each drain region 74B is a common drain region of the switch transistor 750S and the erase-voltage-connection switch transistor 750E. In the array 800 of FIG. 1A, each cutoff gate electrode 754F is formed with an areal overlap with a peripheral portion of the source region of a respective one of the erase-voltage-connection switch transistor 750E, i.e., with an areal overlap with an erase-voltage-side source region 74E. In the array 900 of FIG. 2A, each cutoff gate electrode 754F is formed with an areal overlap with a peripheral portion of the source region of a respective one of the switch transistors 750S, i.e., with an areal overlap with the source region 74S. In one embodiment, each cutoff gate electrode 754F overlies an entirety of a respective one of the widthwise edges of the semiconductor active area region 791 (which may laterally extend along the first horizontal direction hd1).

Referring to FIGS. 7A and 7B, the contact-level dielectric layer 764 can be formed over the field effect transistors. Referring to FIGS. 8A and 8B, various contact via structures (78S, 78E, 78B, 78W, 76S, 76E, 76F) can be formed through the contact-level dielectric layer 764 in a configuration described above.

Generally, a switch array (800, 900) comprising a row of first switches can be formed on a row of first semiconductor active area regions 291 by forming field effect transistors thereupon. Each of the first switches in the array 800 comprises a sense circuit switch transistor 750S and an erase-voltage-connection switch transistor 750E that share a drain region 74B, and a cutoff gate electrode 754F formed between the erase-voltage-connection switch transistor 750E and the first-conductivity-type well 730.

Figure 9A:
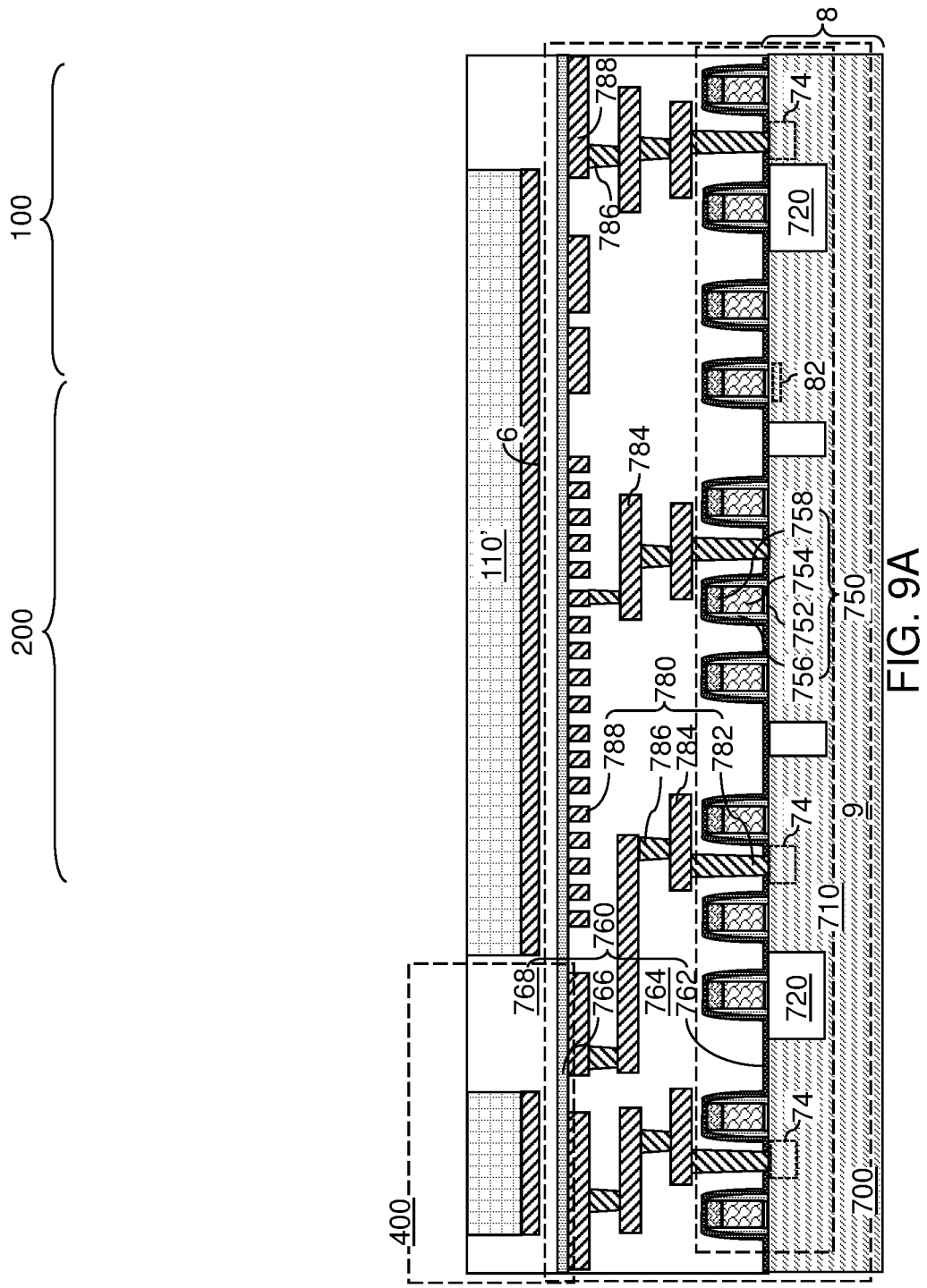
FIG. 9A is a vertical cross-sectional view of the exemplary structure after formation of semiconductor devices, lower level dielectric layers, lower metal interconnect structures, and in-process source level material layers on a semiconductor substrate according to an embodiment of the present disclosure.
Figure 9B:
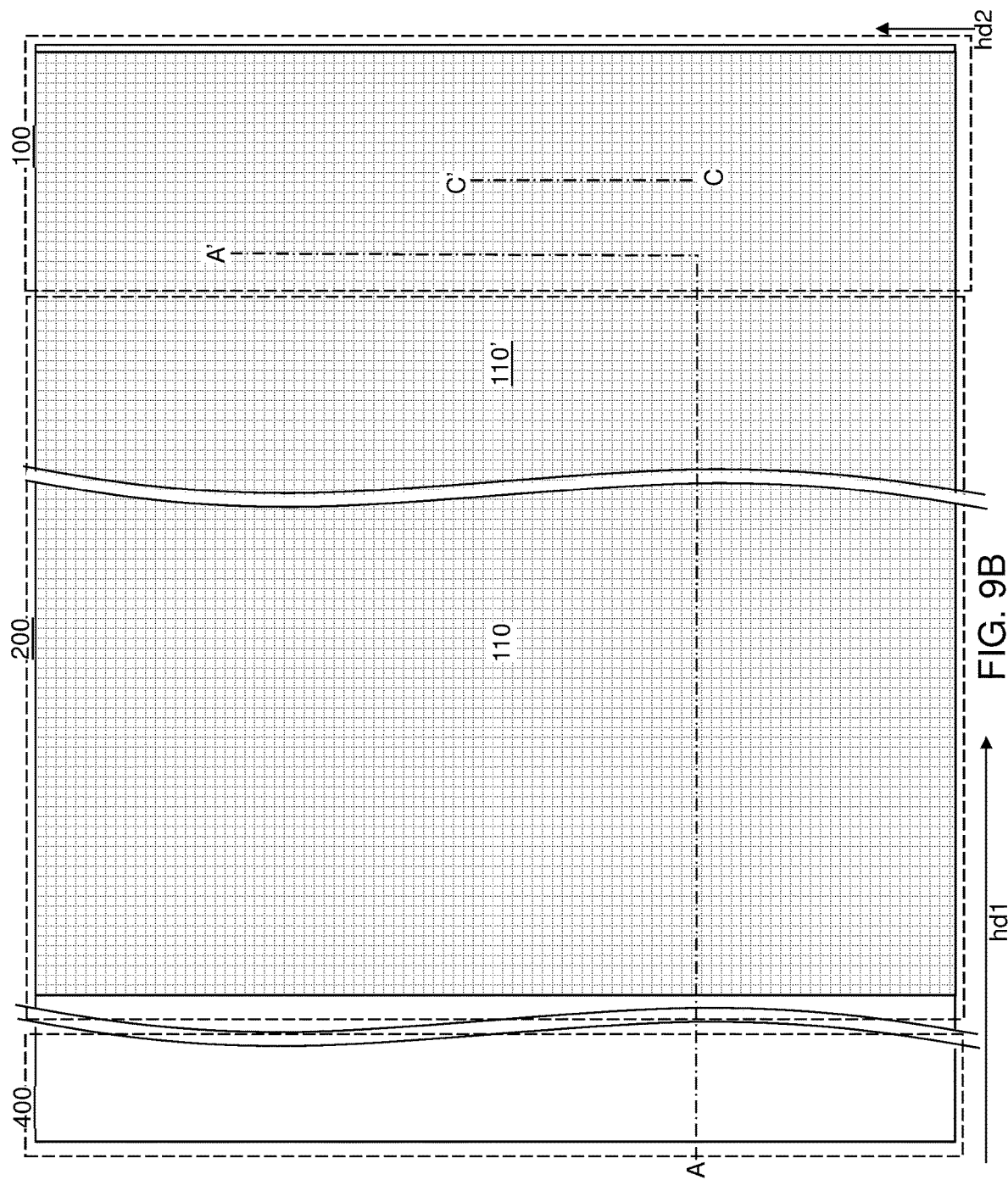
FIG. 9B is a top-down view of the exemplary structure of FIG. 9A. The hinged vertical plane A-A' is the plane of the vertical cross-sectional view of FIG. 9A.
Figure 9C:
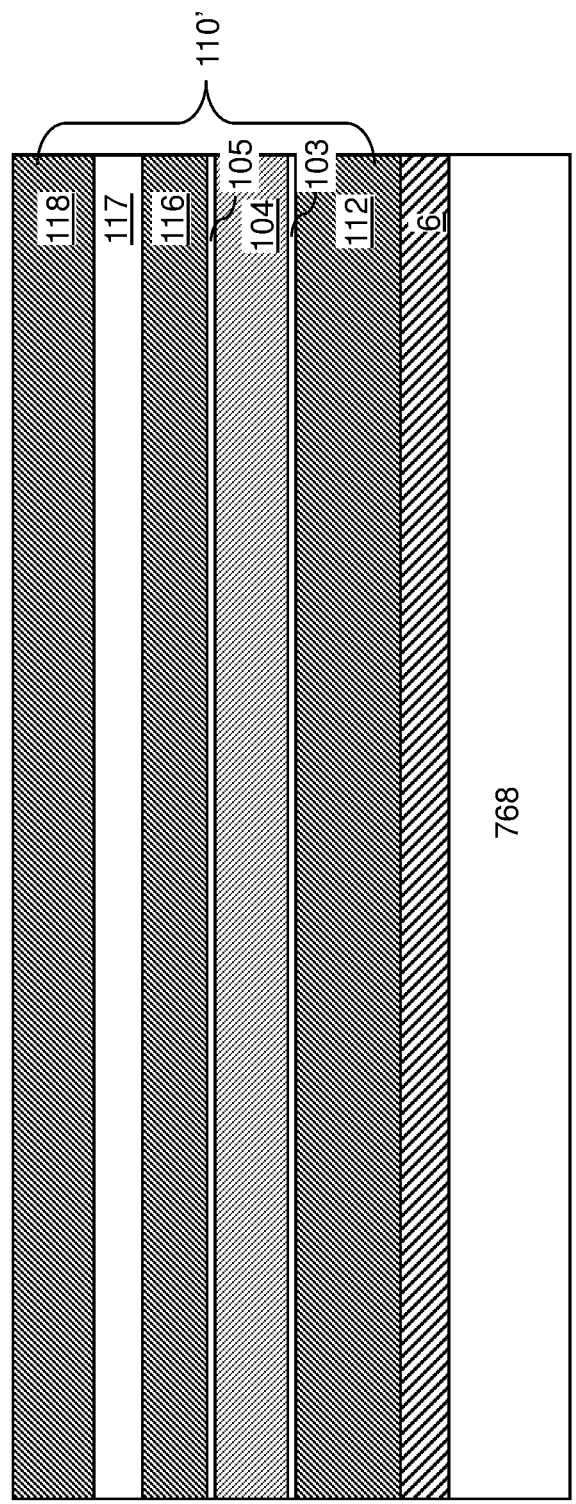
FIG. 9C is a magnified view of the in-process source level material layers along the vertical plane C-C' of FIG. 9B.

Referring to FIGS. 9A-9C, the exemplary structure is illustrated after formation of additional lower-level dielectric material layers 760 embedding lower-level metal interconnect structures 780.

Generally, the shallow trench isolation structures 720 may be formed in an upper portion of the substrate semiconductor layer 9 to provide electrical isolation from other semiconductor devices. The semiconductor devices 710 include the switch arrays (800, 900) described above (e.g., containing transistors 750S and optionally 750E) and additional semiconductor devices that are employed to support operation of a three-dimensional memory array to be subsequently formed. The semiconductor devices 710 may include, for example, field effect transistors including respective transistor active regions 74 (i.e., source regions and drain regions), channel regions 746, and gate structures. The field effect transistors may be arranged in a CMOS configuration. Each gate structure may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, an optional dielectric liner 762 (such as a silicon nitride liner that blocks diffusion of mobile ions and/or apply appropriate stress to underlying structures), the first dielectric material layer or layers 764 that overlie the dielectric liner 762, a silicon nitride layer (e.g., hydrogen diffusion barrier) 766 that overlies the first dielectric material layers 764, and at least one second dielectric layer 768. A bottommost one of the first dielectric material layers 764 can include the contact-level dielectric layer 764 described above.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the semiconductor substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 10:
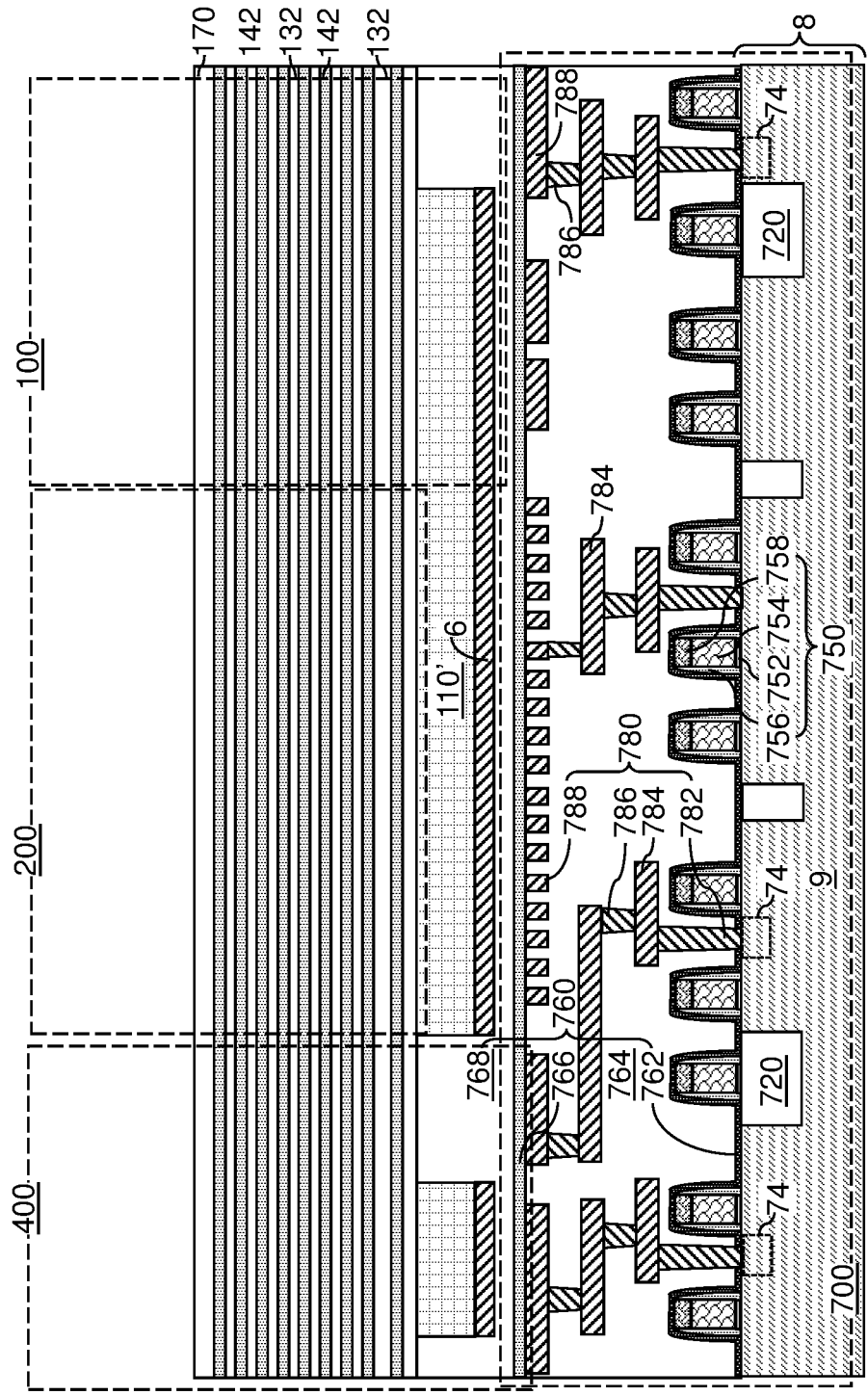
FIG. 10 is a vertical cross-sectional view of the exemplary structure after formation of a first alternating stack of first insulting layers and first spacer material layers according to an embodiment of the present disclosure.

Referring to FIG. 10, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 11:
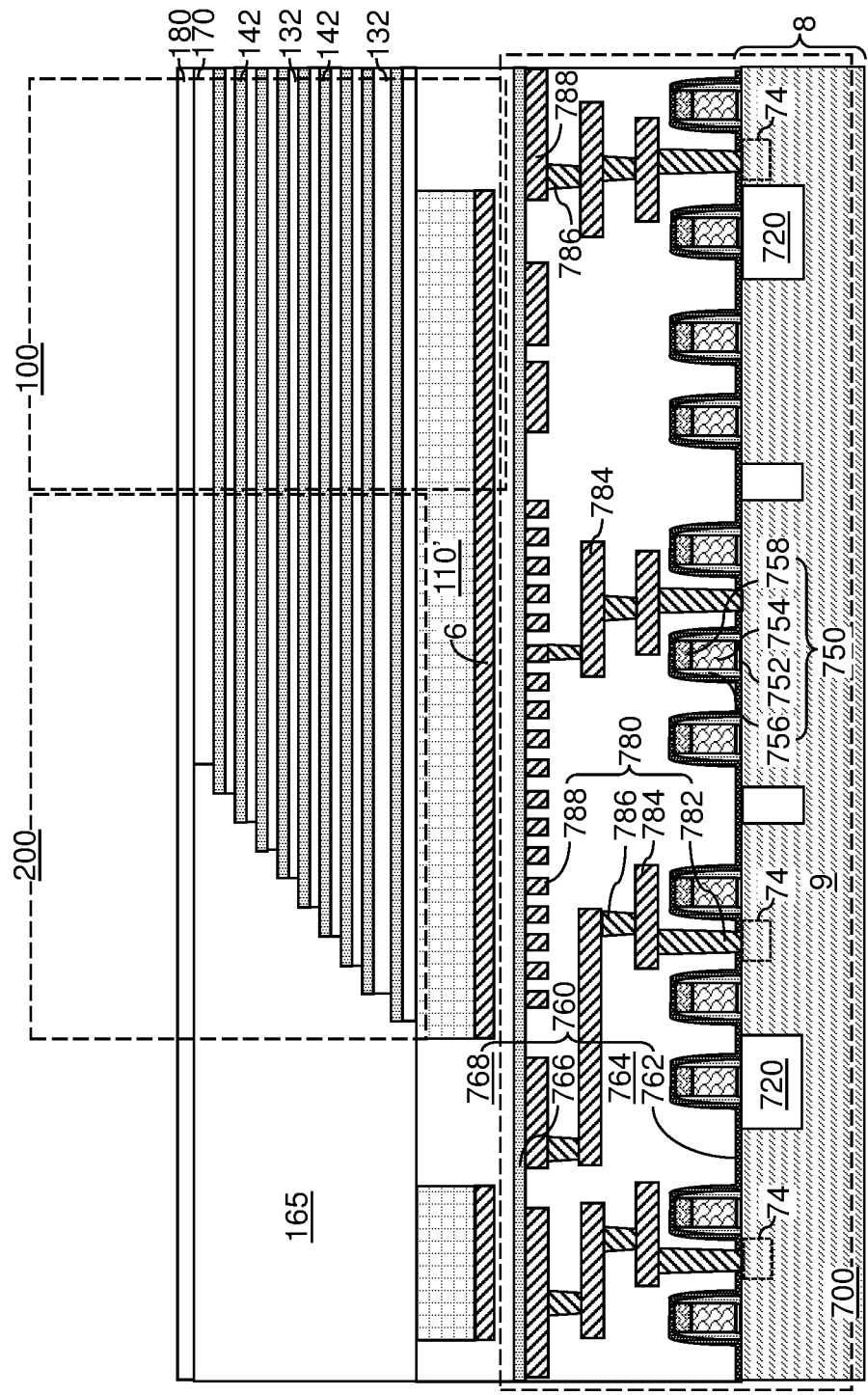
FIG. 11 is a vertical cross-sectional view of the exemplary structure after patterning of first stepped surfaces on the first alternating stack and formation of a first retro-stepped dielectric material portion according to an embodiment of the present disclosure.

Referring to FIG. 11, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 12A:
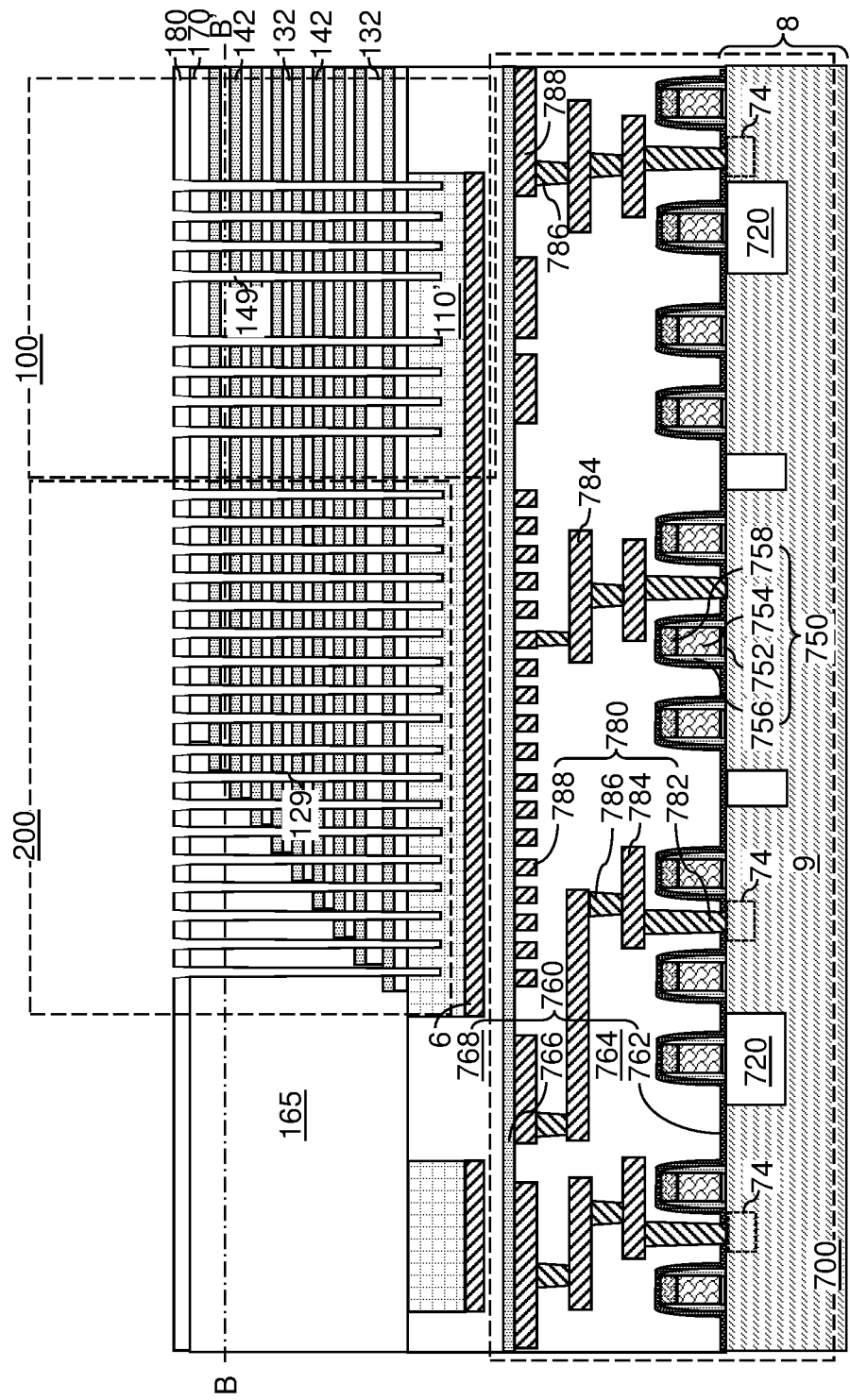
FIG. 12A is a vertical cross-sectional view of the exemplary structure after formation of first-tier memory openings and first-tier support openings according to an embodiment of the present disclosure.
Figure 12B:
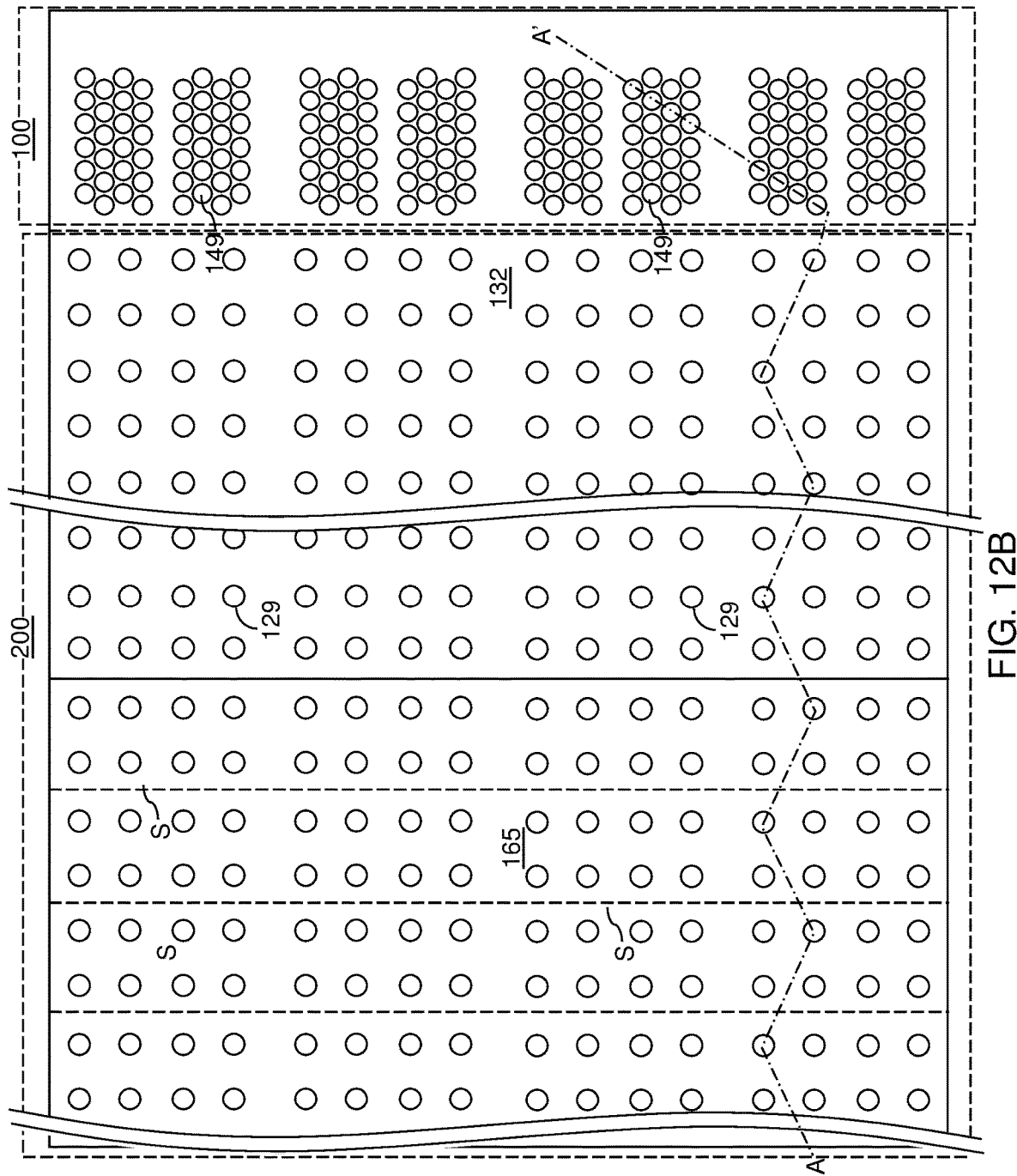
FIG. 12B is a horizontal cross-sectional view of the exemplary structure along the horizontal plane B-B' in FIG. 12A. The zig-zag vertical plane A-A' corresponds to the plane of the vertical cross-sectional view of FIG. 12A.

Referring to FIGS. 12A and 12B, various first-tier openings (149, 129) may be formed through the inter-tier dielectric layer 180 and the first-tier structure (132, 142, 170, 165) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 12B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 13:
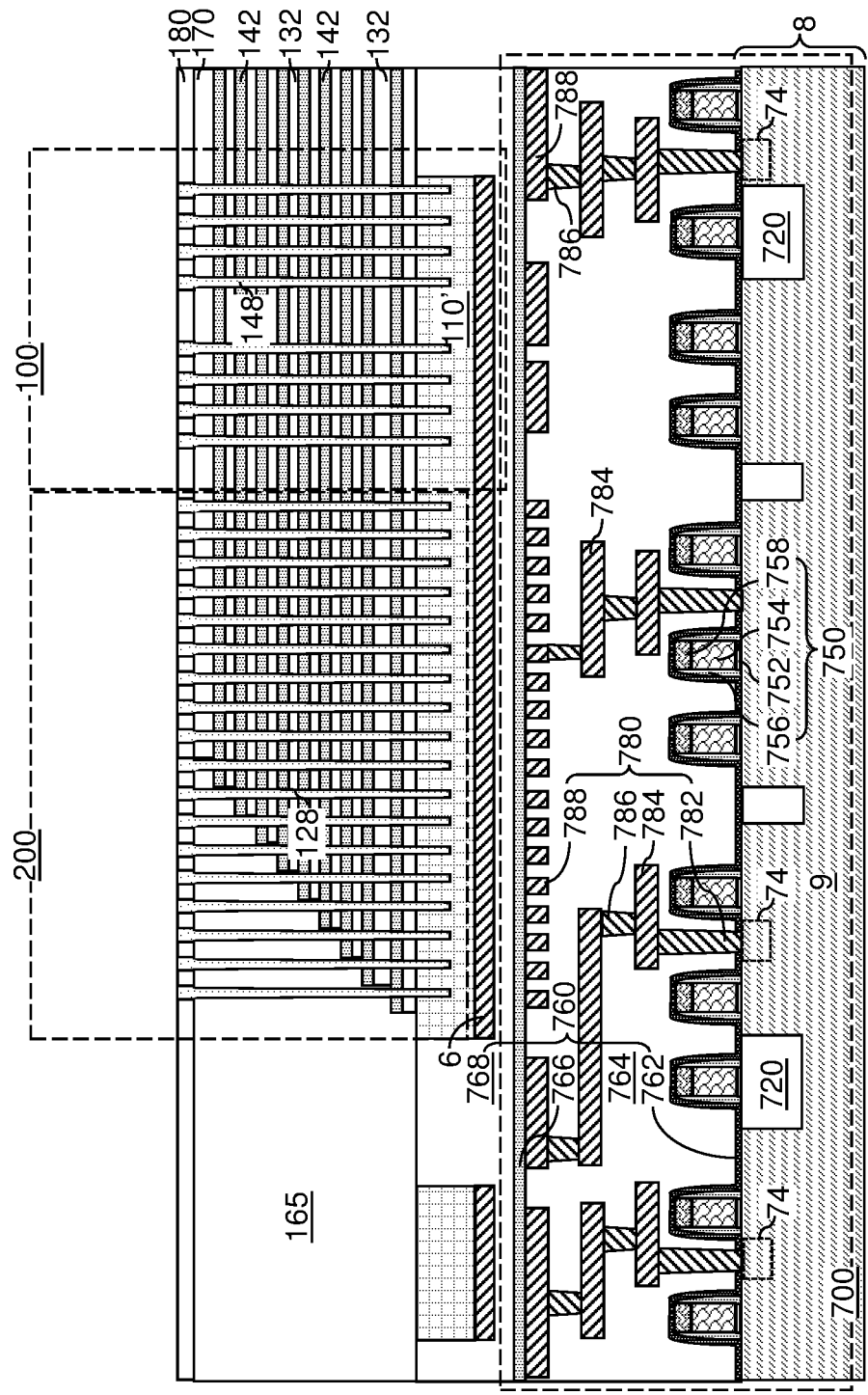
FIG. 13 is a vertical cross-sectional view of the exemplary structure after formation of sacrificial memory opening fill portions and sacrificial support opening fill portions according to an embodiment of the present disclosure.

Referring to FIG. 13, sacrificial first-tier opening fill portions (148, 128) may be formed in the various first-tier openings (149, 129). For example, a sacrificial first-tier fill material is deposited concurrently in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 14:
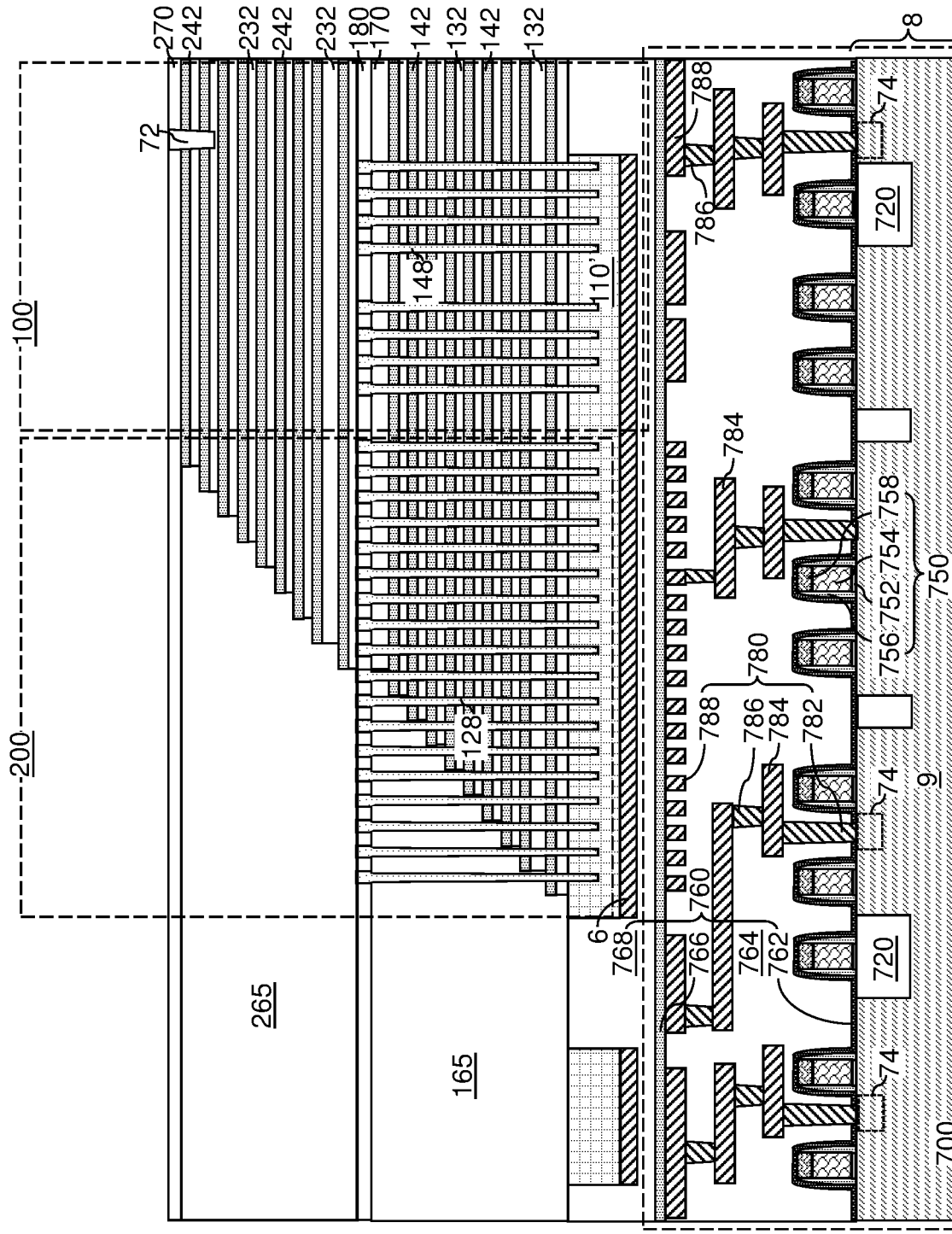
FIG. 14 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 14, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 15A:
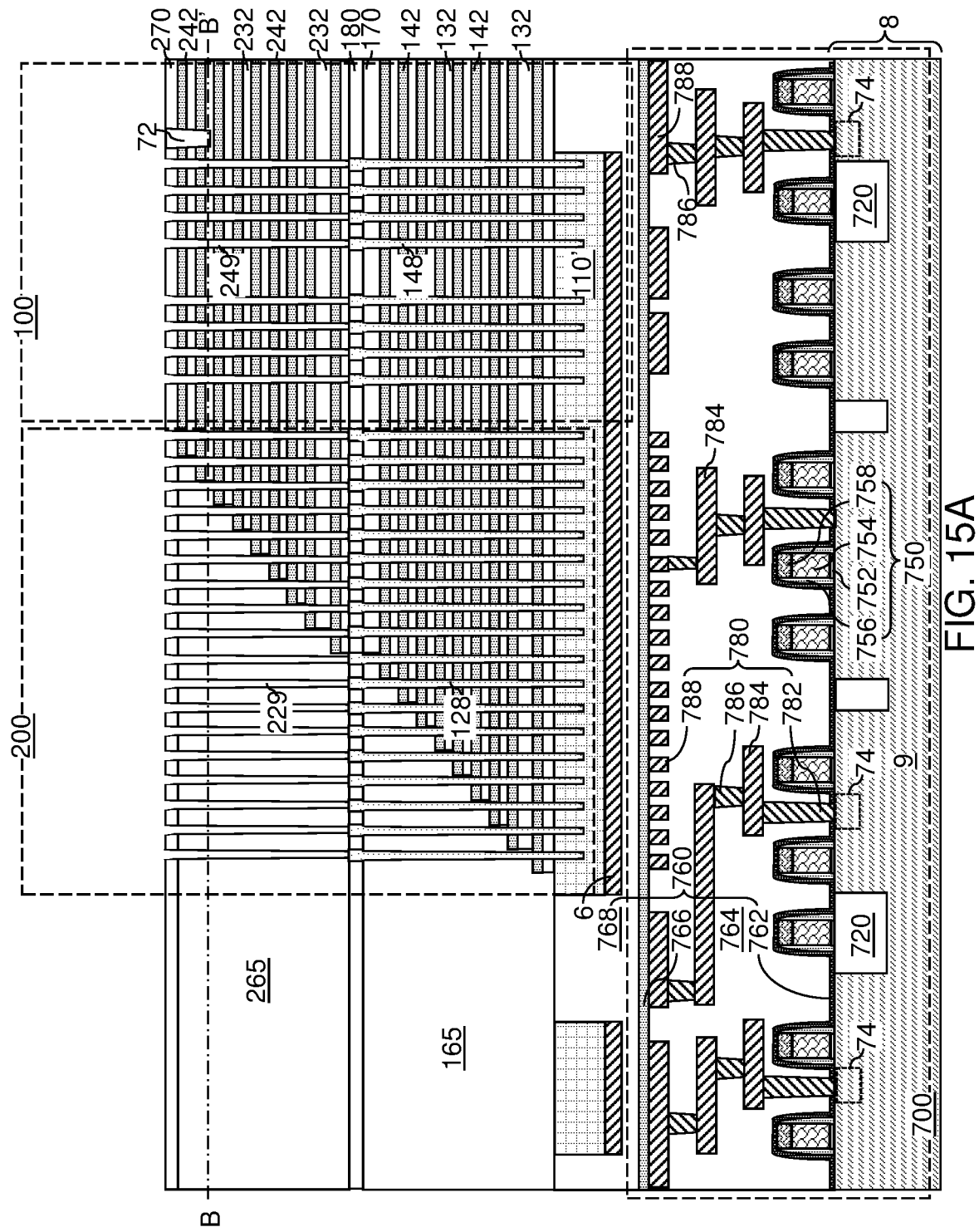
FIG. 15A is a vertical cross-sectional view of the exemplary structure after formation of second-tier memory openings and second-tier support openings according to an embodiment of the present disclosure.
Figure 15B:
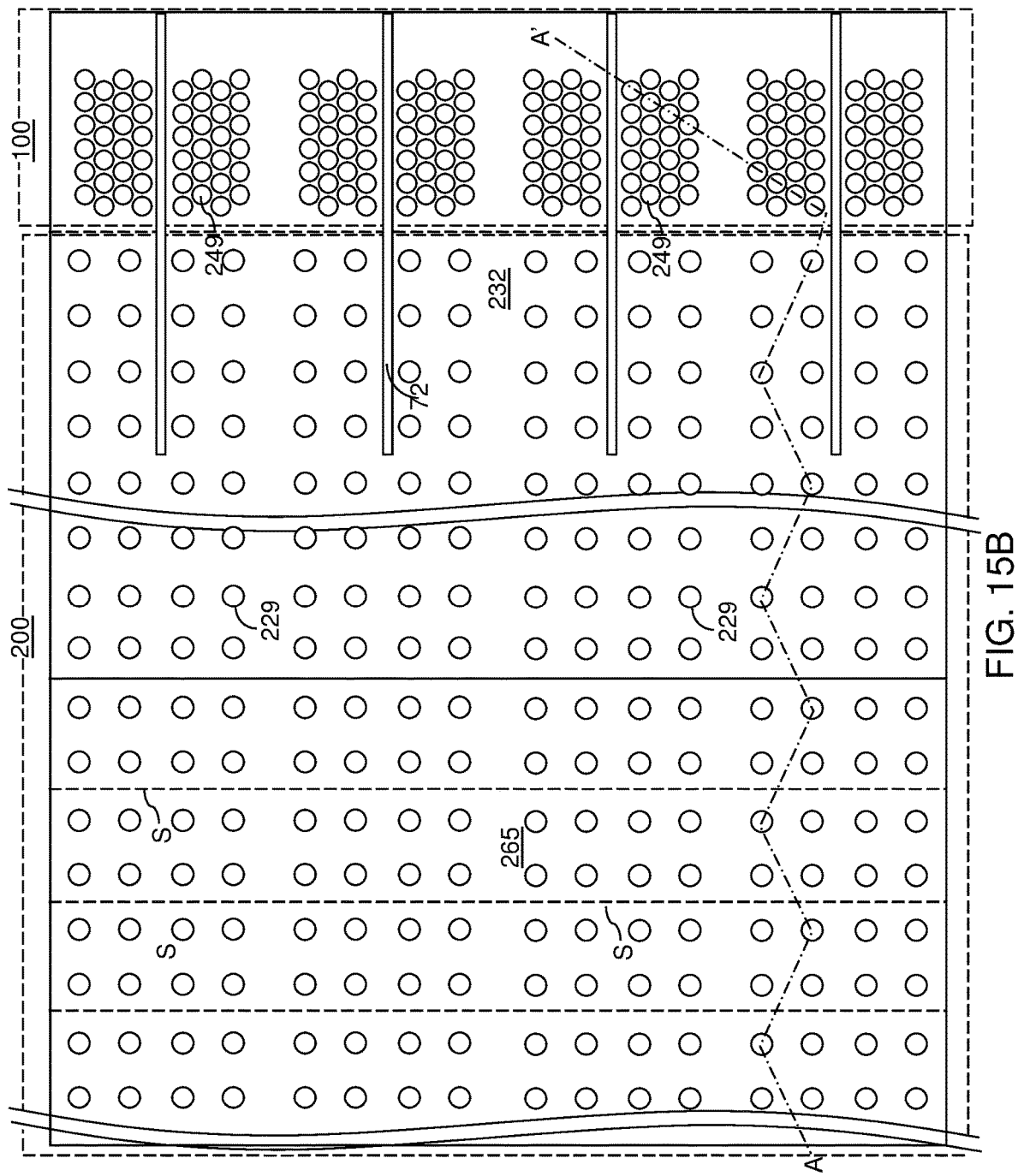
FIG. 15B is a horizontal cross-sectional view of the exemplary structure along the horizontal plane B-B' of FIG. 15A. The hinged vertical plane A-A' corresponds to the plane of the vertical cross-sectional view of FIG. 15A.

Referring to FIGS. 15A and 15B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 15B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 16:
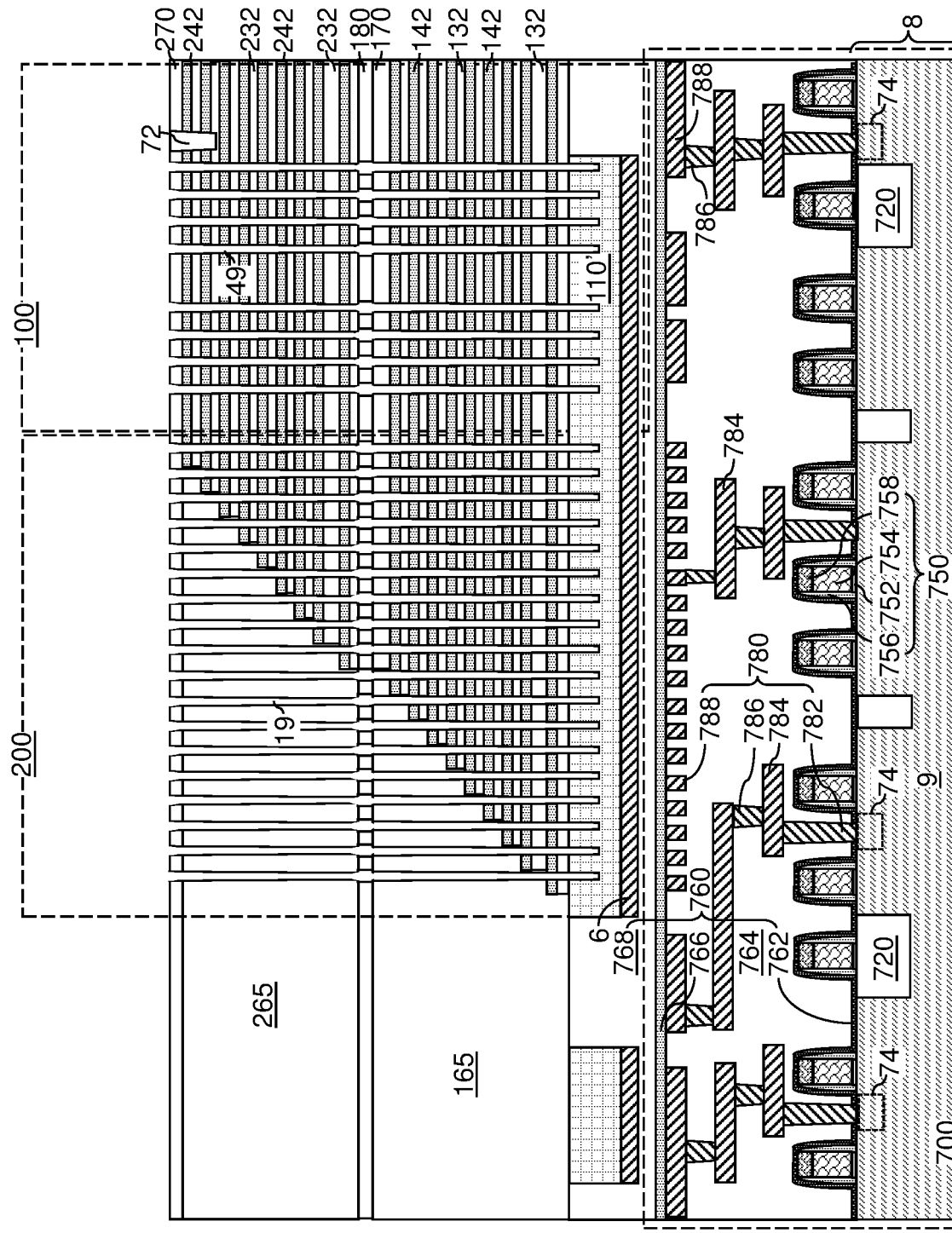
FIG. 16 is a vertical cross-sectional view of the exemplary structure after formation of inter-tier memory openings and inter-tier support openings according to an embodiment of the present disclosure.

Referring to FIG. 16, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 17A-17D provide sequential cross-sectional views of a memory opening 49 during formation of a memory opening fill structure. The same structural change occurs in each of the memory openings 49 and the support openings 19.

Referring to FIG. 17A, a memory opening 49 in the first exemplary device structure of FIG. 16 is illustrated. The memory opening 49 extends through the first-tier structure and the second-tier structure.

Referring to FIG. 17B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 17C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 17D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 18:
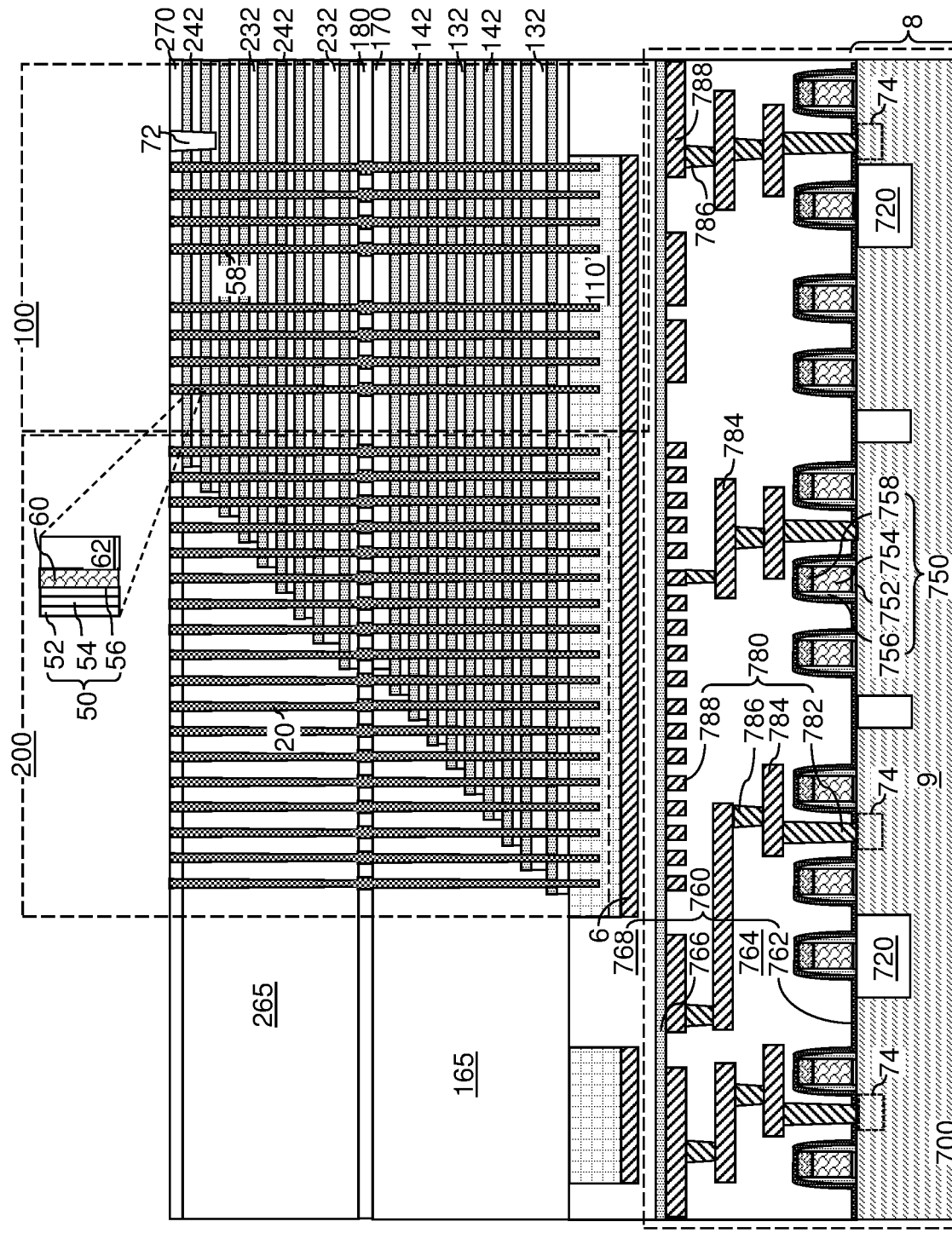
FIG. 18 is a vertical cross-sectional view of the exemplary structure after formation of memory opening fill structures and support pillar structures according to an embodiment of the present disclosure.

Referring to FIG. 18, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 19A:
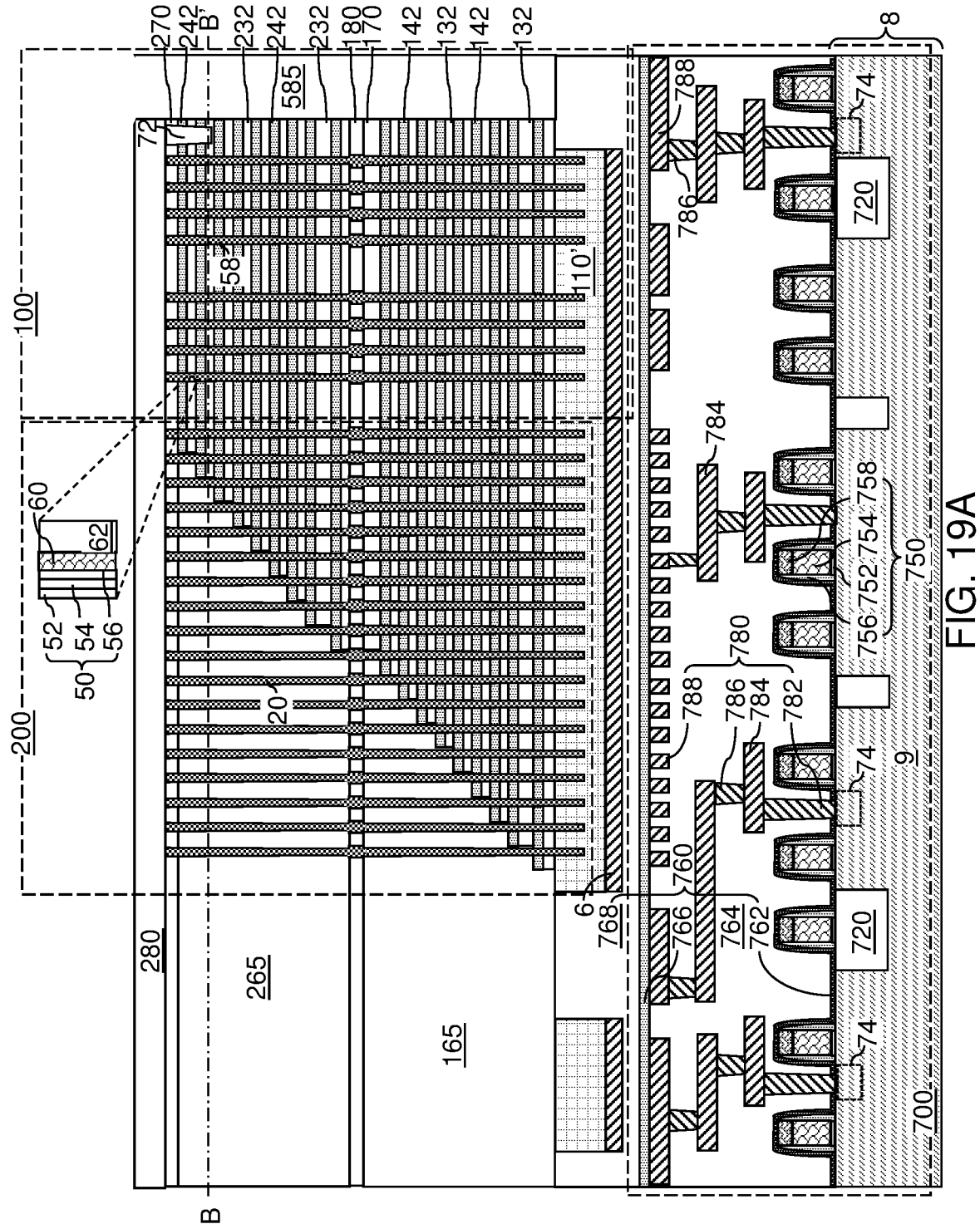
FIG. 19A is a vertical cross-sectional view of the exemplary structure after formation of pillar cavities according to an embodiment of the present disclosure.
Figure 19B:
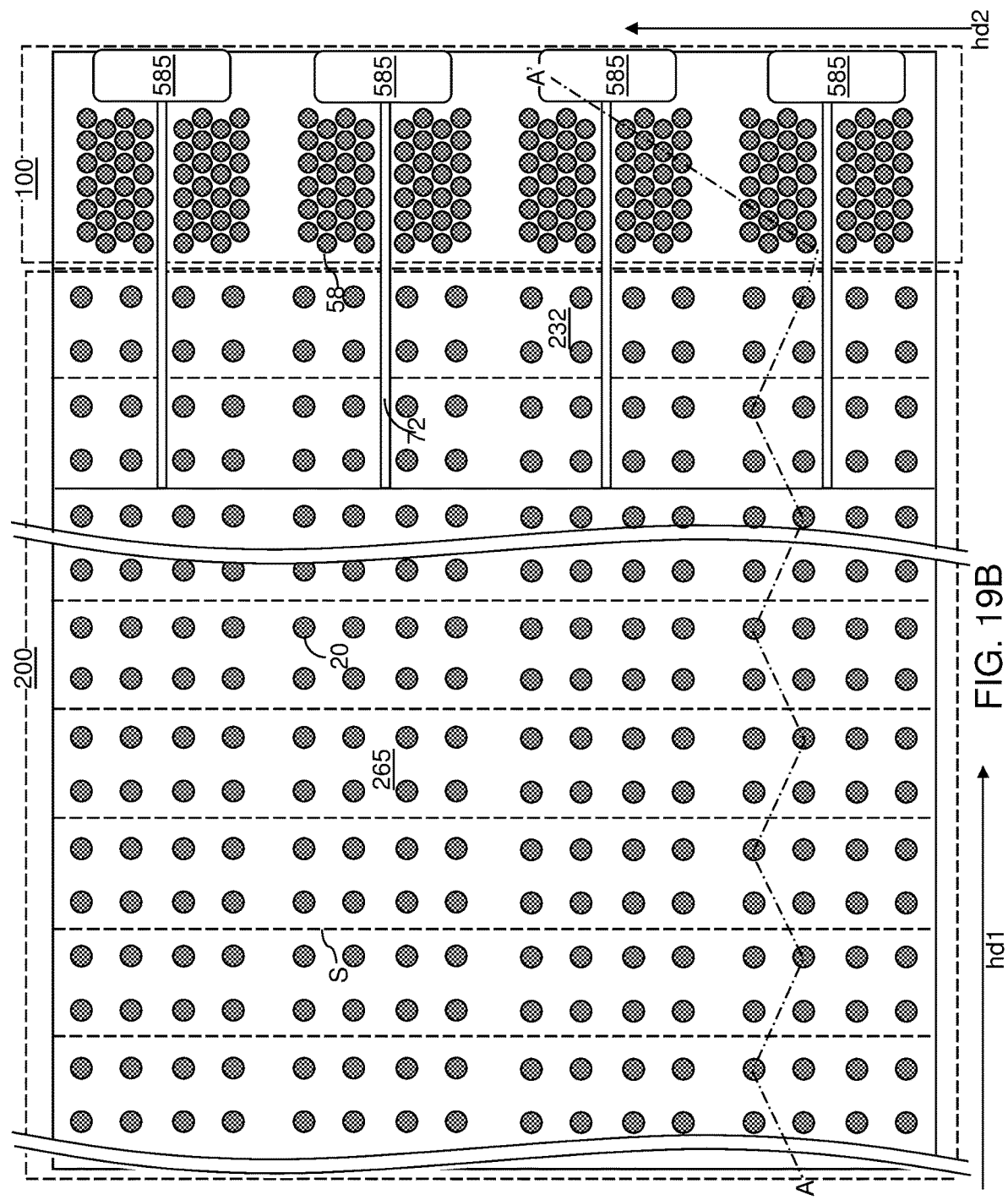
FIG. 19B is a horizontal cross-sectional view of the exemplary structure along the horizontal plane B-B' of FIG. 19A. The hinged vertical plane A-A' corresponds to the plane of the vertical cross-sectional view of FIG. 19A.

Referring to FIGS. 19A and 19B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact-level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 20:
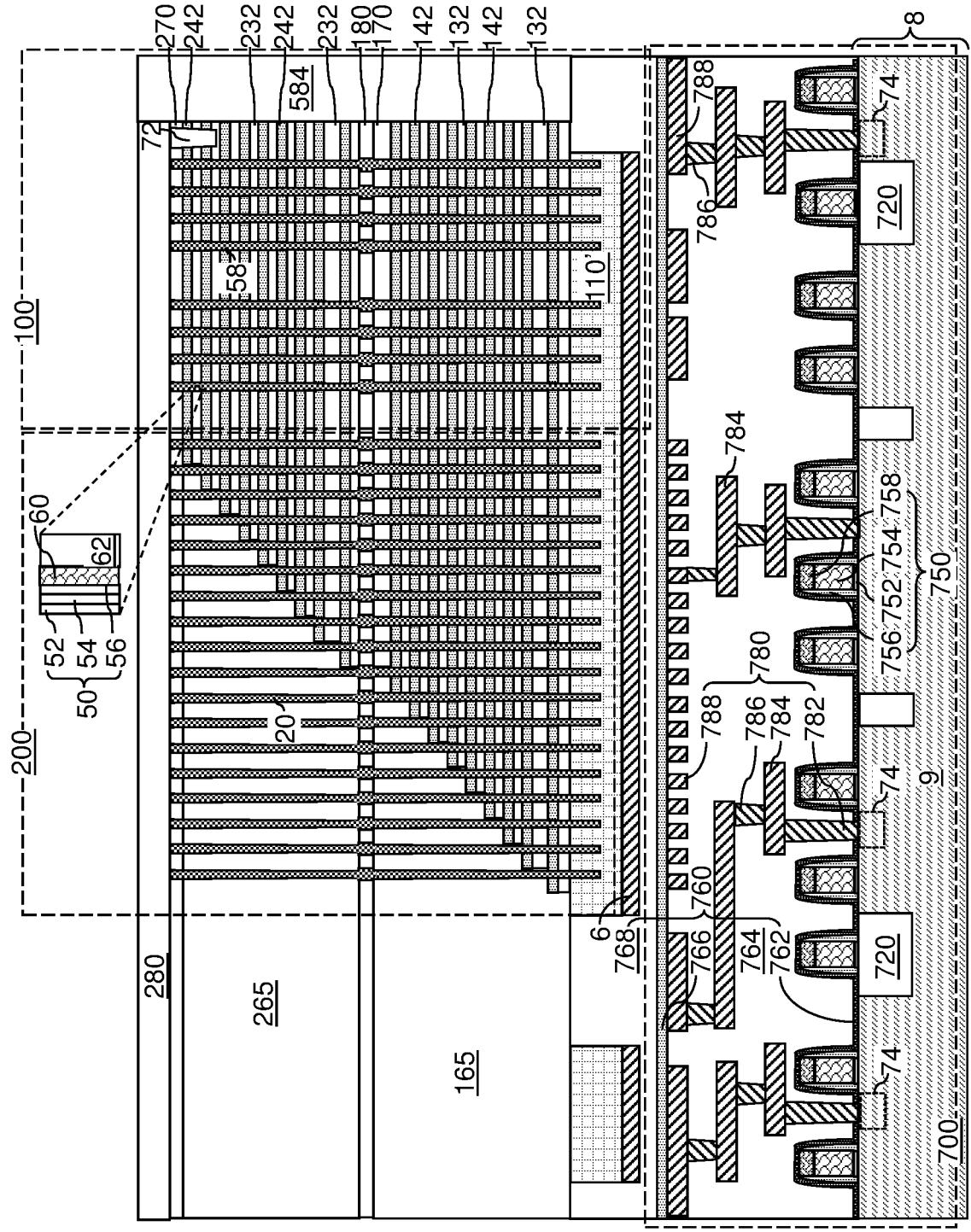
FIG. 20 is a vertical cross-sectional view of the exemplary structure after formation of dielectric pillar structures according to an embodiment of the present disclosure.

Referring to FIG. 20, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584.

Figure 21A:
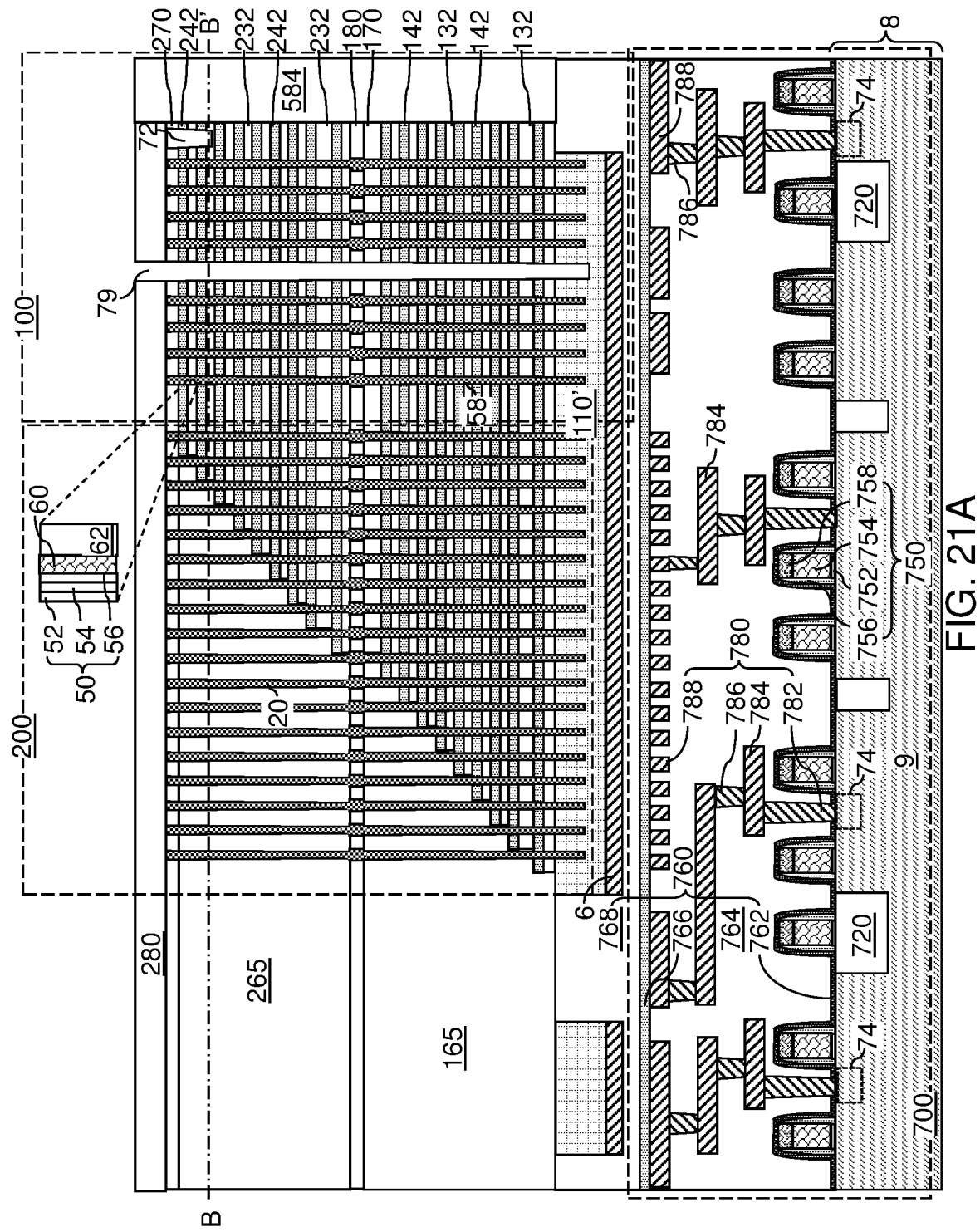
FIG. 21A is a vertical cross-sectional view of the exemplary structure after formation of a first contact-level dielectric layer and backside trenches according to an embodiment of the present disclosure.
Figure 21B:
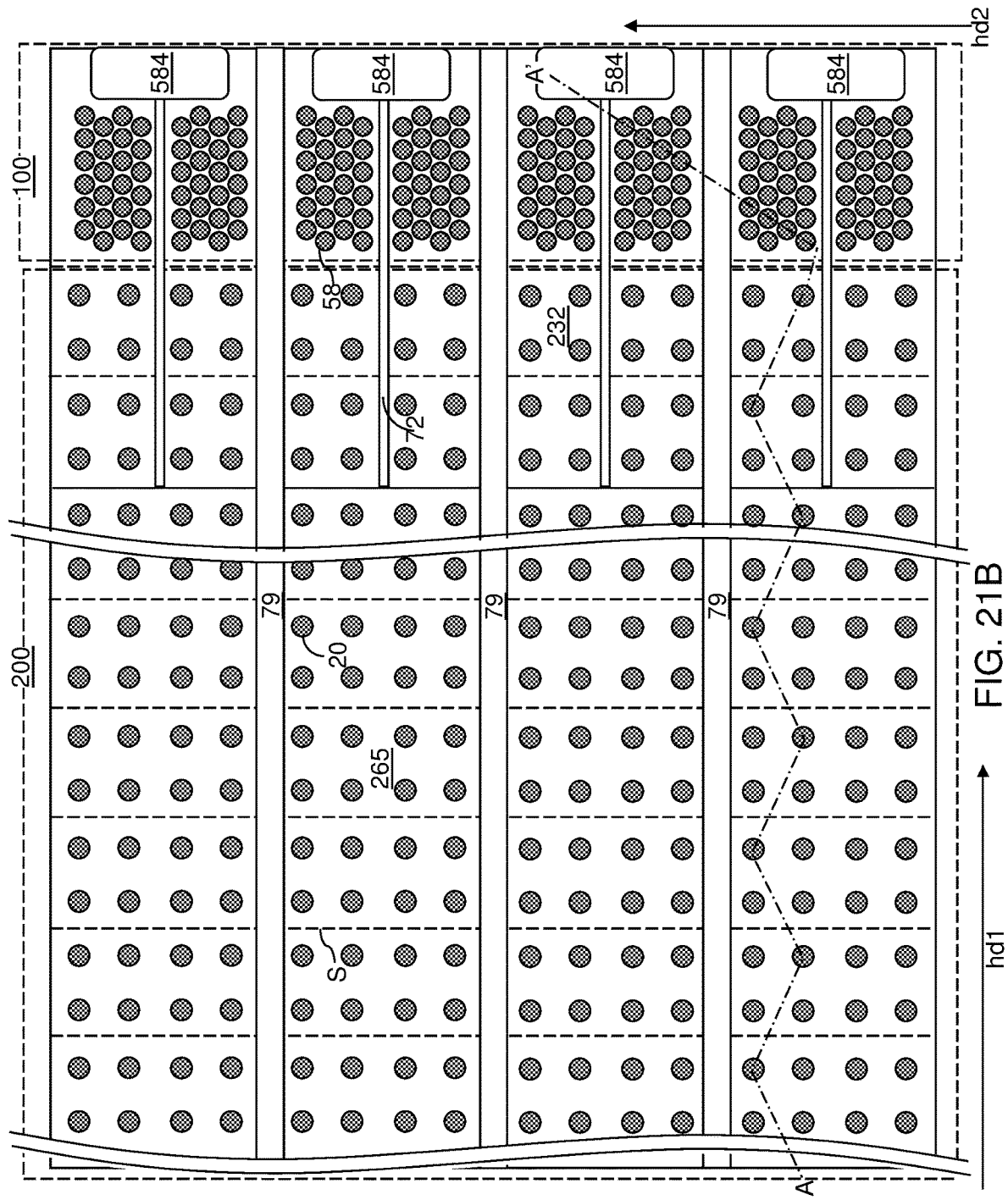
FIG. 21B is a horizontal cross-sectional view of the exemplary structure along the horizontal plane B-B' of FIG. 21A. The hinged vertical plane A-A' corresponds to the plane of the vertical cross-sectional view of FIG. 21A.

Referring to FIGS. 21A and 21B, a photoresist layer may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact-level dielectric layer 280, the second-tier structure (232, 242, 270, 265, 72), and the first-tier structure (132, 142, 170, 165), and into the in-process source-level material layers 110'. Portions of the first contact-level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Figure 22:
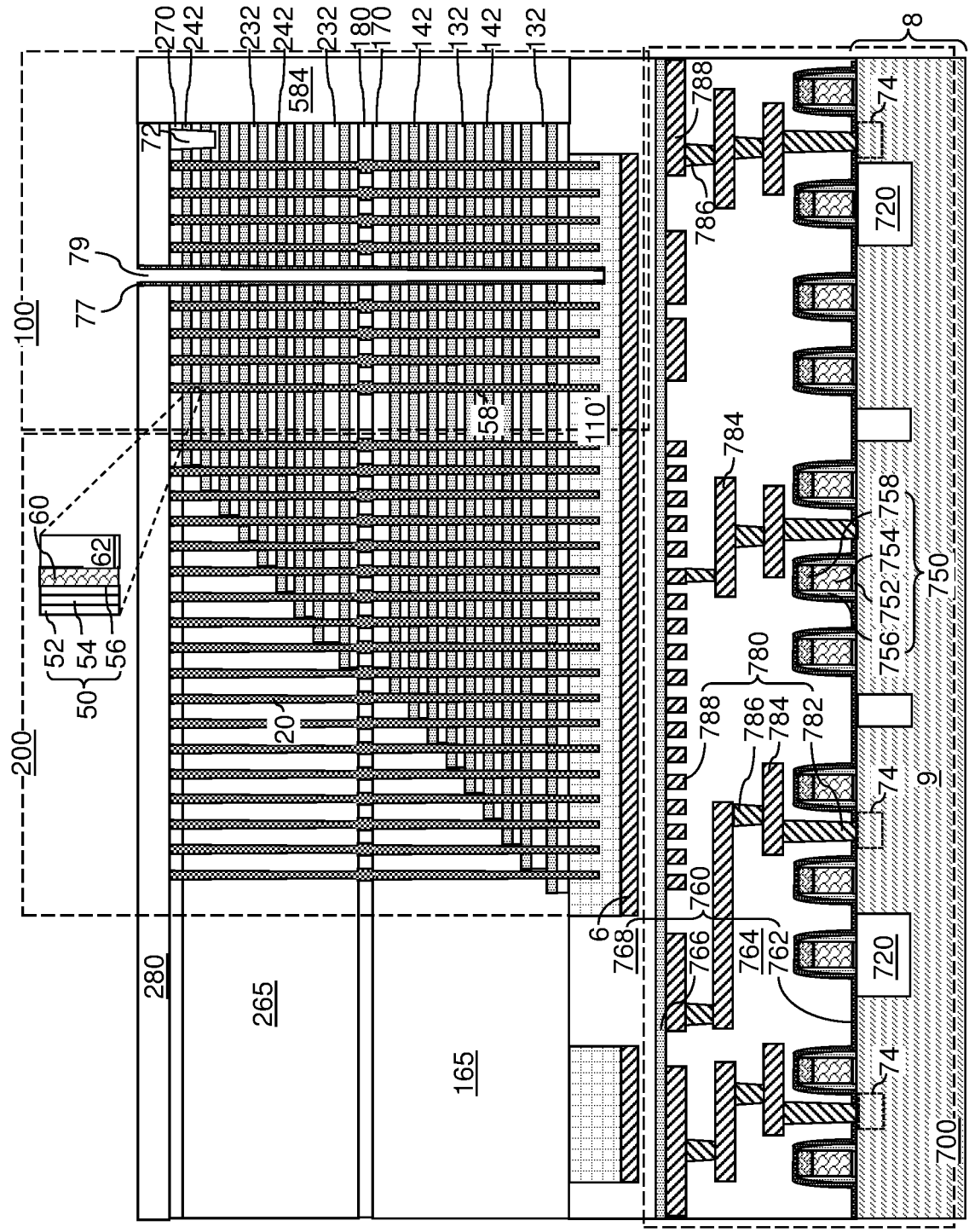
FIG. 22 is a vertical cross-sectional view of the exemplary structure after formation of backside trench spacers according to an embodiment of the present disclosure.
Figure 23A:
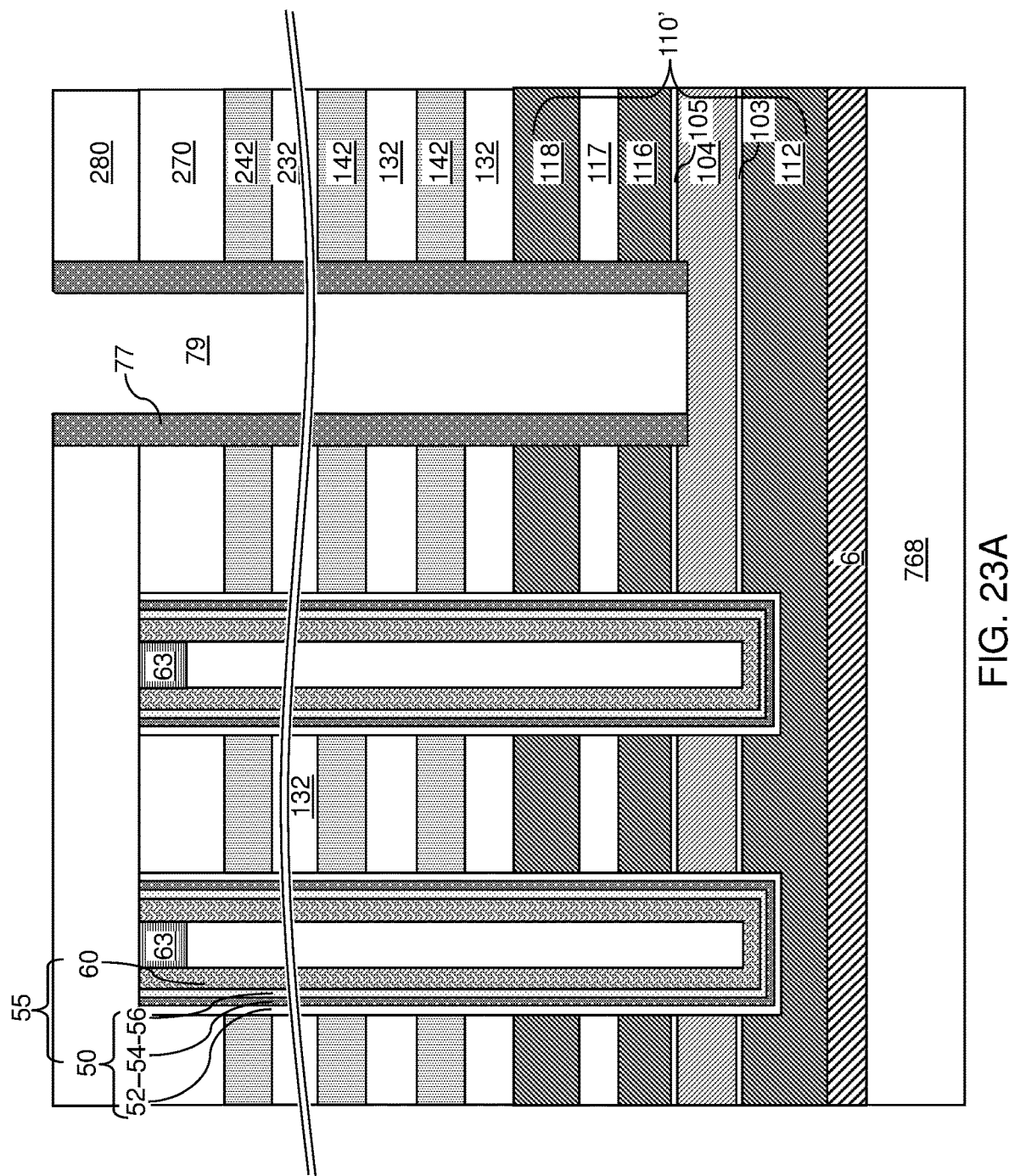
FIGS. 23A-23E illustrate sequential vertical cross-sectional views of memory opening fill structures and a backside trench during formation of source-level material layers according to an embodiment of the present disclosure.

Referring to FIGS. 22 and 23A, a backside trench spacer 77 may be formed on sidewalls of each backside trench 79. For example, a conformal spacer material layer may be deposited in the backside trenches 79 and over the first contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 23B:
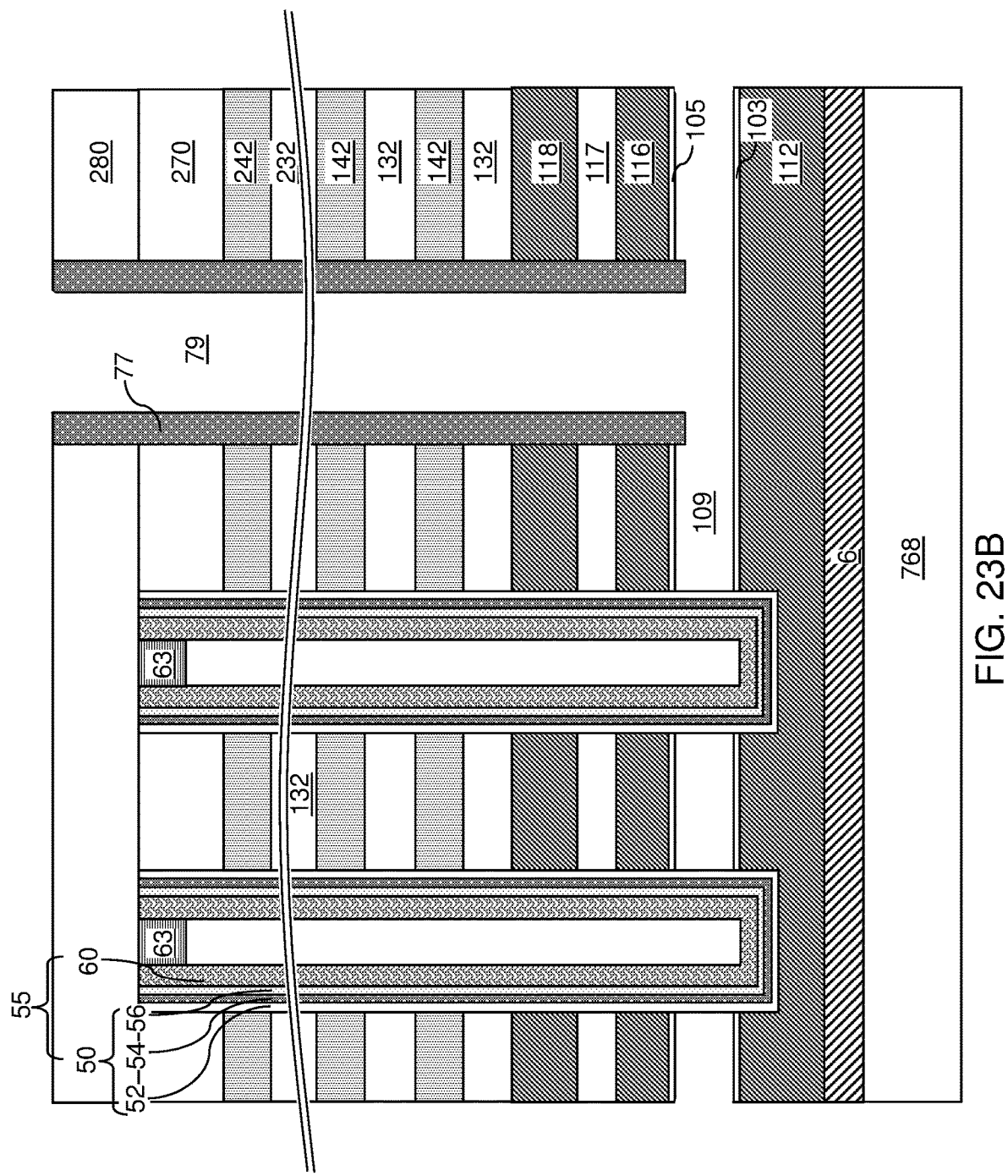

Referring to FIG. 23B, an etchant that etches the material of the source-level sacrificial layer 104 selective to the materials of the first alternating stack (132, 142), the second alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 23C:
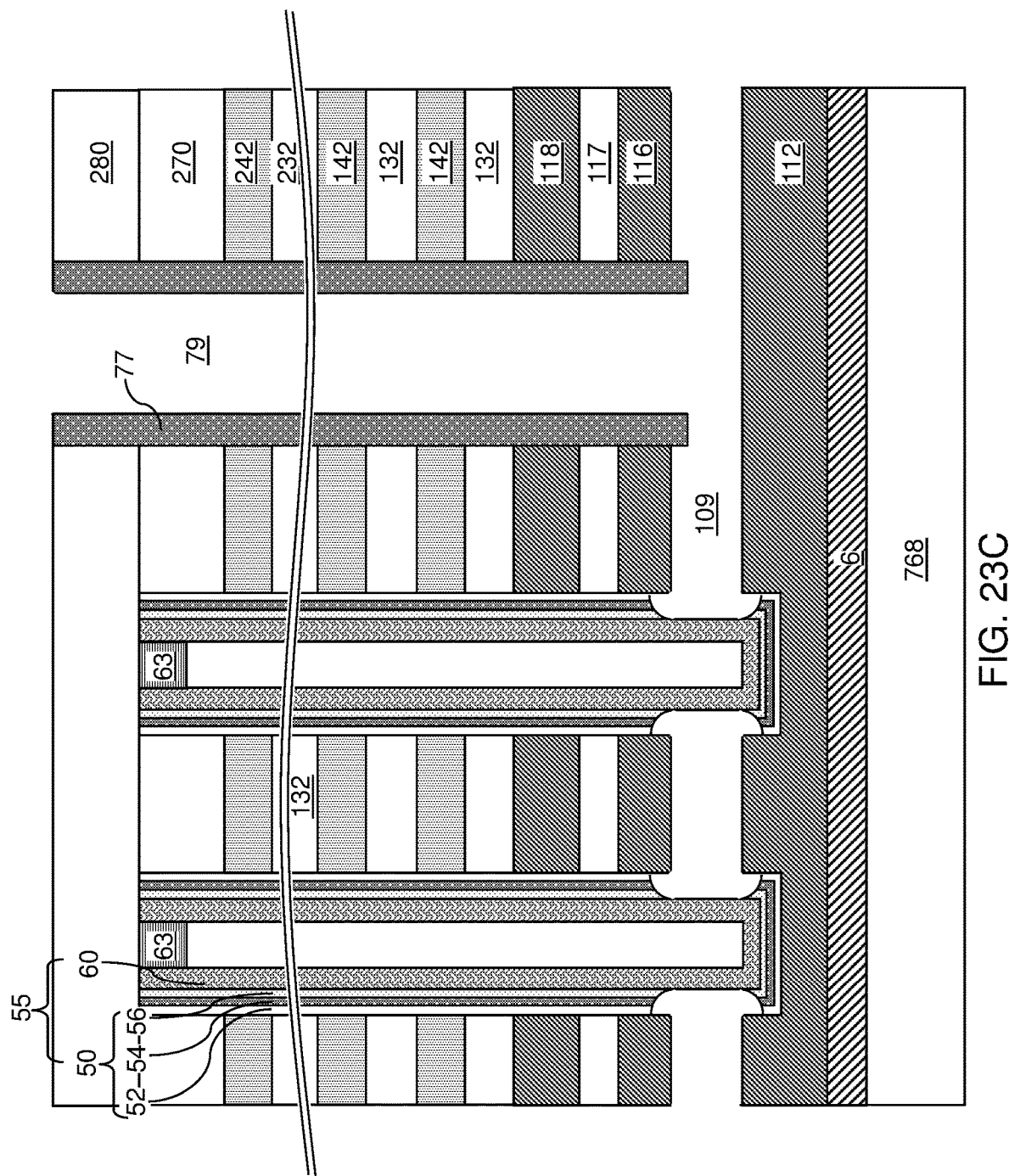

Referring to FIG. 23C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 23D:
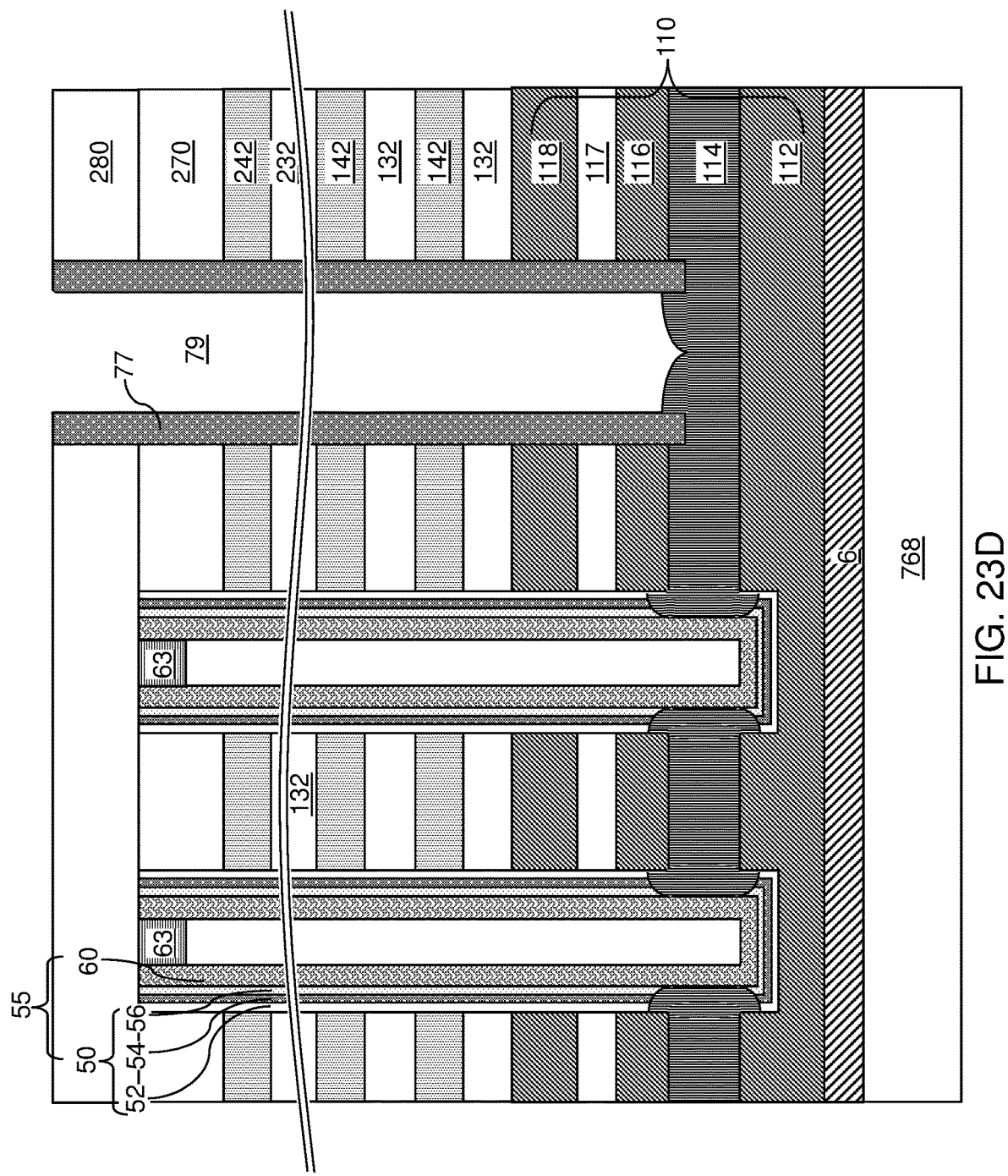

Referring to FIG. 23D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 23E:
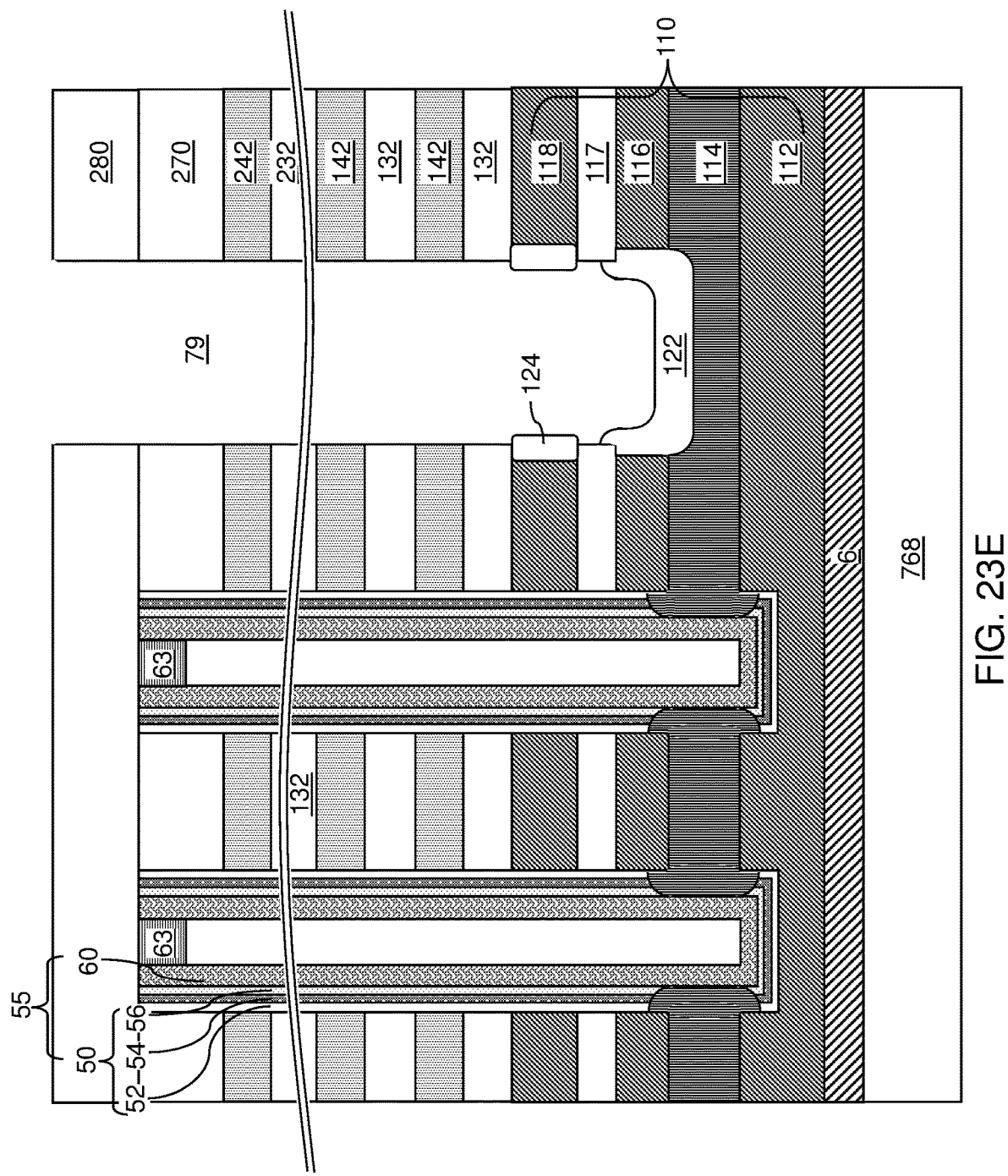
Figure 24:
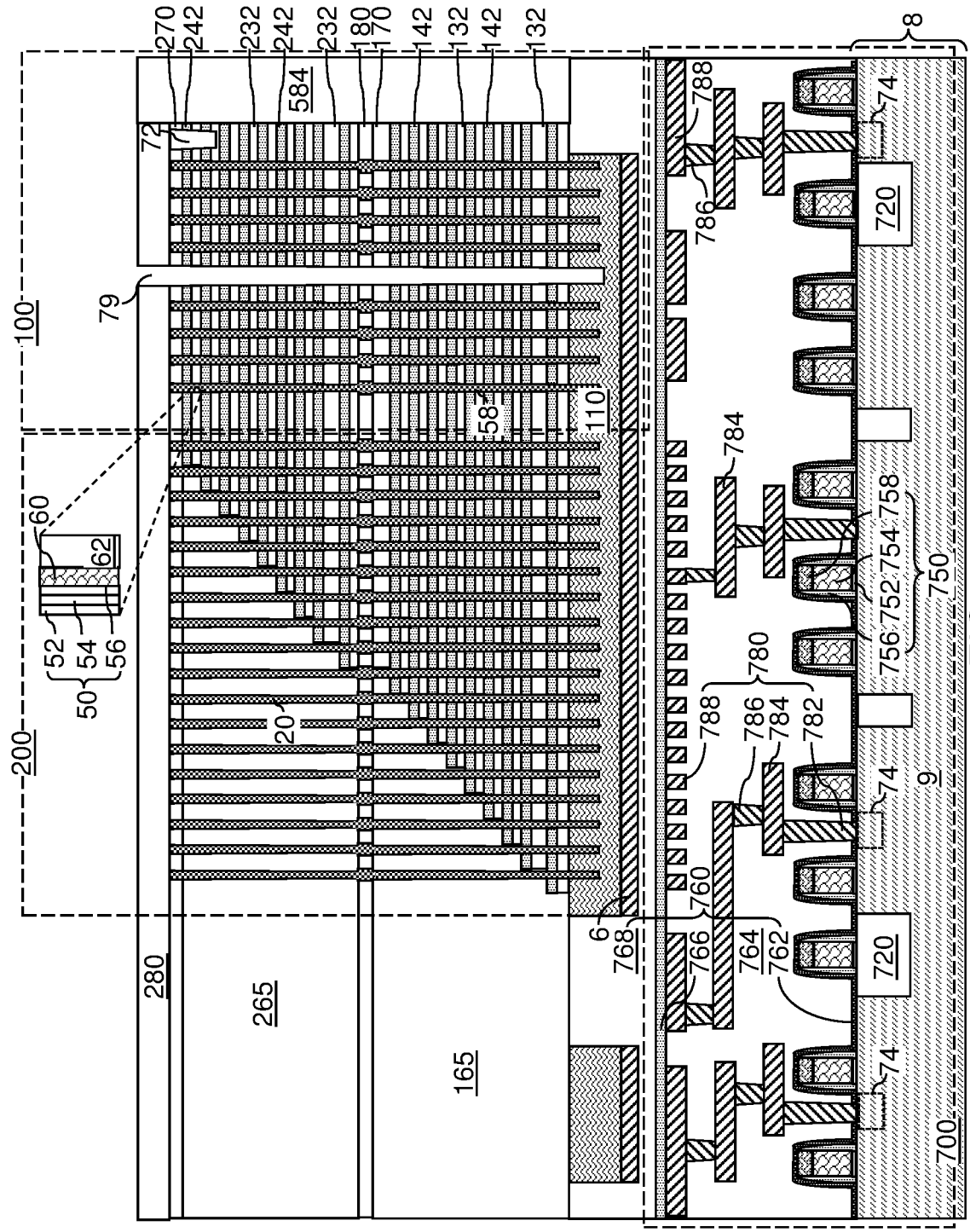
FIG. 24 is a vertical cross-sectional view of the exemplary structure after formation of source-level material layers according to an embodiment of the present disclosure.

Referring to FIGS. 23E and 24, the backside trench spacers 77 may be removed selective to the insulating layers (132, 232), the first and second insulating cap layers (170, 270), the first contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the first contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 25:
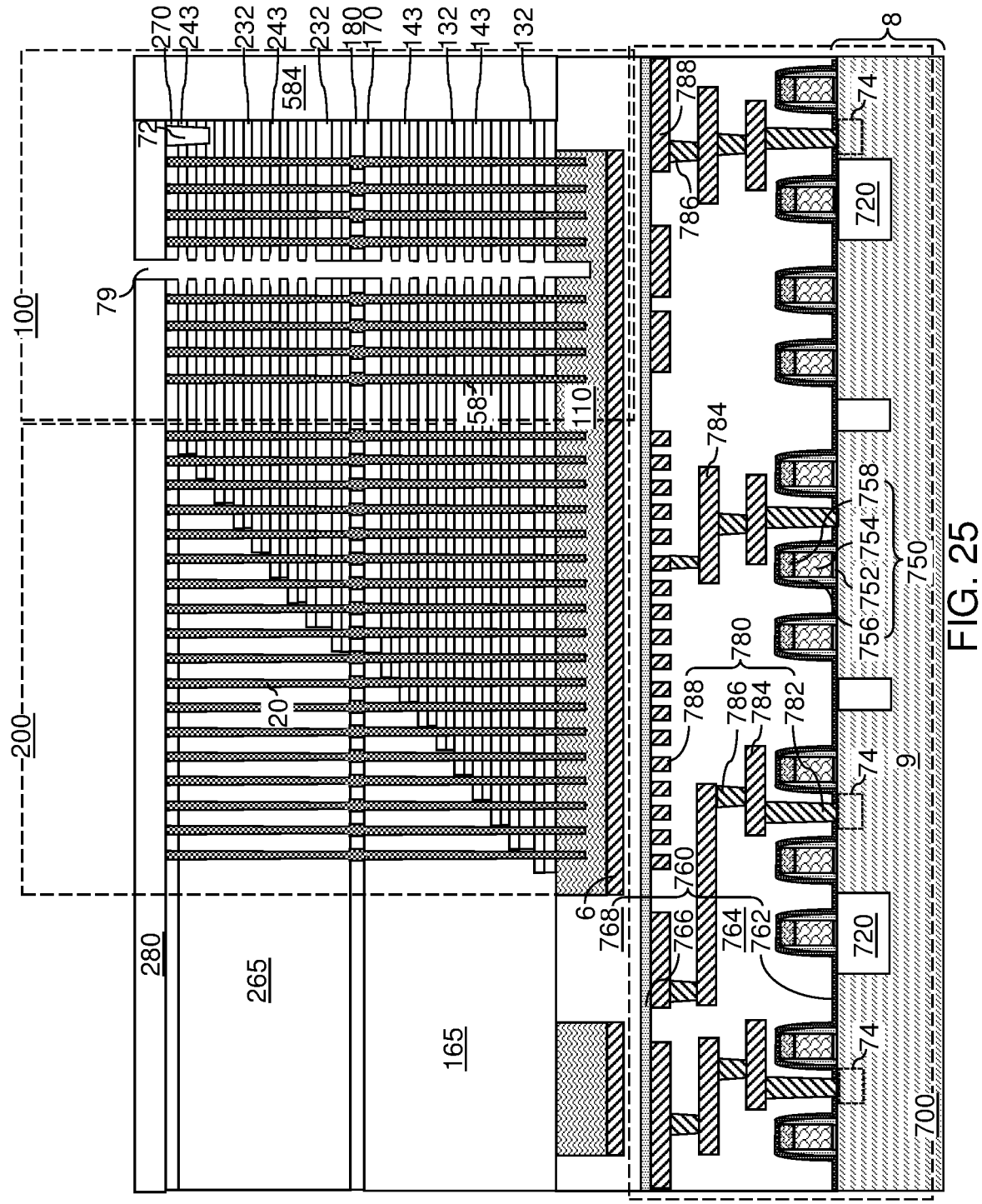
FIG. 25 is a vertical cross-sectional view of the exemplary structure after formation of backside recesses according to an embodiment of the present disclosure.

Referring to FIG. 25, the sacrificial material layers (142, 242) are may be removed selective to the insulating layers (132, 232), the first and second insulating cap layers (170, 270), the first contact-level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 26A:
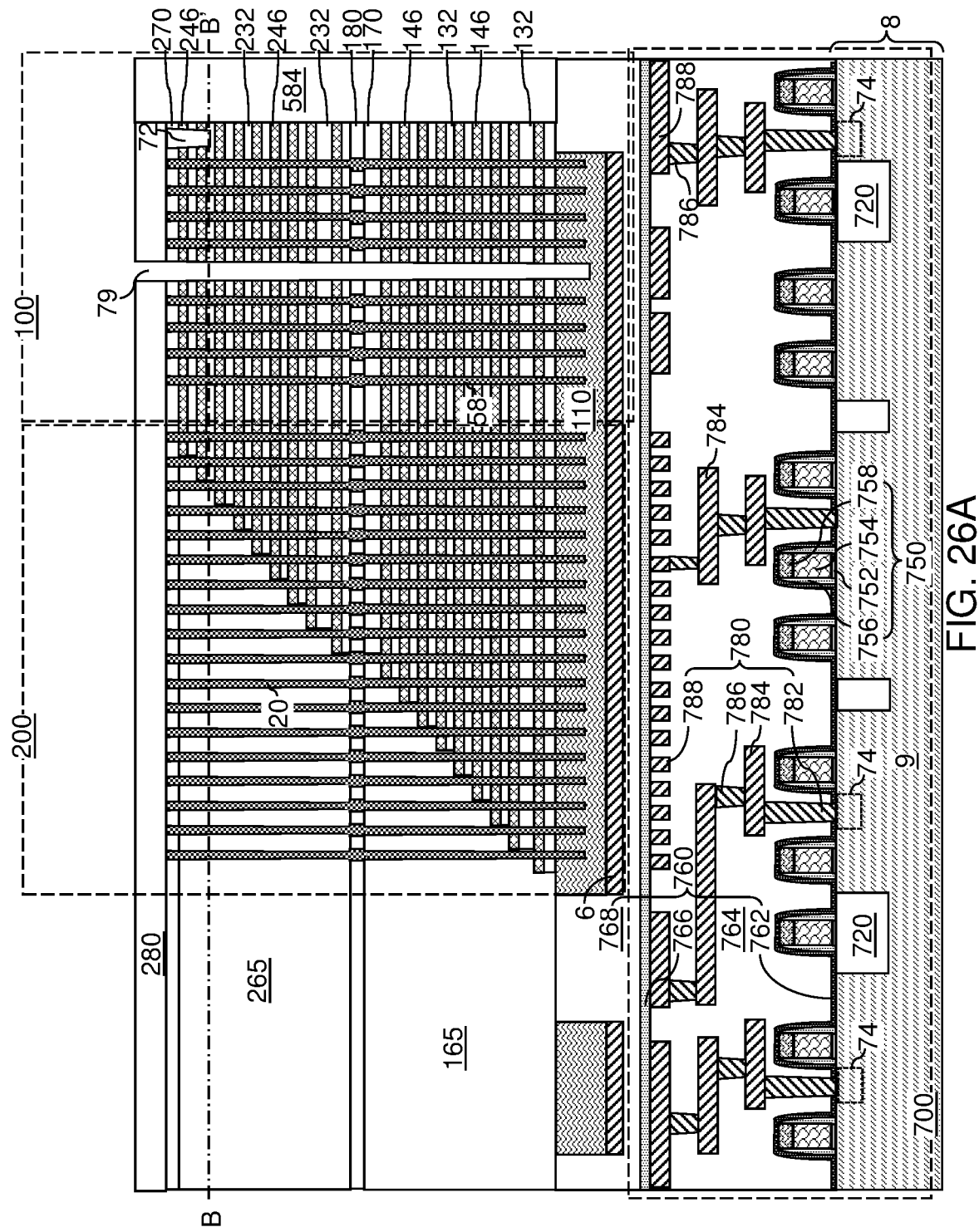
FIG. 26A is a vertical cross-sectional view of the exemplary structure after formation of electrically conductive layers according to an embodiment of the present disclosure.
Figure 26B:
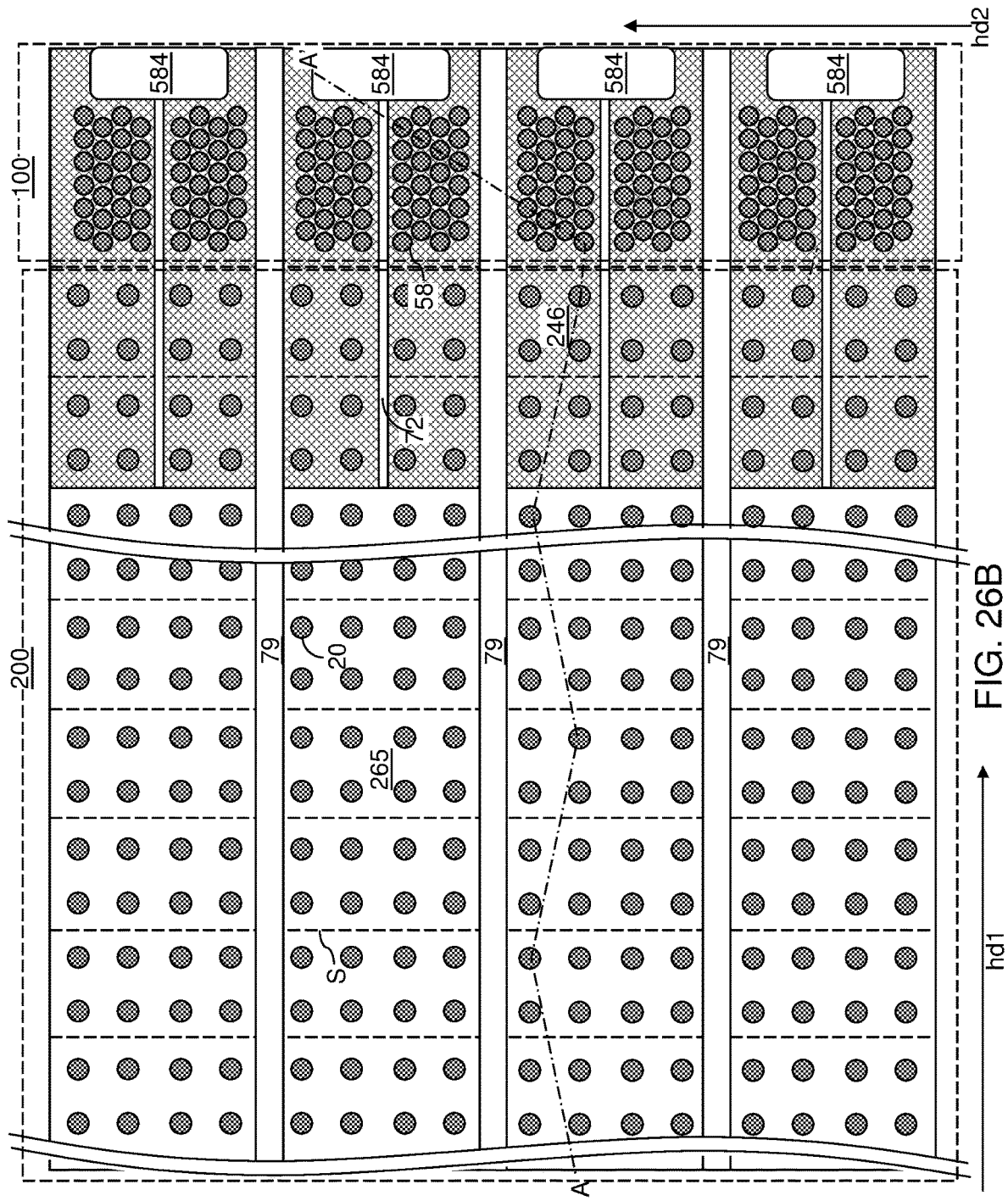
FIG. 26B is a horizontal cross-sectional view of the exemplary structure along the horizontal plane B-B' of FIG. 26A. The hinged vertical plane A-A' corresponds to the plane of the vertical cross-sectional view of FIG. 26A.

Referring to FIGS. 26A and 26B, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiments, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Figure 27A:
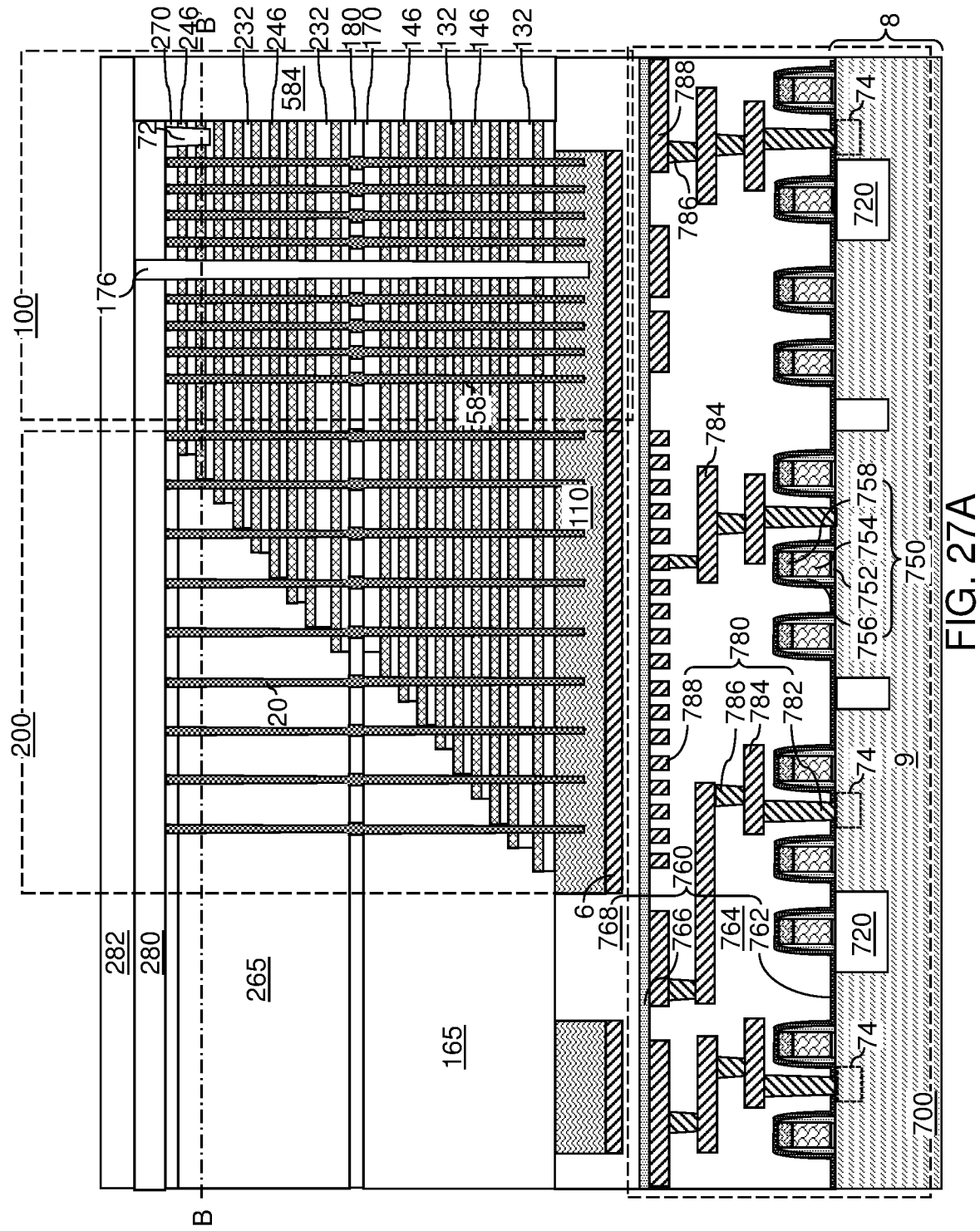
FIG. 27A is a vertical cross-sectional view of the exemplary structure after formation of backside trench fill structures in the backside trenches according to an embodiment of the present disclosure.
Figure 27B:
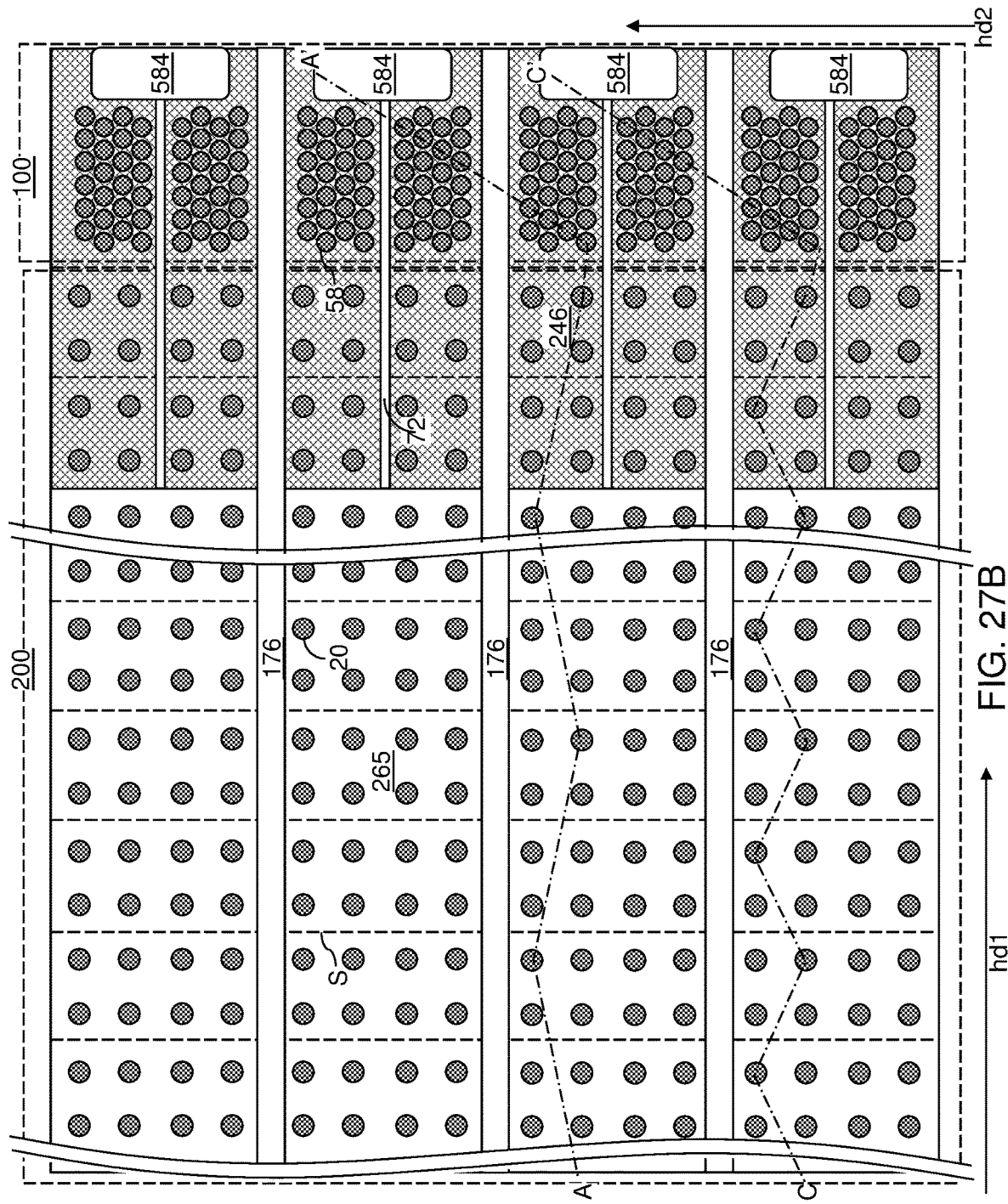
FIG. 27B is a horizontal cross-sectional view of the exemplary structure along the horizontal plane B-B' of FIG. 27A. The hinged vertical plane A-A' corresponds to the plane of the vertical cross-sectional view of FIG. 27A.
Figure 27C:
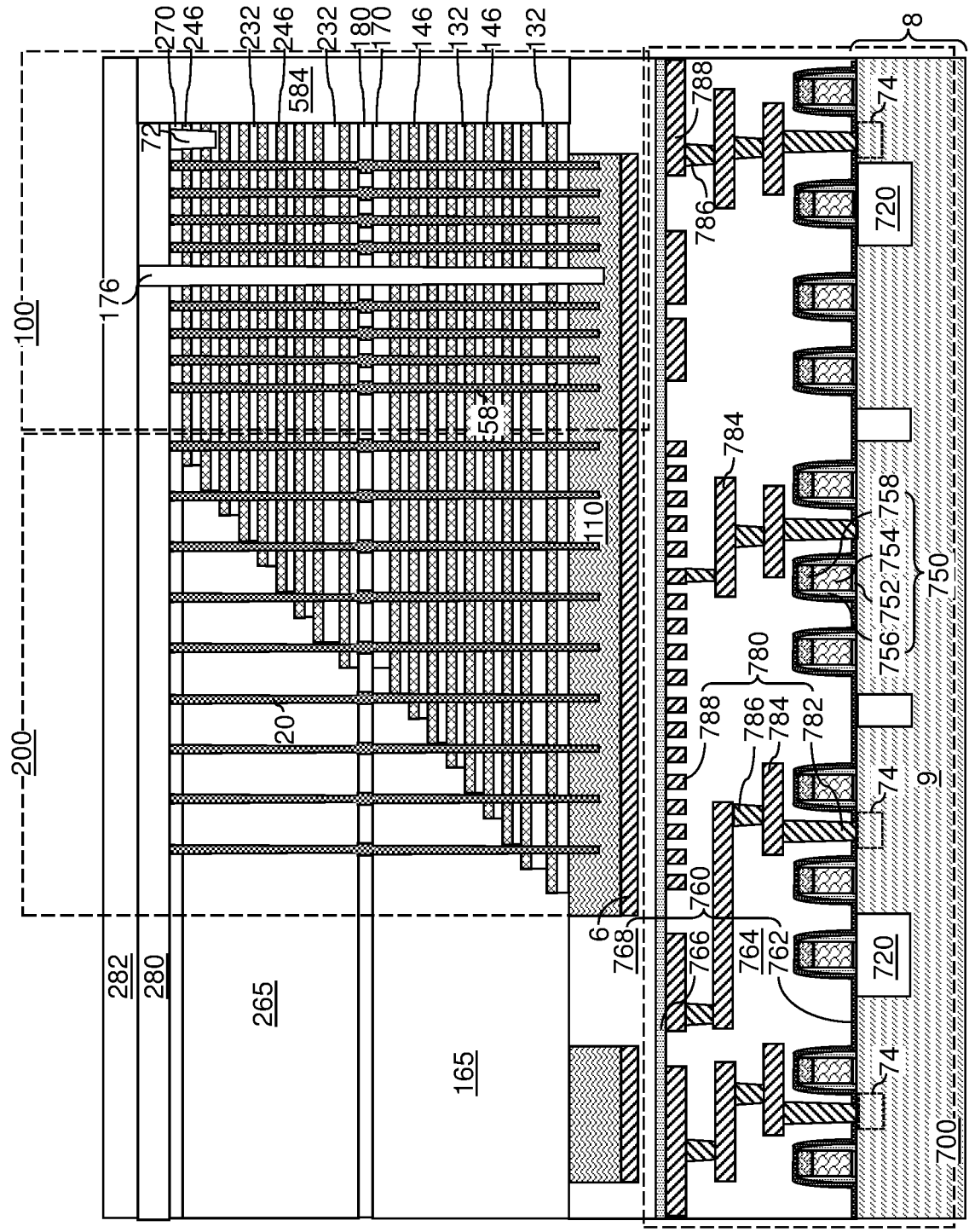
FIG. 27C is a vertical cross-sectional view of the exemplary structure along the vertical plane C-C' of FIG. 27B.

Referring to FIGS. 27A-27C, a dielectric fill material may be conformally deposited in the backside trenches 79 and over the first contact-level dielectric layer 280 by a conformal deposition process. The dielectric fill material may include, for example, silicon oxide. The portion of the dielectric fill material that fills a backside trench 79 constitutes a backside trench fill structure 176. The portion of the dielectric fill material that overlies the first contact-level dielectric layer 280 constitutes a second contact-level dielectric layer 282. The second contact-level dielectric layer 282 includes a dielectric material such as silicon oxide, and may have a thickness in a range from 100 nm to 600 nm, although lesser and greater thicknesses may also be used.

Figure 28A:
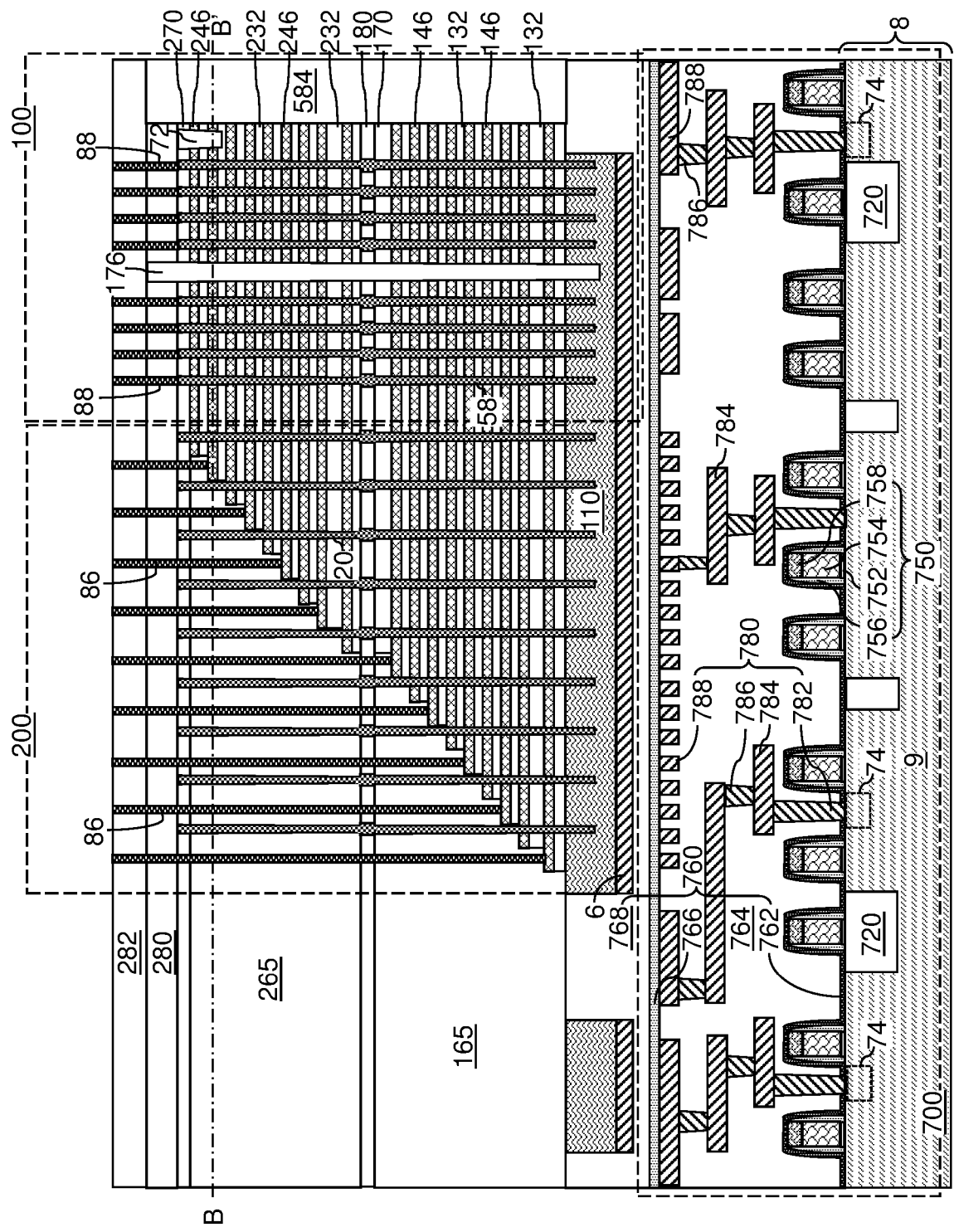
FIG. 28A is a vertical cross-sectional view of the exemplary structure after formation of a second contact-level dielectric layer and various contact via structures according to an embodiment of the present disclosure.
Figure 28B:
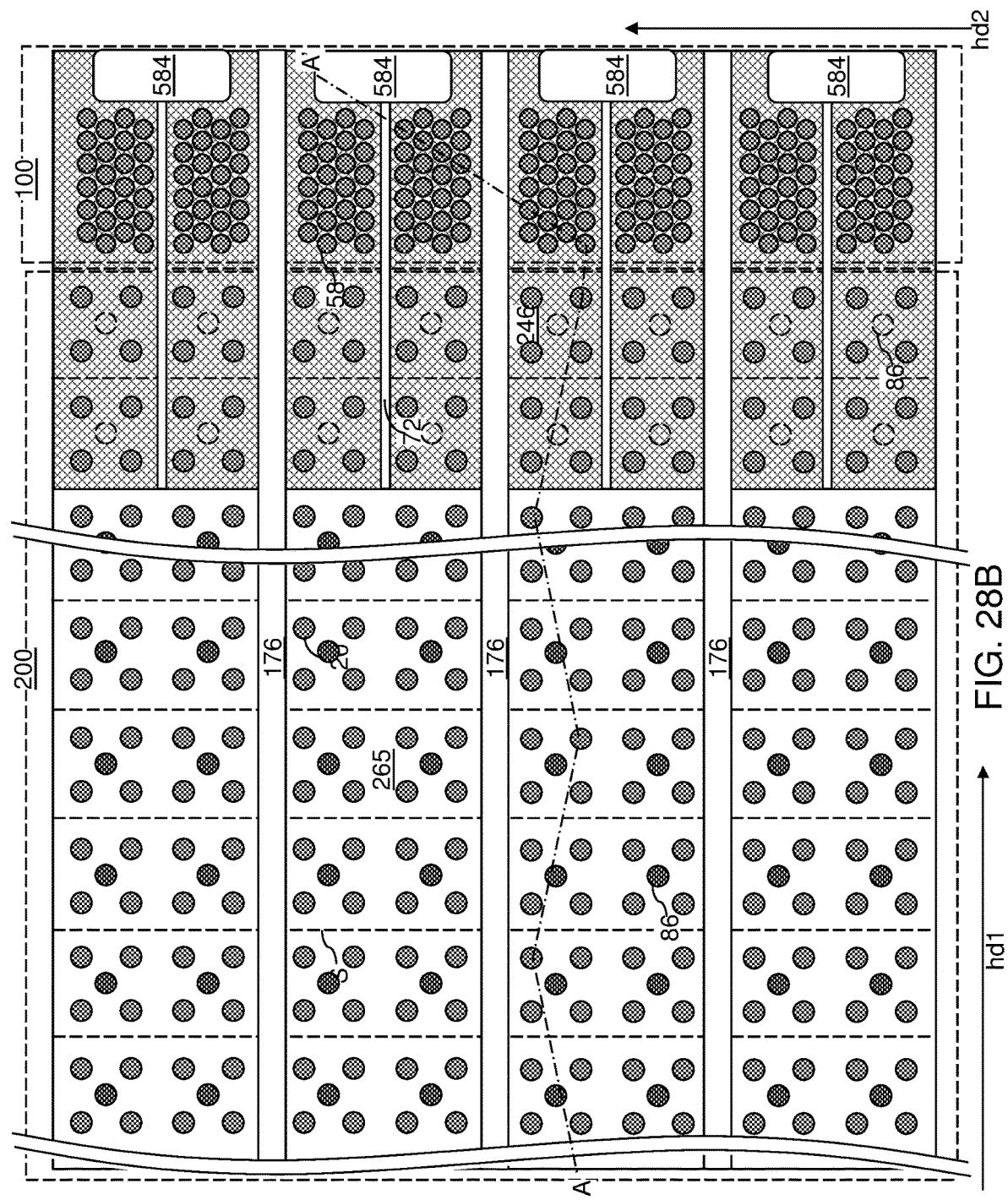
FIG. 28B is a horizontal cross-sectional view of the exemplary structure along the vertical plane B-B' of FIG. 28A. The hinged vertical plane A-A' corresponds to the plane of the vertical cross-sectional view of FIG. 28A.

Referring to FIGS. 28A and 28B, a photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 29:
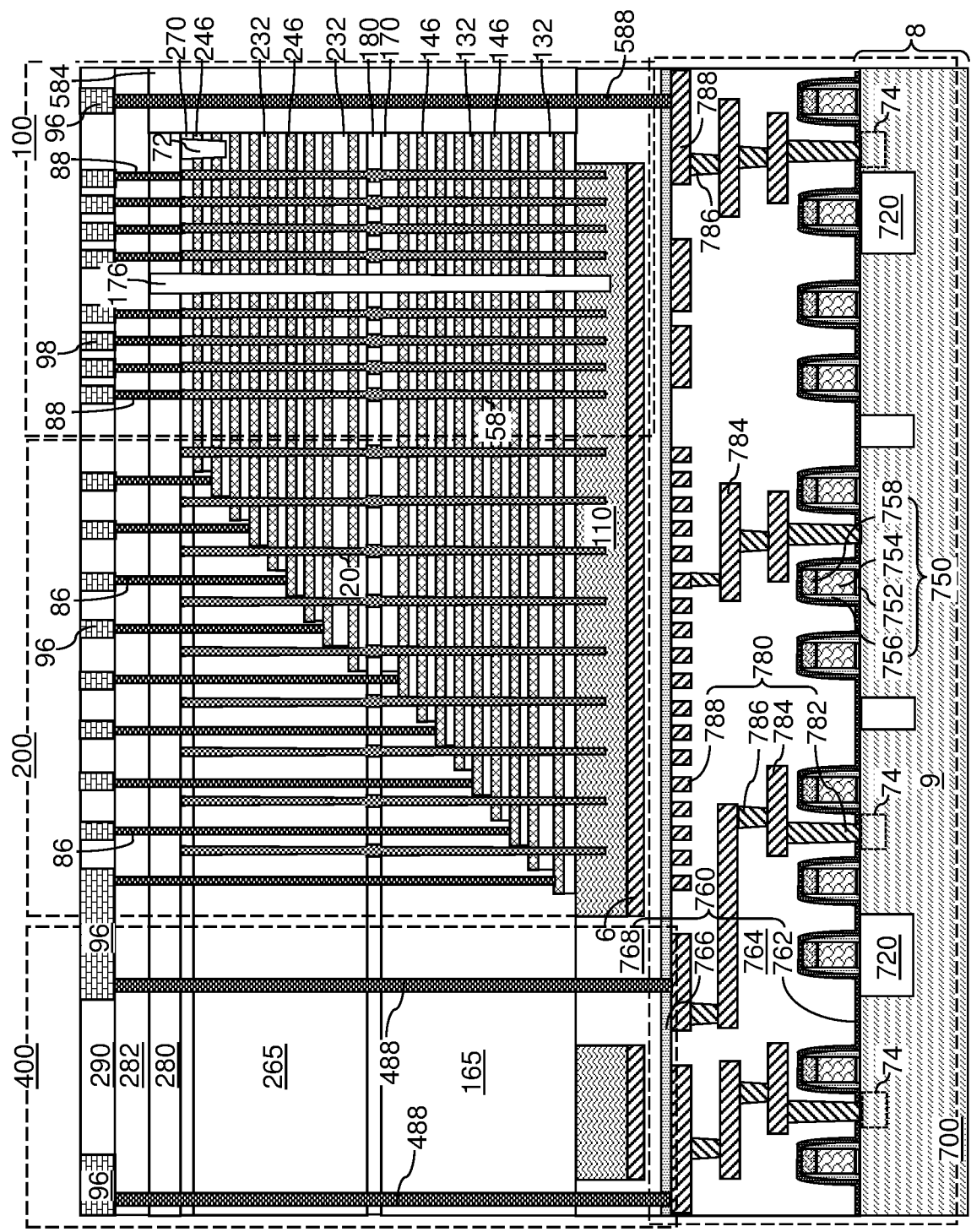
FIG. 29 is a vertical cross-sectional view of the exemplary structure after formation of through-memory-level via structures and upper metal line structures according to an embodiment of the present disclosure.

Referring to FIG. 29, peripheral-region via cavities may be formed through the second and first contact-level dielectric layers (282, 280), the second and first retro-stepped dielectric material portions (265, 165), and the drain-side dielectric layers 768 to top surfaces of a first subset of the lower-level metal interconnect structure 780 in the peripheral device region 400. Through-memory-region via cavities may be formed through the interconnection region dielectric fill material portions 584 and the drain-side dielectric layers 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the semiconductor substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the semiconductor substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the semiconductor substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

Figure 30:
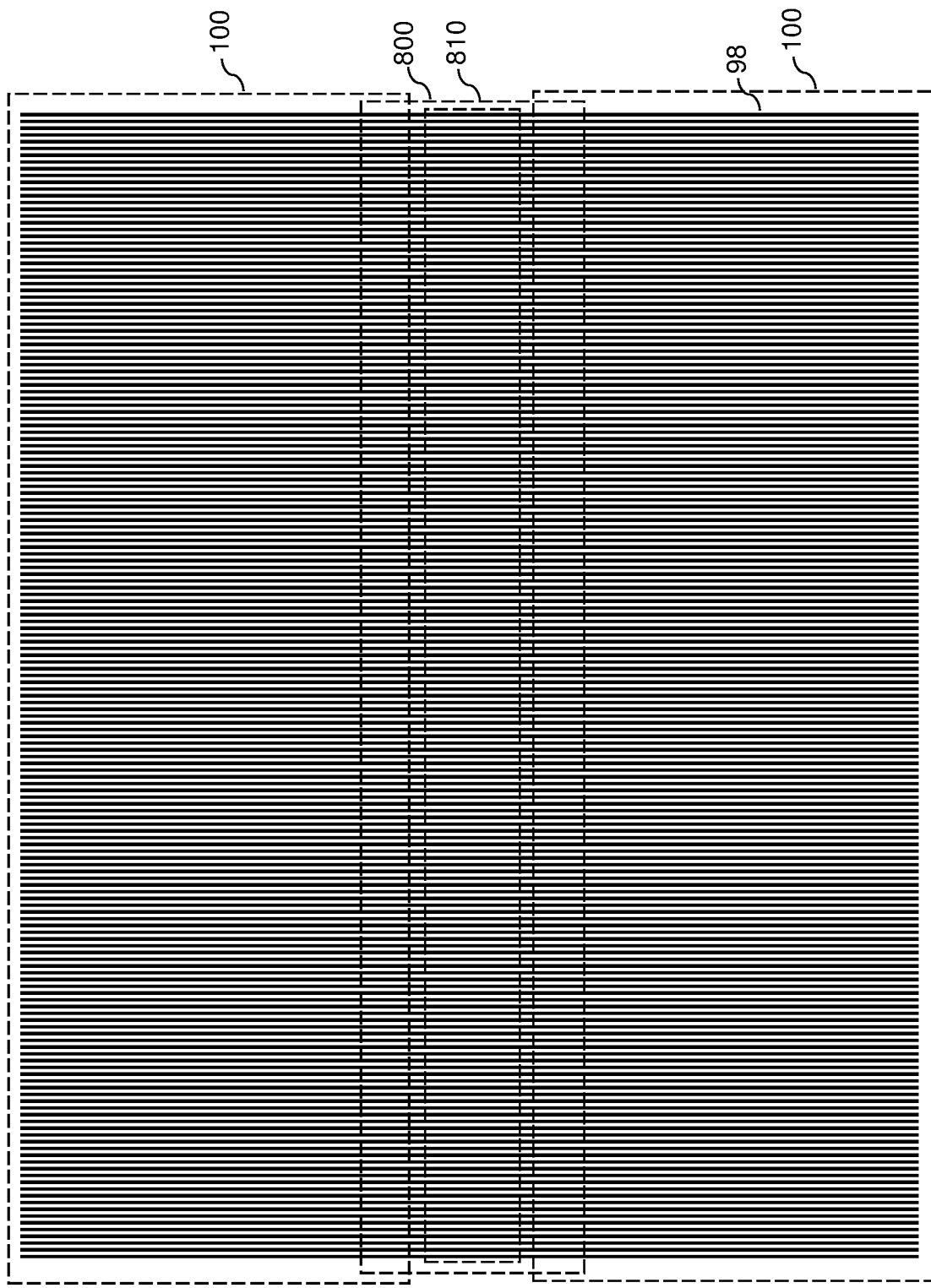
FIG. 30 is a vertical cross-sectional view of the exemplary structure after formation of bit lines according to an embodiment of the present disclosure.

Referring to FIG. 30, a general layout between a bit line switch array 800 and memory array regions 100 is illustrated in a plan view. The bit line switch array 800 can be located below a gap between two memory array regions 100. A bit line tap region 810 can be provided in the gap between a neighboring pair of memory array regions 100. Vertical electrical connections between the bit lines 98 and the bit line switches within the bit line switch array 800 can be provided within the bit line tap region 810.

Referring to all drawings and according to various embodiments of the present disclosure, a semiconductor structure includes a first-conductivity-type well 730 located in a semiconductor substrate 9, a semiconductor active area region 291 located adjacent to the a first-conductivity-type well, a first transistor (750S or 750E) including a source region (74S or 74E), a drain region 74B, a channel region 82 located between the source region and the drain region, a gate dielectric layer 752 located over the channel region and a gate electrode (754S or 754E) located over the gate dielectric layer, such that the transistor is located on the semiconductor active area region 291, and a cutoff gate electrode 754F is located over the semiconductor active area region 291, and between the first transistor and the first-conductivity-type well.

In one embodiment, a semiconductor structure is provided, which comprises: a switch array 800 located on a top surface of a semiconductor substrate 8 and comprising a row of switches, wherein each of the switches comprises a sense circuit switch transistor 750S located on a first side of a bit-line-connection contact via structure 78B, an erase-voltage-connection switch transistor 750E located on a second side of the bit-line-connection contact via structure 78E, and a cutoff gate electrode 754F located between the erase-voltage-connection switch transistor and a first-conductivity-type well 730 located adjacent to the switch array (800, 900); lower-level dielectric material layers 760 embedding the bit-line-connection contact via structures 78B of the switches; and an array of memory devices located over the lower-level dielectric material layers 760 and comprising an array of memory elements (such as memory stack structures 55), word lines (such as the electrically conductive layers (146, 246)), and bit lines 98, wherein a subset of the bit lines 98 is electrically connected to a respective one of the switches through a respective line-connection contact via structure 78B.

In one embodiment, lower-level metal interconnect structures 780 can be embedded in the lower-level dielectric material layers 760. A first subset of the lower-level metal interconnect structures 780 provides electrical connection between a sense-circuit-side source region 74S of a respective sense circuit switch transistor 750E and a respective sense circuit located on the semiconductor substrate 8; and a second subset of the lower-level metal interconnect structures 780 provides electrical connection between an erase-voltage-side source region 74E of a respective erase-voltage-connection switch transistor 750E and an erase voltage power supply circuit.

In one embodiment, the array of memory devices comprises a three-dimensional memory array that includes: an alternating stack of insulating layers (132, 232) and electrically conductive layers (146, 246) that comprise the word lines; and memory stack structures 55 vertically extending through the alternating stack {(132, 146), (232, 246)} and comprising a respective vertical stack of memory elements and a respective vertical semiconductor channel 60, wherein the bit lines 98 are electrically connected to a respective subset of the vertical semiconductor channels 60.

In one embodiment, a dielectric material portion (such as an interconnection region dielectric fill material portions 584, a first retro-stepped dielectric material portion 165, or a second retro-stepped dielectric material portion 265) can contact sidewalls of the alternating stack {(132, 146), (232, 246)}; and through-memory-level connection via structures (488, 588) vertically extend through the dielectric material portion and electrically connect a respective pair of a line-connection contact via structure 78B and a bit line 98.

In the prior embodiments, the peripheral device region 700 is located below the memory array region 100. In one alternative embodiment, the peripheral device region 700 and the memory array region 100 are formed on different substrates, followed by bonding the peripheral device region to the memory array region 100 in a CMOS bonded to array configuration. In another alternative embodiment, the peripheral device region 700 is located next to the memory array region 100 on the substrate 8.

The various embodiments of the present disclosure can be employed to provide a switch array (800, 900) in which single switches are formed on semiconductor active area regions 791. The electrical isolation between the high voltage nodes of the source regions (74E, 74S) and the first-conductivity-type well 730 can be provided with a reduced footprint by employing cutoff gate electrodes 754F, which are not gate electrodes of a field effect transistor, but are gate electrodes for a portion semiconductor active area regions 791 located between the source regions (74E, 74S) and the first-conductivity-type well 730. Thus, the transistor size may be reduced without additional process steps. Vertical recessing of the base portion 730B of the first-conductivity-type well 730 by formation of a shallow trench isolation structure 720 further increases the effective distance between the source regions and the first-conductivity-type well 730, and facilitates electrical isolation of the source regions from the first-conductivity-type well 730 while minimizing the device area for the switch array (800, 900).

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
   a first-conductivity-type well located in a semiconductor substrate;
   a semiconductor active area region located adjacent to the a first-conductivity-type well;
   a first transistor comprising a source region, a drain region, a channel region located between the source region and the drain region, a gate dielectric layer located over the channel region and a gate electrode located over the gate dielectric layer, wherein the transistor is located on the semiconductor active area region;
   a cutoff gate electrode located over the semiconductor active area region, and between the first transistor and the first-conductivity-type well;
   an array of memory devices located over the first transistor and comprising an array of memory elements, word lines, and bit lines;
   a bit line switch array located on the semiconductor substrate and comprising a row of switches, wherein each of the switches comprises a sense circuit switch transistor located on a first side of a bit-line-connection contact via structure, the first transistor comprising an erase-voltage-connection switch transistor located on a second side of the bit-line-connection contact via structure, wherein the cutoff gate electrode is located between the erase-voltage-connection switch transistor and the first-conductivity-type well located adjacent to the bit line switch array; and
   lower-level dielectric material layers embedding the bit-line-connection contact via structures of the switches and located between the first transistor and the array of memory devices, wherein a subset of the bit lines is electrically connected to a respective one of the switches through a respective bit-line-connection contact via structure,
   wherein:
      each of the switches is located on the respective semiconductor active area region that is a portion of the semiconductor substrate and is laterally surrounded by a respective portion of a shallow trench isolation structure; and
      each of the switches comprises:
         a drain region contacting the line-connection contact via structure;
         a sense-circuit-side source region that is a source region of the sense circuit switch transistor; and
         an erase-voltage-side source region that is a source region of the erase-voltage connection switch transistor, and
   wherein:
      an edge of the cutoff gate electrode extends past the edge of the semiconductor active area region and overlies the shallow trench isolation structure;
      the first-conductivity-type well is laterally spaced from an interface between the respective semiconductor active area region and the shallow trench isolation structure; and
      the first-conductivity-type well has an annular configuration and laterally surrounds the bit line switch array.

2. A semiconductor structure, comprising:
   a first-conductivity-type well located in a semiconductor substrate;
   a semiconductor active area region located adjacent to the a first-conductivity-type well;
   a first transistor comprising a source region, a drain region, a channel region located between the source region and the drain region, a gate dielectric layer located over the channel region and a gate electrode located over the gate dielectric layer, wherein the transistor is located on the semiconductor active area region;
a cutoff gate electrode located over the semiconductor active area region, and between the first transistor and the first-conductivity-type well;
an array of memory devices located over the first transistor and comprising an array of memory elements, word lines, and bit lines;
a bit line switch array located on the semiconductor substrate and comprising a row of switches, wherein each of the switches comprises a sense circuit switch transistor located on a first side of a bit-line-connection contact via structure, the first transistor comprising an erase-voltage-connection switch transistor located on a second side of the bit-line-connection contact via structure, wherein the cutoff gate electrode is located between the erase-voltage-connection switch transistor and the first-conductivity-type well located adjacent to the bit line switch array; and
lower-level dielectric material layers embedding the bit-line-connection contact via structures of the switches and located between the first transistor and the array of memory devices, wherein a subset of the bit lines is electrically connected to a respective one of the switches through a respective bit-line-connection contact via structure,
wherein:
each of the switches is located on the respective semiconductor active area region that is a portion of the semiconductor substrate and is laterally surrounded by a respective portion of a shallow trench isolation structure; and
each of the switches comprises:
a drain region contacting the line-connection contact via structure;
a sense-circuit-side source region that is a source region of the sense circuit switch transistor; and
an erase-voltage-side source region that is a source region of the erase-voltage connection switch transistor, and
wherein the first-conductivity-type well comprises:
a base portion located under a horizontal plane including a bottom surface of the shallow trench isolation structure; and
an annular pedestal portion that laterally surrounds the shallow trench isolation structure and contacting an outer sidewall of the shallow trench isolation structure.

3. The semiconductor structure of claim 2, further comprising:
another shallow trench isolation structure laterally surrounding the annular pedestal portion of the first-conductivity-type well and overlying, and contacting, an outer region of the base portion of the first-conductivity-type well; and
well contact via structures contacting a top surface of the annular pedestal portion of the first-conductivity-type well.

4. A semiconductor structure, comprising:
a first-conductivity-type well located in a semiconductor substrate;
a semiconductor active area region located adjacent to the a first-conductivity-type well;
a first transistor comprising a source region, a drain region, a channel region located between the source region and the drain region, a gate dielectric layer located over the channel region and a gate electrode located over the gate dielectric layer, wherein the transistor is located on the semiconductor active area region;
a cutoff gate electrode located over the semiconductor active area region, and between the first transistor and the first-conductivity-type well;
an array of memory devices located over the first transistor and comprising an array of memory elements, word lines, and bit lines;
a bit line switch array located on the semiconductor substrate and comprising a row of switches, wherein each of the switches comprises a sense circuit switch transistor located on a first side of a bit-line-connection contact via structure, the first transistor comprising an erase-voltage-connection switch transistor located on a second side of the bit-line-connection contact via structure, wherein the cutoff gate electrode is located between the erase-voltage-connection switch transistor and the first-conductivity-type well located adjacent to the bit line switch array;
lower-level dielectric material layers embedding the bit-line-connection contact via structures of the switches and located between the first transistor and the array of memory devices, wherein a subset of the bit lines is electrically connected to a respective one of the switches through a respective bit-line-connection contact via structure; and
lower-level metal interconnect structures embedded in the lower-level dielectric material layers,
wherein:
a first subset of the lower-level metal interconnect structures provides electrical connection between a sense-circuit-side source region of a respective sense circuit switch transistor and a respective sense circuit located on the semiconductor substrate; and
a second subset of the lower-level metal interconnect structures provides electrical connection between an erase-voltage-side source region of a respective erase-voltage-connection switch transistor and an erase voltage power supply circuit.

5. The semiconductor structure of claim 4, wherein the array of memory devices comprises a three-dimensional memory array that includes:
an alternating stack of insulating layers and electrically conductive layers that comprise the word lines; and
memory stack structures vertically extending through the alternating stack and comprising a respective vertical stack of memory elements and a respective vertical semiconductor channel, wherein the bit lines are electrically connected to a respective subset of the vertical semiconductor channels.

6. The semiconductor structure of claim 5, further comprising:
a dielectric material portion contacting sidewalls of the alternating stack; and
through-memory-level connection via structures vertically extending through the dielectric material portion and electrically connecting a respective pair of a line-connection contact via structure and a bit line.

* * * * *